US012353505B2

(12) United States Patent
Luo

(10) Patent No.: US 12,353,505 B2
(45) Date of Patent: Jul. 8, 2025

(54) METHODS AND APPARATUS FOR PERFORMING DIVERSITY MATRIX OPERATIONS WITHIN A MEMORY ARRAY

(71) Applicant: Micron Technology, Inc., Boise, ID (US)

(72) Inventor: Fa-Long Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/502,435

(22) Filed: Nov. 6, 2023

(65) Prior Publication Data
US 2024/0078286 A1 Mar. 7, 2024

Related U.S. Application Data

(62) Division of application No. 16/705,096, filed on Dec. 5, 2019, now Pat. No. 11,853,385.

(51) Int. Cl.
G06F 17/16 (2006.01)
G06F 9/30 (2018.01)
(Continued)

(52) U.S. Cl.
CPC .......... *G06F 17/16* (2013.01); *G06F 9/3001* (2013.01); *G06F 9/30036* (2013.01);
(Continued)

(58) Field of Classification Search
CPC .... G06F 17/16; G06F 9/3001; G06F 9/30036; G06F 12/0207; G06F 2212/454;
(Continued)

(56) References Cited

U.S. PATENT DOCUMENTS 4,380,046 A   4/1983   Frosch
4,435,792 A   3/1984   Bechtolsheim
(Continued)

FOREIGN PATENT DOCUMENTS

CN   1142162    2/1997
CN   1452396    10/2003
(Continued)

OTHER PUBLICATIONS

Adibi., et al., "Processing-In-Memory Technology for Knowledge Discovery Algorithms," Proceeding of the Second International Workshop on Data Management on New Hardware, Jun. 25, 2006, 10 pages, Retrieved from the internet [URL: http://www.cs.cmu.edu/~damon2006/pdf/adibi06inmemory.pdf].
(Continued)

*Primary Examiner* — Tan V Mai
(74) *Attorney, Agent, or Firm* — Greenberg Traurig

(57) ABSTRACT

Methods and apparatus for performing diversity matrix operations within a memory fabric. Various embodiments of the present disclosure are directed to converting a memory array into a matrix fabric for spatial diversity-related matrix transformations and performing matrix operations therein. Exemplary embodiments described herein perform MIMO-related matrix transformations (e.g., precoding, beamforming, or data recovery matrix operations) within a memory device that includes a matrix fabric and matrix multiplication unit (MMU). In one variant, the matrix fabric uses a "crossbar" construction of resistive elements. Each resistive element stores a level of impedance that represents the corresponding matrix coefficient value. The crossbar connectivity can be driven with an electrical signal representing the input vector as an analog voltage. The resulting signals can be converted from analog voltages to a digital values by an MMU to yield a matrix-vector product. The MMU may
(Continued)

additionally perform various other logical operations within the digital domain.

20 Claims, 23 Drawing Sheets

(51) Int. Cl.
*G06F 12/02* (2006.01)
*G11C 13/00* (2006.01)

(52) U.S. Cl.
CPC ........ *G06F 12/0207* (2013.01); *G11C 13/004* (2013.01); *G11C 13/0069* (2013.01); *G06F 2212/454* (2013.01)

(58) Field of Classification Search
CPC ..... G06F 15/7821; G06F 7/57; G11C 13/004; G11C 13/0069; G11C 2213/77; G11C 7/1006; G11C 11/54
USPC ........................................................ 708/607
See application file for complete search history.

(56) References Cited

U.S. PATENT DOCUMENTS

| | | | |
|---|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | Mclaury |
| 5,615,404 A | 3/1997 | Knoll et al. |
| 5,638,128 A | 6/1997 | Hoogenboom et al. |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson et al. |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard, Jr. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,020,740 B2 | 3/2006 | De Jong |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,103,598 B1 | 9/2006 | Clement |
| 7,133,999 B2 | 11/2006 | Skull |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,480,792 B2 | 1/2009 | Janzen et al. |
| 7,490,190 B2 | 2/2009 | Skull |
| 7,529,888 B2 | 5/2009 | Chen et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,613,060 B2 | 11/2009 | Smith |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,561 B2 | 9/2010 | Skull |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |

(56) References Cited

U.S. PATENT DOCUMENTS

| | | |
|---|---|---|
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,250,342 B1 | 8/2012 | Kostarnov et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,588,803 B2 | 11/2013 | Hakola et al. |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,343,155 B1 | 5/2016 | De Santis et al. |
| 9,430,735 B1 | 8/2016 | Vali et al. |
| 9,436,402 B1 | 9/2016 | De Santis et al. |
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Willcock |
| 9,947,401 B1 | 4/2018 | Navon et al. |
| 10,243,773 B1 | 3/2019 | Shattil |
| 10,340,947 B2 | 7/2019 | Oh et al. |
| 10,430,493 B1 | 10/2019 | Kendall |
| 10,440,341 B1 | 10/2019 | Luo et al. |
| 10,558,518 B2 | 2/2020 | Nair et al. |
| 10,621,038 B2 | 4/2020 | Yang |
| 10,621,267 B2 | 4/2020 | Strachan et al. |
| 10,719,296 B2 | 7/2020 | Lee et al. |
| 10,867,655 B1 | 12/2020 | Harms et al. |
| 10,878,317 B2 | 12/2020 | Hatcher et al. |
| 10,896,715 B2 | 1/2021 | Golov |
| 11,074,318 B2 | 7/2021 | Ma et al. |
| 11,449,577 B2 | 9/2022 | Luo |
| 11,853,385 B2 | 12/2023 | Luo |
| 11,928,177 B2 | 3/2024 | Luo |
| 12,118,056 B2 | 10/2024 | Luo |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0216964 A1 | 11/2003 | Maclean et al. |
| 2003/0222879 A1 | 12/2003 | Lin et al. |
| 2004/0003337 A1 | 1/2004 | Cypher |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0211260 A1 | 10/2004 | Girmonsky et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0125477 A1 | 6/2005 | Genov et al. |
| 2005/0154271 A1 | 7/2005 | Rasdal et al. |
| 2005/0160311 A1 | 7/2005 | Hartwell et al. |
| 2005/0286282 A1 | 12/2005 | Ogura |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2006/0294172 A1 | 12/2006 | Zhong |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0261043 A1 | 11/2007 | Ho et al. |
| 2007/0285131 A1 | 12/2007 | Sohn |
| 2007/0285979 A1 | 12/2007 | Turner |
| 2007/0291532 A1 | 12/2007 | Tsuji |
| 2008/0019209 A1 | 1/2008 | Lin |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0071939 A1 | 3/2008 | Tanaka et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0234047 A1 | 9/2008 | Nguyen |
| 2008/0235560 A1 | 9/2008 | Colmer et al. |
| 2009/0006900 A1 | 1/2009 | Lastras-montano et al. |
| 2009/0067218 A1 | 3/2009 | Graber |
| 2009/0129586 A1 | 5/2009 | Miyazaki et al. |
| 2009/0154238 A1 | 6/2009 | Lee |
| 2009/0154273 A1 | 6/2009 | Borot et al. |
| 2009/0221890 A1 | 9/2009 | Saffer et al. |
| 2009/0254697 A1 | 10/2009 | Akerib et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0191999 A1 | 7/2010 | Jeddeloh |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0099216 A1 | 4/2011 | Sun et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0106287 A1 | 5/2012 | Catovic et al. |
| 2012/0120705 A1 | 5/2012 | Mitsubori et al. |
| 2012/0131079 A1 | 5/2012 | Vu |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0148044 A1 | 6/2012 | Fang et al. |
| 2012/0182798 A1 | 7/2012 | Hosono et al. |

(56) References Cited

U.S. PATENT DOCUMENTS

| | | |
|---|---|---|
| 2012/0198310 A1 | 8/2012 | Tran et al. |
| 2012/0239991 A1 | 9/2012 | Melik-martirosian |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0321207 A1 | 12/2013 | Monogioudis et al. |
| 2013/0326154 A1 | 12/2013 | Haswell |
| 2013/0332707 A1 | 12/2013 | Gueron et al. |
| 2013/0332799 A1 | 12/2013 | Cho et al. |
| 2014/0089725 A1 | 3/2014 | Ackaret et al. |
| 2014/0101519 A1 | 4/2014 | Lee et al. |
| 2014/0143630 A1 | 5/2014 | Mu et al. |
| 2014/0172937 A1 | 6/2014 | Linderman et al. |
| 2014/0185395 A1 | 7/2014 | Seo |
| 2014/0215185 A1 | 7/2014 | Danielsen |
| 2014/0245105 A1 | 8/2014 | Chung et al. |
| 2014/0250279 A1 | 9/2014 | Manning |
| 2014/0258646 A1 | 9/2014 | Goss et al. |
| 2014/0344934 A1 | 11/2014 | Jorgensen |
| 2014/0365548 A1 | 12/2014 | Mortensen |
| 2015/0016191 A1 | 1/2015 | Tsai et al. |
| 2015/0039960 A1 | 2/2015 | Varanasi et al. |
| 2015/0063052 A1 | 3/2015 | Manning |
| 2015/0070979 A1 | 3/2015 | Zhu et al. |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0185799 A1 | 7/2015 | Robles et al. |
| 2015/0270015 A1 | 9/2015 | Murphy et al. |
| 2015/0279466 A1 | 10/2015 | Manning |
| 2015/0288710 A1 | 10/2015 | Zeitlin et al. |
| 2015/0324290 A1 | 11/2015 | Leidel et al. |
| 2015/0325272 A1 | 11/2015 | Murphy |
| 2015/0340080 A1 | 11/2015 | Queru |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357027 A1 | 12/2015 | Shu et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0118137 A1 | 4/2016 | Zhang |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0231935 A1 | 8/2016 | Chu |
| 2016/0255502 A1 | 9/2016 | Rajadurai et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel |
| 2016/0350230 A1 | 12/2016 | Murphy |
| 2016/0365129 A1 | 12/2016 | Willcock |
| 2016/0371033 A1 | 12/2016 | La Fratta et al. |
| 2016/0375360 A1 | 12/2016 | Poisner et al. |
| 2016/0379115 A1 | 12/2016 | Burger et al. |
| 2017/0026185 A1 | 1/2017 | Moses |
| 2017/0052906 A1 | 2/2017 | Lea |
| 2017/0178701 A1 | 6/2017 | Willcock et al. |
| 2017/0188030 A1 | 6/2017 | Sakurai et al. |
| 2017/0192691 A1 | 7/2017 | Zhang et al. |
| 2017/0192844 A1 | 7/2017 | Lea et al. |
| 2017/0192936 A1 | 7/2017 | Guo et al. |
| 2017/0213597 A1 | 7/2017 | Micheloni |
| 2017/0220526 A1 | 8/2017 | Buchanan |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford, Jr. et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein et al. |
| 2017/0293434 A1 | 10/2017 | Tiwari |
| 2017/0293912 A1 | 10/2017 | Furche et al. |
| 2017/0301379 A1 | 10/2017 | Hush |
| 2017/0308328 A1 | 10/2017 | Lim et al. |
| 2017/0309314 A1 | 10/2017 | Zawodny et al. |
| 2017/0329577 A1 | 11/2017 | Tiwari |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0371539 A1 | 12/2017 | Mai et al. |
| 2018/0012636 A1 | 1/2018 | Alzheimer et al. |
| 2018/0018559 A1 | 1/2018 | Yakopcic et al. |
| 2018/0024769 A1 | 1/2018 | Howe et al. |
| 2018/0024926 A1 | 1/2018 | Penney et al. |
| 2018/0025759 A1 | 1/2018 | Penney et al. |
| 2018/0025768 A1 | 1/2018 | Hush |
| 2018/0032458 A1 | 2/2018 | Bell |
| 2018/0033478 A1 | 2/2018 | Tanaka et al. |
| 2018/0039484 A1 | 2/2018 | La Fratta et al. |
| 2018/0046405 A1 | 2/2018 | Hush et al. |
| 2018/0046461 A1 | 2/2018 | Tiwari |
| 2018/0060069 A1 | 3/2018 | Rosti et al. |
| 2018/0067802 A1 | 3/2018 | Ha et al. |
| 2018/0074754 A1 | 3/2018 | Crawford, Jr. |
| 2018/0075899 A1 | 3/2018 | Hush |
| 2018/0075926 A1 | 3/2018 | Sagiv et al. |
| 2018/0088850 A1 | 3/2018 | Willcock |
| 2018/0102147 A1 | 4/2018 | Willcock et al. |
| 2018/0108397 A1 | 4/2018 | Venkata et al. |
| 2018/0129558 A1 | 5/2018 | Das |
| 2018/0130515 A1 | 5/2018 | Zawodny |
| 2018/0136871 A1 | 5/2018 | Leidel |
| 2018/0242190 A1 | 8/2018 | Khoryaev et al. |
| 2018/0301189 A1 | 10/2018 | Hu et al. |
| 2018/0309451 A1 | 10/2018 | Lu et al. |
| 2018/0314590 A1 | 11/2018 | Kothamasu |

(56) References Cited

U.S. PATENT DOCUMENTS

| | | |
|---|---|---|
| 2018/0321942 A1 | 11/2018 | Yu et al. |
| 2018/0336552 A1 | 11/2018 | Bohli et al. |
| 2018/0350433 A1 | 12/2018 | Hu et al. |
| 2018/0364785 A1 | 12/2018 | Hu et al. |
| 2018/0373675 A1 | 12/2018 | Strachan et al. |
| 2018/0373902 A1 | 12/2018 | Muralimanohar et al. |
| 2019/0036772 A1 | 1/2019 | Agerstam et al. |
| 2019/0066780 A1 | 2/2019 | Hu et al. |
| 2019/0080108 A1 | 3/2019 | Gomez Claros et al. |
| 2019/0179869 A1 | 6/2019 | Park et al. |
| 2019/0180839 A1 | 6/2019 | Kim |
| 2019/0205741 A1 | 7/2019 | Gupta et al. |
| 2019/0246418 A1 | 8/2019 | Loehr et al. |
| 2019/0295680 A1 | 9/2019 | Anzou |
| 2019/0304056 A1 | 10/2019 | Grajewski et al. |
| 2019/0333056 A1 | 10/2019 | Wilkinson et al. |
| 2019/0347039 A1 | 11/2019 | Velusamy et al. |
| 2019/0349426 A1 | 11/2019 | Smith et al. |
| 2019/0354421 A1 | 11/2019 | Brandt et al. |
| 2019/0391829 A1 | 12/2019 | Cronie et al. |
| 2020/0004583 A1 | 1/2020 | Kelly et al. |
| 2020/0012563 A1 | 1/2020 | Yang |
| 2020/0020393 A1 | 1/2020 | Al-shamma |
| 2020/0027079 A1 | 1/2020 | Kurian |
| 2020/0034528 A1 | 1/2020 | Yang et al. |
| 2020/0051628 A1 | 2/2020 | Joo et al. |
| 2020/0065029 A1 | 2/2020 | Kim et al. |
| 2020/0065650 A1 | 2/2020 | Tran et al. |
| 2020/0097359 A1 | 3/2020 | O'connor et al. |
| 2020/0143470 A1 | 5/2020 | Pohl et al. |
| 2020/0186607 A1 | 6/2020 | Murphy et al. |
| 2020/0193280 A1 | 6/2020 | Torng et al. |
| 2020/0201697 A1 | 6/2020 | Torng et al. |
| 2020/0210516 A1 | 7/2020 | Espig et al. |
| 2020/0213091 A1 | 7/2020 | Mai |
| 2020/0221518 A1 | 7/2020 | Schmitz et al. |
| 2020/0226233 A1 | 7/2020 | Penugonda et al. |
| 2020/0257552 A1 | 8/2020 | Park et al. |
| 2020/0264688 A1 | 8/2020 | Harms |
| 2020/0264689 A1 | 8/2020 | Harms |
| 2020/0265915 A1 | 8/2020 | Harms |
| 2020/0279012 A1 | 9/2020 | Khaddam-aljameh et al. |
| 2020/0349217 A1 | 11/2020 | Luo |
| 2020/0381057 A1 | 12/2020 | Park et al. |
| 2021/0098047 A1 | 4/2021 | Harms et al. |
| 2021/0149984 A1 | 5/2021 | Luo |
| 2021/0173893 A1 | 6/2021 | Luo |
| 2021/0274581 A1 | 9/2021 | Schmitz et al. |
| 2022/0086242 A1 | 3/2022 | Murphy et al. |
| 2023/0014169 A1 | 1/2023 | Luo |
| 2024/0211537 A1 | 6/2024 | Luo |

FOREIGN PATENT DOCUMENTS

| | | |
|---|---|---|
| CN | 101330616 | 12/2008 |
| CN | 102141905 | 8/2011 |
| CN | 108960418 | 12/2018 |
| CN | 109117416 | 1/2019 |
| CN | 112201287 | 1/2021 |
| CN | 113767436 | 12/2021 |
| EP | 214718 | 3/1987 |
| EP | 2026209 | 2/2009 |
| JP | H0831168 | 2/1996 |
| JP | 2009259193 | 11/2009 |
| KR | 100211482 | 8/1999 |
| KR | 20100134235 | 12/2010 |
| KR | 20130049421 | 5/2013 |
| WO | 135267 | 5/2001 |
| WO | 165359 | 9/2001 |
| WO | 2010079451 | 7/2010 |
| WO | 2011031260 | 3/2011 |
| WO | 2013062596 | 5/2013 |
| WO | 2013081588 | 6/2013 |
| WO | 2013095592 | 6/2013 |
| WO | 2017137888 | 8/2017 |
| WO | 2017220115 | 12/2017 |
| WO | 2020146417 | 7/2020 |
| WO | 2020168114 | 8/2020 |
| WO | 2020118047 | 11/2020 |
| WO | 2020227145 | 11/2020 |

OTHER PUBLICATIONS

Athreyas, Nihard, et al., "Memristor-CMOS Analog Coprocessor for Acceleration of High-Performance Computing Applications." ACM Journal on Emerging Technologies in Computing Systems (JETC), ACM, Nov. 1, 2018.

Boyd et al., "On the General Applicability of Instruction-Set Randomization", IEEE Transactions on Dependable and Secure Computing, Jul.-Sep. 2010, vol. 7 (3), 14 pages.

Cai R., et al., "Memristor-Based Discrete Fourier Transform for Improving Performance and Energy Efficiency," 2016 IEEE Computer Society Annual Symposium on VLSI, 2016, pp. 643-648.

Cardarilli G.C., et al., "Design of a Fault Tolerant Solid State Mass Memory," IEEE Transactions on Reliability, Dec. 2003, vol. 52(4), pp. 476-491.

Chi P., et al., "Prime: A Novel Processing-in-memory Architecture for Neural Network Computation in ReRAM-based Main Memory," 2016 ACM/IEEE 43rd Annual International Symposium on Computer Architecture, 2016, pp. 27-39.

Debnath B., "Bloomflash: Bloom Filter on Flash-Based Storage," 31st Annual Conference on Distributed Computing Systems, Jun. 20-24, 2011, 10 pages.

Derby., et al., "A High-Performance Embedded DSP Core with Novel SIMD Features", IEEE International Conference on Accoustics, Speech, and Signal Processing, Apr. 6-10, 2003, vol. 2, pp. 301-304.

Draper., et al., "The Architecture of the Diva Processing-In-Memory Chip," International Conference on Supercomputing, Jun. 22-26, 2002, 12 pages, Retrieved from the internet [URL: http://www.isi.edu/~draper/papers/ics02.pdf].

Dybdahl et al., "Destructive-Read in Embedded DRAM, Impact on Power Consumption," Journal of Embedded Computing-Issues in Embedded Single-chip Multicore Architectures, Apr. 2006, vol. 2 (2), 10 pages.

Elliot., et al., "Computational RAM: Implementing Processors in Memory", IEEE Design and Test of Computers Magazine, Jan.-Mar. 1999, vol. 16 (1), 10 pages.

Extended European Search Report, EP 20802085.9, mailed on May 19, 2023.

Hongxia L., et al., "High Performance Algorithm for Twiddle Factor of Variable-size FFT Processor and Its Implementation," 2012 International Conference on Industrial Control and Electronics Engineering, 2012, pp. 1078-1081.

Hu, Miao, et al. "Accelerating Discrete Fourier Transforms with Dot-product Engine." 2016 IEEE International Conference on Rebooting Computing (ICRC), IEEE, Nov. 10, 2016.

International Search Report and Written Opinion for PCT Application No. PCT/US2013/043702, mailed Sep. 26, 2013, 11 pages.

Kogge., et al., "Processing In Memory: Chips to Petaflops," May 23, 1997, 8 pages, Retrieved from the internet [URL: http://www.cs_ucf.edu/courses/cda5106/summer02/papers/kogge97PIM.pdf].

Mittal S., "A Survey of ReRAM-Based Architectures for Processing-In-Memory and Neural Networks," Machine Learning & Knowledge Extraction, 2018, vol. 1, pp. 75-114.

Message Passing Interface Forum 1.1 "4.9.3 Minloc and Maxloc", Jun. 12, 1995, 5 pages, Retrieved from the internet [URL: http://www.mpi-forum.org/docs/mpi-1.1/mpi-11-html/node79.html].

Nunez-Yanez, Jose, et al., "Simultaneous multiprocessing in a software-defined heterogeneous FPGA." CrossMark, Apr. 16, 2018.

Pagiamtzis K., "Content-Addressable Memory Introduction", Jun. 25, 2007, 6 pages, Retrieved from the internet [URL: http://www.pagiamtzis.com/cam/camintro].

Pagiamtzis., et al., "Content-Addressable Memory (CAM) Circuits and Architectures: A Tutorial and Survey", IEEE Journal of Solid-State Circuits, Mar. 2006, vol. 41 (3), 16 pages.

(56) References Cited

OTHER PUBLICATIONS

Stojmenovic., "Multiplicative Circulant Networks Topological Properties and Communication Algorithms", Discrete Applied Mathematics 1997, vol. 77, pp. 281-305.
Liu S., et al., "A Memristor-Based Optimization Framework for Artificial Intelligence Application," in IEEE Circuits and Systems Magazine, 2018, vol. 18 (1), pp. 29-44.
Wang Y., et al., "Optimizing Boolean Embedding Matrix for Compressive Sensing in RRAM Crossbar," IEEE/ACM International Symposium on Low Power Electronics and Design, 2015, pp. 13-18.
Athreyas, Nihar, et al., "Memristor-CMOS Analog Coprocessor for Acceleration of High-Performance Computing Applications." ACM Journal on Emerging Technologies in Computing Systems, vol. 14 No. 3, Nov. 1, 2018.

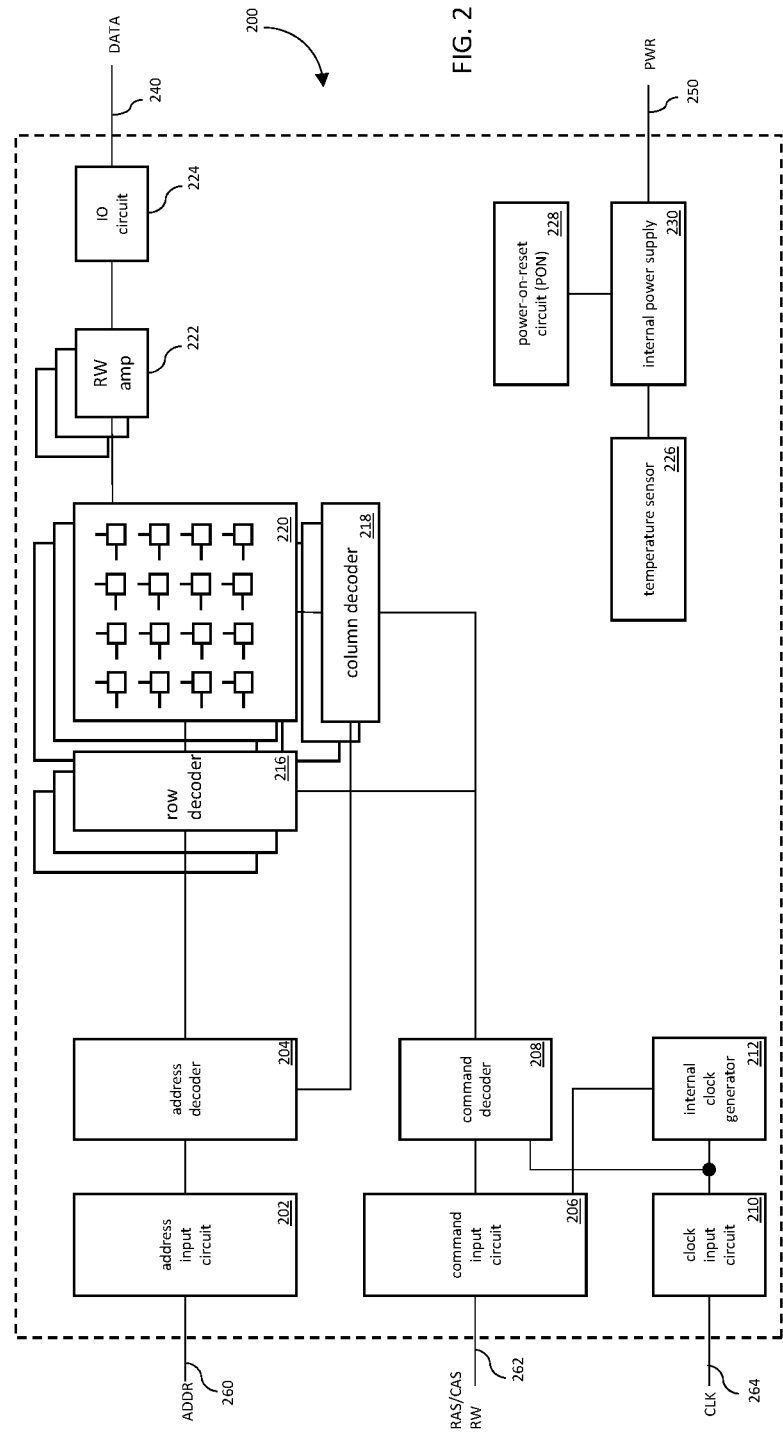

METHODS AND APPARATUS FOR PERFORMING DIVERSITY MATRIX OPERATIONS WITHIN A MEMORY ARRAY

RELATED APPLICATIONS

The present application is a divisional application of U.S. patent application Ser. No. 16/705,096 filed Dec. 5, 2019, the entire disclosures of which application are hereby incorporated herein by reference.

The subject matter of this application is related to co-owned and co-pending U.S. patent application Ser. No. 16/002,644 filed Jun. 7, 2018, issued as U.S. Pat. No. 10,440,341 on Oct. 8, 2019 and entitled "AN IMAGE PROCESSOR FORMED IN AN ARRAY OF MEMORY CELLS", U.S. patent application Ser. No. 16/211,029, filed Dec. 5, 2018, issued as U.S. Pat. No. 11,184,446 on Nov. 23, 2021, and entitled "METHODS AND APPARATUS FOR INCENTIVIZING PARTICIPATION IN FOG NETWORKS", U.S. patent application Ser. No. 16/242,960, filed Jan. 8, 2019, issued as U.S. Pat. No. 11,013,043 on May 18, 2021, and entitled "METHODS AND APPARATUS FOR ROUTINE BASED FOG NETWORKING", U.S. patent application Ser. No. 16/276,461, filed on Feb. 14, 2019, and issued as U.S. Pat. No. 11,327,551 on May 10, 2022, and entitled "METHODS AND APPARATUS FOR CHARACTERIZING MEMORY DEVICES", U.S. patent application Ser. No. 16/276,471, filed on Feb. 14, 2019, issued as U.S. Pat. No. 11,256,778 on Feb. 22, 2022, and entitled "METHODS AND APPARATUS FOR CHECKING THE RESULTS OF CHARACTERIZED MEMORY SEARCHES", U.S. patent application Ser. No. 16/276,489, filed on Feb. 14, 2019, issued as U.S. Pat. No. 10,957,416 on Mar. 23, 2021, and entitled "METHODS AND APPARATUS FOR MAINTAINING CHARACTERIZED MEMORY DEVICES", U.S. patent application Ser. No. 16/403,245, filed on May 3, 2019, published as U.S. Pat. App. Pub. No. 2020-0349217 on Nov. 5, 2020, and entitled "METHODS AND APPARATUS FOR PERFORMING MATRIX TRANSFORMATIONS WITHIN A MEMORY ARRAY", and U.S. patent application Ser. No. 16/689,981, filed on Nov. 20, 2019, issued as U.S. Pat. No. 11,449,577 on Sep. 20, 2022, and entitled "METHODS AND APPARATUS FOR PERFORMING VIDEO PROCESSING MATRIX OPERATIONS WITHIN A MEMORY ARRAY", each of the foregoing incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

The following relates generally to the field of data processing and device architectures. Specifically, a processor-memory architecture and methods that convert a memory array into a matrix fabric for matrix transformations and performing spatial diversity matrix calculations such as e.g., those for multiple-input/multiple-output (MIMO) and massive MIMO applications are disclosed.

BACKGROUND

Memory devices are widely used to store information in various electronic devices such as computers, wireless communication devices, cameras, digital displays, and the like. Information is stored by programing different states of a memory device. For example, binary devices have two states, often denoted by a logical "1" or a logical "0." To access the stored information, the memory device may read (or sense) the stored state in the memory device. To store information, the memory device may write (or program) the state in the memory device. So-called volatile memory devices may require power to maintain this stored information, while non-volatile memory devices may persistently store information even after the memory device itself has, for example, been power cycled. Different memory fabrication methods and constructions enable different capabilities. For example, dynamic random access memory (DRAM) offers high density volatile storage inexpensively. Incipient research is directed to resistive random access memory (ReRAM) which promises non-volatile performance similar to DRAM.

Processor devices are commonly used in conjunction with memory devices to perform a myriad of different tasks and functionality. During operation, a processor executes computer readable instructions (commonly referred to as "software") from memory. The computer readable instructions define basic arithmetic, logic, controlling, input/output (I/O) operations, etc. As is well known in the computing arts, relatively basic computer readable instructions can perform a variety of complex behaviors when sequentially combined. Processors tend to emphasize circuit constructions and fabrication technologies that differ from memory devices. For example, processing performance is generally related to clock rates, thus most processor fabrication methods and constructions emphasize very high rate transistor switching structures, etc. Over time, both processors and memory have increased in speed and power consumption.

Typically, these improvements are a result of shrinking device sizes because electrical signaling is physically limited by the dielectric of the transmission medium and distance. As previously alluded to, most processors and memories are manufactured with different fabrication materials and techniques. Consequently, even though processors and memory continue to improve, the physical interface between processors and memories is a "bottleneck" to the overall system performance. More directly, no matter how fast a processor or memory can work in isolation, the combined system of processor and memory is performance limited to the rate of transfer allowed by the interface. This phenomenon has several common names e.g., the "processor-memory wall", the "von Neumann Bottleneck Effect", etc.

Spatial diversity is a term commonly used to refer to systems which have multiple spatially separated or individual elements, such as wireless antenna systems. Such systems provide improvements in, inter alia, diversity, power and beamforming gain as compared to unitary antenna solutions. Common examples of spatial diversity systems are MIMO (multiple input, multiple output), SIMO (single input, multiple output), and MISO (multiple input, single output) systems. Spatial diversity technology is utilized in, for example, 3GPP technology (such as LTE/LTE-A and 5G New Radio), as well as other applications.

Taking MIMO (often called SU-MIMO or single user MIMO) as an example, MIMO technology requires multiple matrix calculations to be performed for example in precoding calculations used in support of e.g., transmissions from a base station to a mobile device.

Similarly, MU-MIMO (multi-user) MIMO—wherein connection bandwidth is shared across multiple users, such as in IEEE Std. 802.1 lac and 802.1 lax technology—relies on extensive use of channel matrix calculations.

Further, so-called "massive MIMO" or "mMIMO" systems of the type utilized in 5G NR technology similarly require matrix operations in support of e.g., beamforming and beam steering; however, these are of a much larger scale than those associated with traditional MIMO applications, and must be performed sufficiently fast and efficiently so as to support, among other things, the ultra-low latency guarantees associated with 5G NR standards.

Accordingly, there is a salient need for improved methods and apparatus which enable fast, efficient calculation or manipulation of matrices such as e.g., those utilized in MIMO, MU-MIMO or massive MIMO applications.

SUMMARY

The present disclosure provides, inter alia, methods and apparatus for converting a memory array into a matrix fabric for matrix transformations and performing matrix operations therein.

In one aspect of the present disclosure, a non-transitory computer readable medium is disclosed. In one exemplary embodiment, the non-transitory computer readable medium includes: at least one array of memory cells, where each memory cell of the at least one array of memory cells is configured to store a digital value as an analog value in an analog medium; at least one memory sense component, where the at least one memory sense component is configured to read the analog value of a first memory cell as a first digital value; and logic. In one variant, the memory cells are configured to store the analog value as an impedance of a conductance in the memory cell.

In one exemplary embodiment, each of the at least one array of memory cells includes a plurality of sub-arrays, and the non-transitory computer readable device is configured to perform matrix and vector calculations in an analog manner, where the matrix and/or vector values include real, imaginary, and/or complex numbers, and wherein the plurality of sub-arrays are implemented of the complex matrix operations.

In one variant, the plurality of sub-arrays includes a stack of at least four sub-arrays.

In another variant, individual sub-arrays correspond to positive real, negative real, positive imaginary, and negative imaginary portions of matrix coefficients.

In a further variant, at least some of the memory cell sub-arrays are configured to run in parallel with one another. In one such implementation, at least some of the memory cell subT arrays are connected to a single memory sense component. In another such implementation, individual memory cell sub-arrays are connected to individual memory sense components.

In another embodiment of the computer-readable medium, the at least one array of memory cells includes two arrays of memory cells that are configured to run parallel to one another. In one such variant, the two arrays of memory cells are connected to a single memory sense component. In one implementation thereof, the single memory sense component includes one arithmetic logic unit (ALU) configured to combine the results of the two arrays of memory cells.

In another implementation, the single memory sense component includes at least two arithmetic logical units that are, respectively, configured to accept values associated with the two arrays and perform separate computations.

In a further implementation, the single memory sense component includes three or more ALUs.

In another such variant, the two arrays of memory cells are connected to their own respective memory sense components.

In another exemplary embodiment of the computer-readable medium, the logic is further configured to: receive a surjective opcode; operate the array of memory cells as a matrix multiplication unit (MMU) based on the matrix transformation opcode; wherein each memory cell of the MMU modifies the analog value in the analog medium in accordance with the matrix transformation opcode and a matrix transformation operand; configure the memory sense component to convert the analog value of the first memory cell into a second digital value in accordance with the matrix transformation opcode and the matrix transformation operand; and responsive to reading the matrix transformation operand into the MMU, write a matrix transformation result based on the second digital value.

In one variant, the matrix transformation opcode indicates a size of the MMU. In one such implementation, the matrix transformation opcode corresponds to a wireless communication processing operation (e.g., in a MIMO or massive MIMO system such as a 5G NR gNB or UE). In one such configuration, the operation corresponds to a precoding/beamforming operation, and at least some aspect of the size of the MMU corresponds to the size of the precoding/beamforming matrix (which corresponds to the dimensions of the channel information matrix).

In another configuration, the operation corresponds to a decoding or data estimation or recovery operation.

In another variant, the matrix transformation operand includes a vector derived from data that will be communicated within a wireless communication system using two or more antennas.

In yet another variant, the matrix transformation operand includes a vector derived from signals received by two or more antennas within a wireless communication system.

In another variant, the matrix transformation opcode identifies one or more analog values corresponding to one or more memory cells. In one such variant, the one or more analog values corresponding to the one or more memory cells are stored within a look-up-table (LUT) data structure. In one implementation, the LUT includes a codebook of predetermined precoding matrixes and the one or more analog values include values/coefficients of a precoding matrix. In one variant thereof, the one or more analog values corresponding to the one or more memory cells are received by the non-transitory computer readable medium from a processor apparatus.

In one variant, each memory cell of the MMU includes resistive random access memory (ReRAM) cells; and each memory cell of the MMU multiplies the analog value in the analog medium in accordance with the matrix transformation opcode and the matrix transformation operand.

In one variant, each memory cell of the MMU further accumulates the analog value in the analog medium with a previous analog value.

In one variant, the first digital value is characterized by a first radix of two (2); and the second digital value is characterized by a second radix greater than two (2).

In one aspect of the present disclosure, a device is disclosed. In one embodiment, the device includes a processor coupled to a non-transitory computer readable medium; where the non-transitory computer readable medium includes one or more instructions which, when executed by the processor, cause the processor to: write a matrix transformation opcode and a matrix transformation operand to the non-transitory computer readable medium; wherein the matrix transformation opcode causes the non-transitory computer readable medium to operate an array of memory cells as a matrix structure; wherein the matrix transformation operand modifies one or more analog values of the matrix structure; and read a matrix transformation result from the matrix structure.

In one variant, the non-transitory computer readable medium further includes one or more instructions which, when executed by the processor, cause the processor to: obtain a precoding matrix or obtain a precoding matrix index or address within a look-up-table (LUT); and obtain data to be communicated by a transmitter; wherein the matrix transformation operand includes the precoding matrix or the precoding matrix index; and wherein the matrix transformation result includes a precoding operation that transforms the data into transmission vectors.

In another variant, the non-transitory computer readable medium comprises one or more instructions which, when executed by the processor, cause the processor to: obtain a data recovery matrix or a data recovery matrix index/address within a look-up-table (LUT); and obtain vectors corresponding to signals received by a receiver; wherein the matrix transformation operand includes the data recovery matrix or data recovery matrix index. In one implementation, the matrix transformation result includes an estimate of original data communicated to the receiver by a transmitter.

In one variant, the matrix transformation opcode causes the non-transitory computer readable medium to operate another array of memory cells as another matrix structure; and the matrix transformation result associated with the matrix structure and another matrix transformation result associated with another matrix structure are logically combined.

In one variant, the one or more analog values of the matrix structure are stored within a look-up-table (LUT) data structure. In one implementation thereof, at least some of the values of the matrix structure are stored in a portion of the memory cells not configured as a matrix structure. In another implementation, the one or more analog values of the matrix structure are provided to the non-transitory computer readable medium from the processor.

In one aspect of the present disclosure, a method to perform transformation matrix operations is disclosed. In one embodiment, the method includes: receiving a matrix transformation opcode; configuring at least one array of memory cells of a memory into a matrix structure, based on the matrix transformation opcode; configuring a memory sense component based on the matrix transformation opcode; and responsive to reading a matrix transformation operand into the matrix structure, writing a matrix transformation result from the memory sense component.

In one variant, the matrix transformation operand corresponds to vectors derived from data to be communicated by a transmitter using two or more antennas, and configuring the matrix structure includes configuring the at least one array of memory cells with values of a precoding matrix. The matrix transformation result includes vectors corresponding to precoded signals for transmission through a wireless communication channel (e.g. within a MIMO system) corresponding to the precoding matrix.

In another variant of the method, the matrix transformation operand corresponds to vectors derived from signals received by a receiver using two or more antennas, and configuring the matrix structure includes configuring the at least one array of memory cells with values of a data recovery matrix (corresponding to a precoding matrix) and the matrix results include vectors corresponding to recovered/estimated data being communicated to the receiver.

In one implementation, the matrix structure is configured with the values of four matrices: a first matrix of positive real values of the matrix, a second matrix of negative real values of the matrix, a third matrix of positive imaginary values of the matrix, and a fourth matrix of negative imaginary values of the matrix. In one particular configuration thereof, the at least one array of memory cells includes two arrays, each configured with the values of the four matrices.

In another configuration, the two arrays are configured to be run in parallel with each other. In one variant, the two arrays are connected to a single memory sense component. The single memory sense component inputs digital values (obtained with an analog-to-digital conversion-ADC) corresponding the results of the two arrays into two separate arithmetic logical units (ALUs) and subsequently combines the results of the two ALUs in a third ALU.

In an alternate configuration, the single memory sense component inputs the digital values corresponding to the results of the two arrays into one ALU, the one ALU having logic to appropriately combine the results. The two arrays may be e.g., respectively connected to two separate memory sense components (each with its own ADC and ALU), and the results from the two memory sense components may be further combined in another ALU.

In another embodiment, the method includes consecutively reading/running multiple matrix transformation operands into/through the matrix structure, and reconfiguring the memory sense component between at least some of the runs. In one variant, the multiple matrix transformation operands include a first operand having real coefficients of a vector, and a second operand having imaginary coefficients of the vector, and the method includes configuring the memory sense component with a first configuration; running the first operand through the matrix structure; reconfiguring the memory sense component to account for the imaginary coefficients of the second operand; and running the second operand through the matrix structure.

In one implementation of the foregoing embodiment, the configuring and reconfiguring the memory sense component includes configuring and reconfiguring one or more arithmetic logical units (ALUs) within the memory sense component.

In another variant, configuring the array of memory cells includes connecting a plurality of word lines and a plurality of bit lines corresponding to a row dimension and a column dimension associated with the matrix structure.

In a further variant, the method also includes determining the row dimension and the column dimension from the matrix transformation opcode.

In another variant, configuring the array of memory cells includes setting one or more analog values of the matrix structure based on a look-up-table (LUT) data structure.

In yet a further variant, the method includes identifying an entry from the LUT data structure based on the matrix transformation opcode.

In another variant, configuring the memory sense component enables matrix transformation results having a radix greater than two (2).

In another aspect of the disclosure, an apparatus configured to configure a memory device into a matrix fabric is described. In one embodiment, the apparatus includes: a memory; a processor configured to access the memory; pre-processor logic configured to allocate one or more memory portions for use as a matrix fabric.

In yet another aspect of the disclosure, a computerized image processing device apparatus configured to dynamically configure a memory into a matrix fabric is disclosed. In one embodiment, the computerized image processing device includes: a camera interface; digital processor apparatus in data communication with the camera interface; and a memory in data communication with the digital processor apparatus and including at least one computer program.

In another aspect of the disclosure, a computerized video processing device apparatus configured to dynamically configure a memory into a matrix fabric is disclosed. In one embodiment, the computerized video processing device includes: a camera interface; digital processor apparatus in data communication with the camera interface; and a memory in data communication with the digital processor apparatus and including at least one computer program.

In still another aspect of the disclosure, a computerized wireless access node apparatus configured to dynamically configure a memory into a matrix fabric is disclosed. In one embodiment, the computerized wireless access node includes: a wireless interface configured to transmit and receive RF waveforms in the spectrum portion; digital processor apparatus in data communication with the wireless interface; and a memory in data communication with the digital processor apparatus and including at least one computer program.

In one variant, the computerized wireless access node apparatus is configured as a 3GPP eNB or gNB.

In another variant, the computerized wireless access node apparatus is configured as an IEEE Std. 802.11 wireless access point (AP) capable of diversity processing in support of wireless channels.

In a further aspect of the disclosure, a computerized device is disclosed. In one embodiment, the computerized device includes a 3GPP LTE or 5G NR compliant UE (user equipment) having diversity processing matrix logic configured according to one or more of the foregoing methods or apparatus. In one variant, the UE includes a 5G NR mmWave system with massive MIMO capability.

In another embodiment, the computerized device is configured as an IEEE Std. 802.11-compliant STA (station) capable of diversity processing in support of one or more wireless channels.

In an additional aspect of the disclosure, computer readable apparatus is described. In one embodiment, the apparatus includes a storage medium configured to store one or more computer programs within or in conjunction with characterized memory. In one embodiment, the apparatus includes a program memory or HDD or SDD on a computerized controller device. In another embodiment, the apparatus includes a program memory, HDD or SSD on a computerized access node.

These and other aspects shall become apparent when considered in light of the disclosure provided herein.

BRIEF DESCRIPTION OF THE DRAWINGS

FIG. 2 is a logical block diagram of one exemplary implementation of a memory device in accordance with various principles of the present disclosure.

DETAILED DESCRIPTION

Figure 1A:
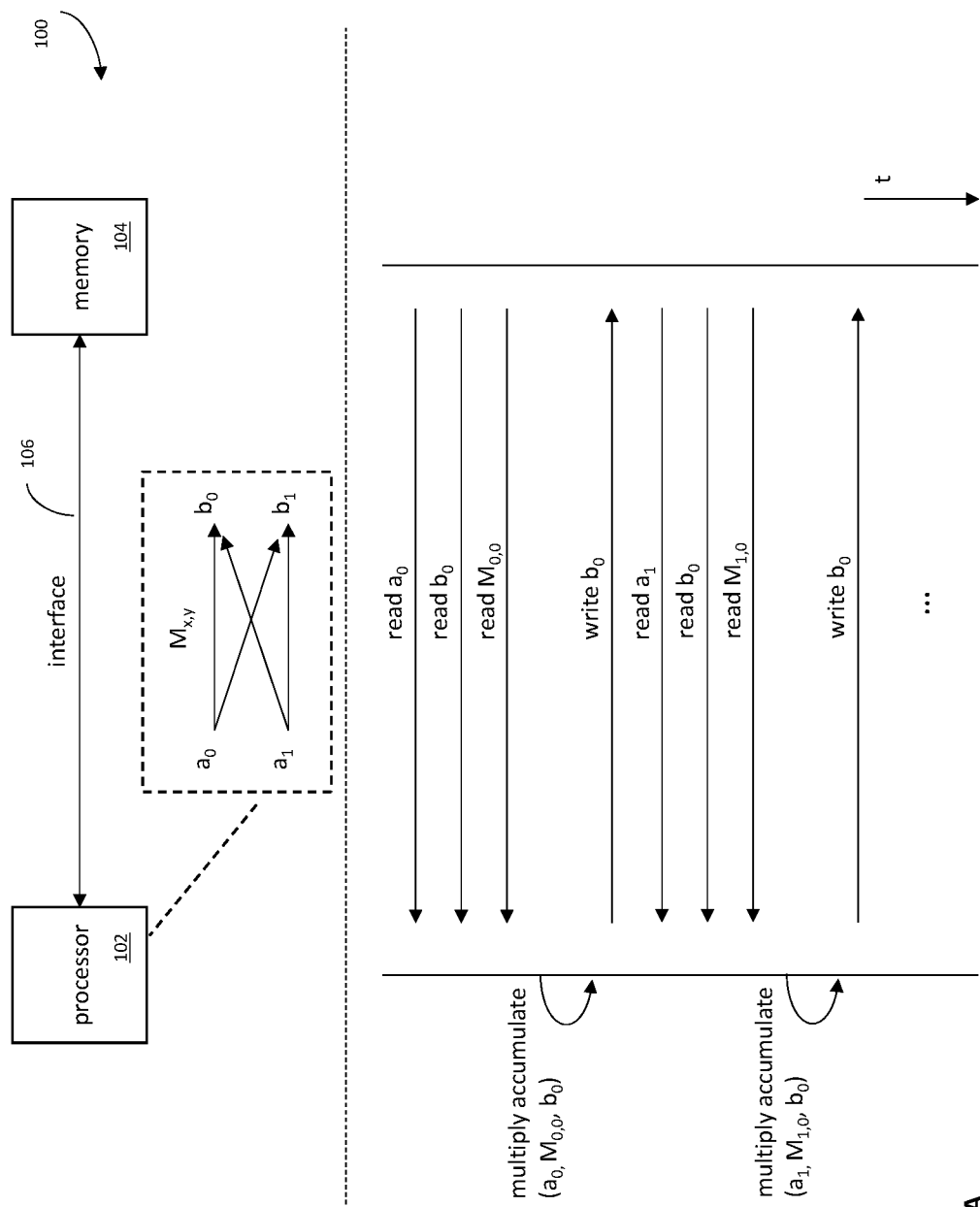
FIG. 1A is a diagram of processor-memory architecture and a graphical depiction of an associated matrix operation.

Reference is now made to the drawings wherein like numerals refer to like parts throughout.

As used herein, the term "application" (or "app") refers generally and without limitation to a unit of executable software that implements a certain functionality or theme. The themes of applications vary broadly across any number of disciplines and functions (such as on-demand content management, e-commerce transactions, brokerage transactions, home entertainment, calculator etc.), and one application may have more than one theme. The unit of executable software generally runs in a predetermined environment; for example, the unit could include a downloadable application that runs within an operating system environment.

As used herein, the terms "channel coding" and "coding" may refer generally to, without limitation, both channel precoding and channel decoding operations or calculations, such as those used in diversity determinations associated with wireless channels.

As used herein, the term "computer program" or "software" is meant to include any sequence or human or machine cognizable steps which perform a function. Such program may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Register Transfer Language (RTL), VHSIC (Very High Speed Integrated Circuit) Hardware Description Language (VHDL), Verilog, and the like.

As used herein, the term "decentralized" or "distributed" refers without limitation to a configuration or network architecture involving multiple computerized devices that are able to perform data communication with one another, rather than requiring a given device to communicate through a designated (e.g., central) network entity, such as a server device. For example, a decentralized network enables direct peer-to-peer data communication among multiple UEs (e.g., wireless user devices) making up the network.

As used herein, the term "distributed unit" (DU) refers without limitation to a distributed logical node within a wireless network infrastructure. For example, a DU might be embodied as a next-generation Node B (gNB) DU (gNB-DU) that is controlled by a gNB CU described above. One gNB-DU may support one or multiple cells; a given cell is supported by only one gNB-DU.

As used herein, the term "diversity" includes without limitation, spatial diversity (e.g., MIMO, SIMO, MISO, MU-MIMO, SU-MIMO, and massive-MIMO), multiplexing (such as spatial multiplexing of two or more information channels via spatially diverse antenna elements), beamforming (such as 2D and 3D spatial beamforming), etc.

As used herein, the terms "Internet" and "internet" are used interchangeably to refer to inter-networks including, without limitation, the Internet. Other common examples include but are not limited to: a network of external servers, "cloud" entities (such as memory or storage not local to a device, storage generally accessible at any time via a network connection, and the like), service nodes, access points, controller devices, client devices, etc. 5G-servicing core networks and network components (e.g., DU, CU, gNB, small cells or femto cells, 5G-capable external nodes) residing in the backhaul, fronthaul, crosshaul, or an "edge" thereof proximate to residences, businesses and other occupied areas may be included in "the Internet."

As used herein, the term "LTE" refers to, without limitation and as applicable, any of the variants or Releases of the Long-Term Evolution wireless communication standard, including LTE-U (Long Term Evolution in unlicensed spectrum), LTE-LAA (Long Term Evolution, Licensed Assisted Access), LTE-A (LTE Advanced), and 4G/4.5G LTE.

As used herein the terms "5G" and "New Radio (NR)" refer without limitation to apparatus, methods or systems compliant with 3GPP Release 15, and any modifications, subsequent Releases, or amendments or supplements thereto which are directed to New Radio technology, whether licensed or unlicensed.

As used herein, the term "memory" includes any type of integrated circuit or other storage device adapted for storing digital data including, without limitation, random access memory (RAM), pseudostatic RAM (PSRAM), dynamic RAM (DRAM), synchronous dynamic RAM (SDRAM) including double data rate (DDR) class memory and graphics DDR (GDDR) and variants thereof, ferroelectric RAM (FeRAM), magnetic RAM (MRAM), resistive RAM (ReRAM), read-only memory (ROM), programmable ROM (PROM), electrically erasable PROM (EEPROM or $E^2$PROM), DDR/2 SDRAM, EDO/FPMS, reduced-latency DRAM (RLDRAM), static RAM (SRAM), "flash" memory (e.g., NAND/NOR), phase change memory (PCM), 3-dimensional cross-point memory (3D Xpoint), stacked memory such as HBM/HBM2, and magnetoresistive RAM (MRAM), such as spin torque transfer RAM (STT RAM).

As used herein, the terms "microprocessor" and "processor" or "digital processor" are meant generally to include all types of digital processing devices including, without limitation, digital signal processors (DSPs), reduced instruction set computers (RISC), general-purpose processors (GPP), microprocessors, gate arrays (e.g., FPGAs), PLDs, reconfigurable computer fabrics (RCFs), array processors, secure microprocessors, and application-specific integrated circuits (ASICs). Such digital processors may be contained on a single unitary IC die, or distributed across multiple components.

As used herein, the term "server" refers to any computerized component, system or entity regardless of form which is adapted to provide data, files, applications, content, or other services to one or more other devices or entities on a computer network.

As used herein, the term "storage" refers to without limitation computer hard drives (e.g., hard disk drives (HDD), solid state drives (SDD)), Flash drives, DVR device, memory, RAID devices or arrays, optical media (e.g., CD-ROMs, Laserdiscs, Blu-Ray, etc.), or any other devices or media capable of storing content or other information, including semiconductor devices (e.g., those described herein as memory) capable of maintaining data in the absence of a power source. Common examples of memory devices that are used for storage include, without limitation: ReRAM, DRAM (e.g., SDRAM, DDR SDRAM, DDR2 SDRAM, DDR3 SDRAM, DDR4 SDRAM, GDDR, RLDRAM, LPDRAM, etc.), DRAM modules (e.g., RDIMM, VLP RDIMM, UDIMM, VLP UDIMM, SODIMM, SORDIMM, Mini-DIMM, VLP Mini-DIMM, LRDIMM, NVDIMM, etc.), managed NAND, NAND Flash (e.g., SLC NAND, MLC NAND, TLS NAND, Serial NAND, 3D NAND, etc.), NOR Flash (e.g., Parallel NOR, Serial NOR, etc.), multichip packages, hybrid memory cube, memory cards, solid state storage (SSS), and any number of other memory devices.

As used herein, the term "Wi-Fi" refers to, without limitation and as applicable, any of the variants of IEEE Std. 802.11 or related standards including 802.11 a/b/g/n/s/v/ac/ad/av/ax/ba or 802.11-2012/2013, 802.11-2016, as well as Wi-Fi Direct (including inter alia, the "Wi-Fi Peer-to-Peer (P2P) Specification", incorporated herein by reference in its entirety).

As used herein, the term "wireless" means any wireless signal, data, communication, or other interface including without limitation Wi-Fi, Bluetooth/BLE, 3G/4G/4.5G/5G (3GPP/3GPP2), HSDPA/HSUPA, TDMA, CBRS, CDMA (e.g., IS-95A, WCDMA, etc.), FHSS, DSSS, GSM, PAN/802.15, WiMAX (802.16), 802.20, Zigbee™, Z-wave, narrowband/FDMA, OFDM, PCS/DCS, LTE/LTE-A/LTE-U/LTE-LAA, analog cellular, CDPD, satellite systems, millimeter wave or microwave systems, acoustic, and infrared (i.e., IrDA).

As used herein, the term "xNB" refers to any 3GPP-compliant node including without limitation eNBs (eUTRAN) and gNBs (5G NR).

Overview

The aforementioned "processor-memory wall" performance limitations can be egregious where a processor-memory architecture repeats similar operations over a large data set. Under such circumstances, the processor-memory architecture has to individually transfer, manipulate, and store for each element of the data set, iteratively. For example, a matrix multiplication of 4×4 (sixteen (16) elements) takes four (4) times as long as a matrix multiplication of 2×2 (four (4) elements). In other words, matrix operations exponentially scale as a function of the matrix size.

Various embodiments of the present disclosure are directed to converting a memory array into a matrix fabric for matrix transformations and performing matrix operations therein.

Matrix transformations are commonly used in many different applications and can take a disproportionate amount of processing and/or memory bandwidth. For example, many communication technologies such as for wireless systems employ matrix multiplication for e.g., beamforming/precoding and/or diversity applications such as massive multiple input multiple output (MIMO) or MU-MIMO channel processing.

Exemplary embodiments described herein perform matrix transformations within a memory device that includes a matrix fabric and matrix multiplication unit (MMU). In one exemplary embodiment, the matrix fabric uses a "crossbar" construction of resistive elements. Each resistive element stores a level of impedance that represents the corresponding matrix coefficient value. The crossbar connectivity can be driven with an electrical signal representing the input vector as an analog voltage. The resulting signals can be converted from analog voltages to a digital values by an MMU to yield a vector-matrix product. In some cases, the MMU may additionally perform various other logical operations within the digital domain.

Unlike existing solutions that iterate through each element of the matrix to calculate the element value, the crossbar matrix fabric described hereinafter computes multiple elements of the matrix "atomically" i.e., in a single processing cycle. For example, at least a portion of a vector-matrix product may be calculated in parallel. The "atomicity" of matrix fabric based computations yields significant processing improvements over iterative alternatives. In particular, while iterative techniques grow as a function of matrix size, atomic matrix fabric computations are independent of matrix dimensions. In other words, an N×N vector-matrix product can be completed in a single atomic instruction.

MIMO and massive MIMO channel coding techniques may use e.g., predefined matrixes and/or codebooks of matrixes having known structures and weighting. In massive MIMO systems, a single base station can use hundreds or even thousands of antennas, so massive MIMO matrix operations potentially include matrices and vectors of very large dimensions. Matrix multiplication operations are required to e.g., transform channel information matrices, to perform precoding/beamforming, and to perform data recovery operations.

As a brief aside, practical limitations on component manufacture limit the capabilities of each element within an individual memory device. For example, most memory arrays are only designed to discern between two (2) states (logical "1", logical "0"). While existing memory sense components may be extended to discern higher levels of precision (e.g., four (4) states, eight (8) states, etc.) the increasing the precision of memory sense components may be impractical to support the precision required for large transforms typically used in e.g., video compression, mathematical transforms, etc.

To these ends, various embodiments of the present disclosure logically combine one or more matrix fabrics and/or MMUs to provide greater degrees of precision and/or processing sophistication than would otherwise be possible. In one such embodiment, a first matrix fabric and/or MMU may be used to calculate a positive vector-matrix product and a second matrix fabric and/or MMU may be used to calculate a negative vector-matrix product. The positive and negative vector-matrix product can be summed to determine the net vector-matrix product. Similarly, in some embodiments, multiple (e.g., four) matrix fabrics may be combined to calculate a vector-matrix product where the matrix includes positive and negative complex numbers. Furthermore, matrix multiplication operations can be sequenced or parallelized in accordance with any number of design considerations.

Other examples of logical matrix operations can be substituted with equivalent success (e.g., decomposition, common matrix multiplication, etc.) given the contents of the present disclosure.

Certain applications can save a significant amount of power by turning off system components when not in use. However, the sleep procedure often requires a processor and/or memory to shuttle data from operational volatile memory to non-volatile storage memory such that the data is not lost while powered down. Wake-up procedures are also needed to retrieve the stored information from the non-volatile storage memory. Shuttling data back and forth between memories is an inefficient use of processor-memory bandwidth. Consequently, various embodiments disclosed herein leverage the "non-volatile" nature of the matrix fabric. In such embodiments, the matrix fabric can retain its matrix coefficient values even when the memory has no power. More directly, the non-volatile nature of the matrix fabric enables a processor and memory to transition into sleep/low power modes or to perform other tasks without shuffling data from volatile memory to non-volatile memory and vice versa.

Various other combinations and/or variants of the foregoing will be readily appreciated by artisans of ordinary skill, given the contents of the present disclosure.

DETAILED DESCRIPTION OF EXEMPLARY EMBODIMENTS

Exemplary embodiments of the apparatus and methods of the present disclosure are now described in detail. While these exemplary embodiments are described in the context of the previously specific processor and/or memory configurations, the general principles and advantages of the disclosure may be extended to other types of processor and/or memory technologies, the following therefore being merely exemplary in nature.

It will also be appreciated that while described generally in the context of a consumer device (within a cellular phone, wireless LAN AP or STA, and/or network base station such as 3GPP eNB or gNB or even a femtocell/HNB), the present disclosure may be readily adapted to other types of devices including, e.g., server devices, Internet of Things (IoT) devices, and/or for personal, corporate, or even governmental uses, such as those outside the proscribed "incumbent" users such as U.S. DoD and the like. Yet other applications are possible.

Other features and advantages of the present disclosure will immediately be recognized by persons of ordinary skill in the art with reference to the attached drawings and detailed description of exemplary embodiments as given below.

Processor Memory Architectures—

FIG. 1A illustrates one common processor-memory architecture 100 useful for illustrating matrix operations. As shown in FIG. 1A, a processor 102 is connected to a memory 104 via an interface 106. In the illustrative example, the processor multiplies the elements of an input vector a against a matrix M to calculate the vector-matrix product b. Mathematically, the input vector a is treated as a single column matrix having a number of elements equivalent to the number of rows in the matrix M.

In order to calculate the first element of the vector-matrix product $b_o$, the processor must iterate through each permutation of input vector a elements for each element within a row of the matrix M. During the first iteration, the first element of the input vector $a_0$ is read, the current value of the vector-matrix product $b_0$ is read and the corresponding matrix coefficient value $M_{0,0}$ is read. The three (3) read values are used in a multiply-accumulate operation to generate an "intermediary" vector-matrix product $b_0$. Specifically, the multiply-accumulate operation calculates: $(a_0 \cdot M_{0,0}) + b_0$ and writes the result value back to $b_0$. Notably, $b_0$ is an "intermediary value." After the first iteration but before the second iteration, the intermediary value of $b_0$ may not correspond to the final value of the vector-matrix product $b_0$.

During the second iteration, the second element of the input vector $a_1$ is read, the previously calculated intermediary value $b_0$ is retrieved, and a second matrix coefficient value $M_{1,0}$ is read. The three (3) read values are used in a multiply-accumulate operation to generate the first element of the vector-matrix product $b_0$. The second iteration completes the computation of $b_0$.

While not expressly shown, the iterative process described above is also performed to generate the second element of the vector-matrix product $b_1$. Additionally, while the foregoing example is a 2×2 vector-matrix product, the techniques described therein are commonly extended to support vector-matrix computations of any size. For example, a 3×3 vector-matrix product calculation iterates over an input vector of three (3) elements for each of the three (3) rows of the matrix; thus, requiring nine (9) iterations. A matrix operation of 1024×1024 (which is not uncommon for many applications) would require more than one million iterations. More directly, the aforementioned iterative process exponentially scales as a function of the matrix dimension.

Even though the foregoing discussion is presented in the contest of a vector-matrix product, artisans of ordinary skill will readily appreciate that a matrix-matrix product can be performed as a series of vector-matrix products. For example, a first vector-matrix product corresponding to the first single column matrix of the input vector is calculated, a second vector↑ matrix product corresponding to the second single column matrix of the input vector is calculated, etc. Thus, a 2×2 matrix-matrix product would require two (2) vector-matrix calculations (i.e., 2×4=8 total), a 3×3 matrix-matrix product would require three (3) vector↑ matrix calculations (i.e., 3×9=27 total).

Artisans of ordinary skill in the related arts will readily appreciate that each iteration of the process described in FIG. 1A is bottlenecked by the bandwidth limitations of interface 106 (the "processor-memory wall"). Even though the processor and the memory may have internal buses with very high bandwidths, the processor-memory system can only communicate as fast as the interface 106 can support electrical signaling (based on the dielectric properties of the materials used in the interface 106 (typically copper) and the transmission distance (~1-2 centimeters)). Moreover, the interface 106 may also include a variety of additional signal conditioning, amplification, noise correction, error correction, parity computations, and/or other interface based logic that further reduces transaction times.

One common approach to improve the performance of matrix operations is to perform the matrix operation within the local processor cache. Unfortunately, the local processor cache takes processor die space, and has a much higher cost-per-bit to manufacture than e.g., comparable memory devices. As a result, the processor's local cache size is usually much smaller (e.g., a few megabytes) than its memory (which can be many gigabytes). From a practical aspect, the smaller local cache is a hard limitation on the maximum amount of matrix operations that can be performed locally within the processor. As another drawback, large matrix operations result in poor cache utilization since only one row and one column are being accessed at a time (e.g., for a 1024×1024 vector-matrix product, only 1/1024 of the cache is in active use during a single iteration). Consequently, while processor cache implementations may be acceptable for small matrixes, this technique becomes increasingly less desirable as matrix operations grow in complexity.

Figure 1B:
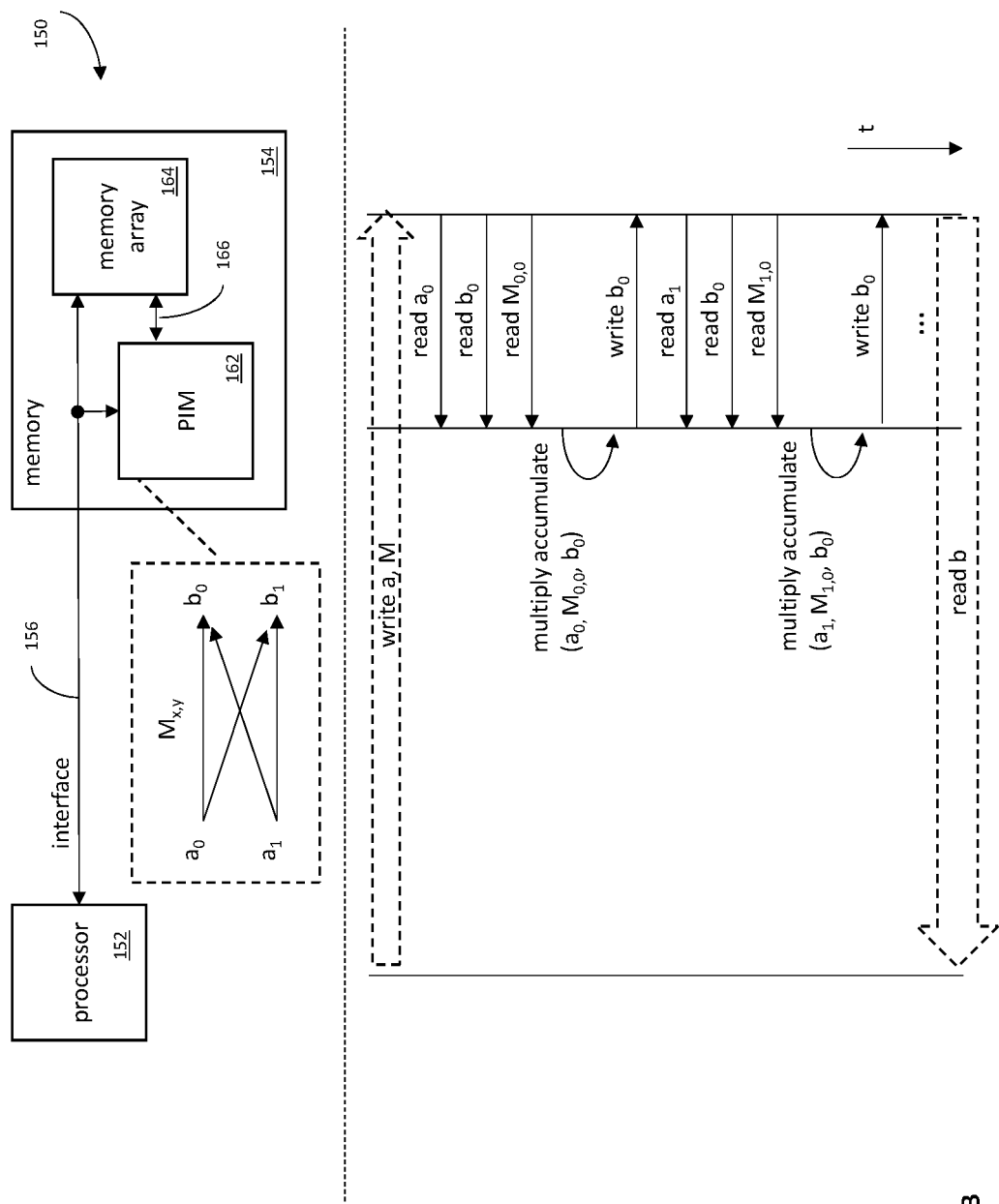
FIG. 1B is a diagram of processor-PIM architecture and a graphical depiction of an associated matrix operation.

Another common approach is a so-called processor-in-memory (PIM). FIG. 1B illustrates one such processor-PIM architecture 150. As shown therein, a processor 152 is connected to a memory 154 via an interface 156. The memory 154 further includes a PIM 162 and a memory array 164; the PIM 162 is tightly coupled to the memory array 164 via an internal interface 166.

Similar to the process described in FIG. 1A supra, the processor-PIM architecture 150 of FIG. 1B multiplies the elements of an input vector a against a matrix M to calculate the vector-matrix product b. However, the PIM 162 reads, multiply-accumulates, and writes to the memory 164 internally via the internal interface 166. The internal interface 166 in much shorter than the external interface 156; additionally, the internal interface 166 can operate natively without e.g., signal conditioning, amplification, noise correction, error correction, parity computations, etc.

While the processor-PIM architecture 150 yields substantial improvements in performance over e.g., the processor-memory architecture 100, the processor-PIM architecture 150 may have other drawbacks. For example, the fabrication techniques ("silicon process") are substantially different between processor and memory devices because each silicon process is optimized for different design criteria. For example, the processor silicon process may use thinner transistor structures than memory silicon processes; thinner transistor structures offer faster switching (which improves performance) but suffer greater leakage (which is undesirable for memory retention). As a result, manufacturing a PIM 162 and memory array 164 in the same wafer results in at least one of them being implemented in a sub-optimal silicon process. Alternatively, the PIM 162 and memory array 164 may be implemented within separate dies and joined together; die-to-die communication typically increases manufacturing costs and complexity and may suffer from various other detriments (e.g., introduced by process discontinuities, etc.)

Moreover, artisans of ordinary skill in the related arts will readily appreciate that the PIM 162 and the memory array 164 are "hardened" components; a PIM 162 cannot store data, nor can the memory 164 perform computations. As a practical matter, once the memory 154 is manufactured, it cannot be altered to e.g., store more data and/or increase/decrease PIM performance/power consumption. Such memory devices are often tailored specifically for their application; this is both costly to design and modify, in many cases they are "proprietary" and/or customer/manufacturer specific. Moreover, since technology changes at a very rapid pace, these devices are quickly rendered obsolete.

For a variety of reasons, improved solutions for matrix operations within processors and/or memory are needed. Ideally, such solutions would enable matrix operations within a memory device in a manner that minimizes performance bottlenecks of the processor-memory wall. Furthermore, such solutions should flexibly accommodate a variety of different matrix operations and/or matrix sizes.

Exemplary Memory Device—

FIG. 2 is a logical block diagram of one exemplary implementation of a memory device 200 manufactured in accordance with the various principles of the present disclosure. The memory device 200 may include a plurality of partitioned memory cell arrays 220. In some implementations, each of the partitioned memory cell arrays 220 may be partitioned at the time of device manufacture. In other implementations, the partitioned memory cell arrays 220 may be partitioned dynamically (i.e., subsequent to the time of device manufacture). The memory cell arrays 220 may each include a plurality of banks, each bank including a plurality of word lines, a plurality of bit lines, and a plurality of memory cells arranged at, for example, intersections of the plurality of word lines and the plurality of bit lines. The selection of the word line may be performed by a row decoder 216 and the selection of the bit line may be performed by a column decoder 218.

The plurality of external terminals included in the semiconductor device 200 may include address terminals 260, command terminals 262, clock terminals 264, data terminals 240 and power supply terminals 250. The address terminals 260 may be supplied with an address signal and a bank address signal. The address signal and the bank address signal supplied to the address terminals 260 are transferred via an address input circuit 202 to an address decoder 204. The address decoder 204 receives, for example, the address signal and supplies a decoded row address signal to the row decoder 216, and a decoded column address signal to the column decoder 218. The address decoder 204 may also receive the bank address signal and supply the bank address signal to the row decoder 216 and the column decoder 218.

The command terminals 262 are supplied with a command signal to a command input circuit 206. The command terminals 262 may include one or more separate signals such as e.g., row address strobe (RAS), column address strobe (CAS), read/write (R/W). The command signal input to the command terminals 262 is provided to the command decoder 208 via the command input circuit 206. The command decoder 208 may decode the command signal 262 to generate various control signals. For example, the RAS can be asserted to specify the row where data is to be read/written, and the CAS can be asserted to specify where data is to be read/written. In some variants, the R/W command signal determines whether or not the contents of the data terminal 240 are written to memory cells 220, or read therefrom.

During a read operation, the read data may be output externally from the data terminals 240 via a read/write amplifier 222 and an input/output circuit 224. Similarly, when the write command is issued and a row address and a column address are timely supplied with the write command, a write data command may be supplied to the data terminals 240. The write data command may be supplied via the input/output circuit 224 and the read/write amplifier 222 to a given memory cell array 220 and written in the memory cell designated by the row address and the column address. The input/output circuit 224 may include input buffers, in accordance with some implementations.

The clock terminals 264 may be supplied with external clock signals for synchronous operation. In one variant, the clock signal is a single ended signal; in other variants, the external clock signals may be complementary (differential signaling) to one another and are supplied to a clock input circuit 210. The clock input circuit 210 receives the external clock signals and conditions the clock signal to ensure that the resulting internal clock signal has sufficient amplitude and/or frequency for subsequent locked loop operation. The conditioned internal clock signal is supplied to feedback mechanism (internal clock generator 212) provide a stable clock for internal memory logic. Common examples of internal clock generation logic 212 includes without limitation: digital or analog phase locked loop (PLL), delay locked loop (DLL), and/or frequency locked loop (FLL) operation.

In alternative variants (not shown), the memory 200 may rely on external clocking (i.e., with no internal clock of its own). For example, a phase controlled clock signal may be externally supplied to the input/output (IO) circuit 224. This external clock can be used to clock in written data, and clock out data reads. In such variants, IO circuit 224 provides a clock signal to each of the corresponding logical blocks (e.g., address input circuit 202, address decoder 204, command input circuit 206, command decoder 208, etc.).

The power supply terminals 250 may be supplied with power supply potentials. In some variants (not shown), these power supply potentials may be supplied via the input/output (I/O) circuit 224. In some embodiments, the power supply potentials may be isolated from the I/0 circuit 224 so that power supply noise generated by the IO circuit 224 does not propagate to the other circuit blocks. These power supply potentials are conditioned via an internal power supply circuit 230. For example, the internal power supply circuit 230 may generate various internal potentials that e.g., remove noise and/or spurious activity, as well as boost or buck potentials, provided from the power supply potentials. The internal potentials may be used in e.g., the address circuitry (202, 204), the command circuitry (206, 208), the row and column decoders (216, 218), the RW amplifier 222, and/or any various other circuit blocks.

A power-on-reset circuit (PON) 228 provides a power on signal when the internal power supply circuit 230 can sufficiently supply internal voltages for a power-on sequence. A temperature sensor 226 may sense a temperature of the semiconductor device 200 and provides a temperature signal; the temperature of the semiconductor device 200 may affect some memory operations.

In one exemplary embodiment, the memory arrays 220 may be controlled via one or more configuration registers. In other words, the use of these configuration registers selectively configure one or more memory arrays 220 into one or more matrix fabrics and/or matrix multiplication units (MMUs) described in greater detail herein. In other words, the configuration registers may enable the memory cell architectures within the memory arrays to dynamically change both e.g., their structure, operation, and functionality. These and other variations would be readily apparent to one of ordinary skill given the contents of the present disclosure.

Figure 3:
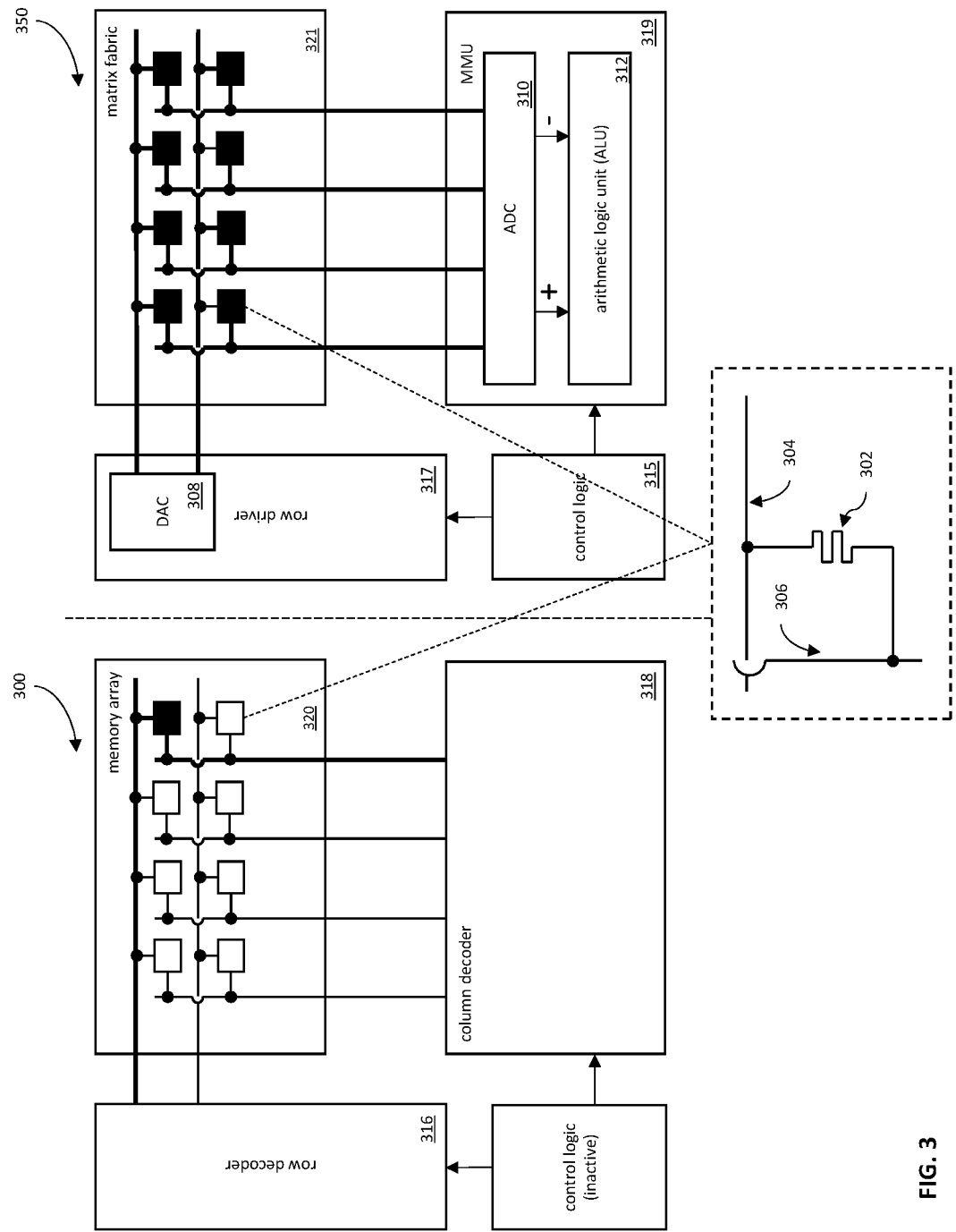
FIG. 3 is an exemplary side-by-side illustration of a first memory device configuration and a second memory device configuration.

FIG. 3 provides a more detailed side-by-side illustration of the memory array and matrix fabric circuitry configurations. The memory array and matrix fabric circuitry configurations of FIG. 3 both use the same array of memory cells, where each memory cell is composed of a resistive element 302 that is coupled to a word-line 304 and a bit-line 306. In the first configuration 300, the memory array circuitry is configured to operate as a row decoder 316, a column decoder 318, and an array of memory cells 320. In the second configuration 350, the matrix fabric circuitry is configured to operate as a row driver 317, a matrix multiplication unit (MMU) 319, and an analog crossbar fabric (matrix fabric) 321. In one exemplary embodiment, a look-up-table (LUT) and associated logic 315 can be used to store and configure different matrix multiplication unit coefficient values.

In one exemplary embodiment of the present disclosure, the memory array 320 is composed of a resistive random access memory (ReRAM). ReRAM is a non-volatile memory that changes the resistance of memory cells across a dielectric solid-state material, sometimes referred to as a "memristor." Current ReRAM technology may be implemented within a twoT dimensional (2D) layer or a three-dimensional (3D) stack of layers; however higher order dimensions may be used in future iterations. The complementary metal oxide semiconductor (CMOS) compatibility of the crossbar ReRAM technology may enable both logic (data processing) and memory (storage) to be integrated within a single chip. A crossbar ReRAM array may be formed in a one transistor/one resistor (1T1R) configuration and/or in a configuration with one transistor driving n resistive memory cells (1TNR), among other possible configurations.

Multiple inorganic and organic material systems may enable thermal and/or 10 mc resistive switching. Such systems may, in a number of embodiments include: phase change chalcogenides (e.g., $Ge_2Sb_2Te_5$, AginSbTe, among others); binary transition metal oxides (e.g., NiO, $TiO_2$, among others); perovskites (e.g., $Sr(ZR)TrO_3$, PCMO, among others); solid state electrolytes (e.g., GeS, GeSe, SiOx, $Cu_2S$, among others); organic charge transfer complexes (e.g., Cu tetracynaoquinodimethane (TCNQ), among others); organic charge acceptor systems (e.g., Al amino-dicyanoimidazole (AlDCN), among others); and/or 2D (layered) insulating materials (e.g., hexagonal BN, among others); among other possible systems for resistive switching.

In the illustrated embodiment, the resistive element 302 is a non-linear passive two-terminal electrical component that can change its electrical resistance based on a history (e.g., hysteresis or memory) of current application. In at least one exemplary embodiment, the resistive element 302 may form or destroy a conductive filament responsive to the application of different polarities of currents to the first terminal (connected to the word-line 304) and the second terminal (connected to the bit-line 306). The presence or absence of the conductive filament between the two terminals changes the conductance between the terminals. While the present operation is presented within the context of a resistive element, artisans of ordinary skill in the related arts will readily appreciate that the principles described herein may be implemented within any circuitry that is characterized by a variable impedance (e.g., resistance and/or reactance). Variable impedance may be effectuated by a variety of linear and/or non-linear elements (e.g., resistors, capacitors, inductors, diodes, transistors, thyristors, etc.)

For illustrative purposes, the operation of the memory array 320 in the first configuration 300 is briefly summarized. During operation in the first configuration, a memory "write" may be effectuated by application of a current to the memory cell corresponding to the row and column of the memory array. The row decoder 316 can selectively drive various ones of the row terminals so as to select a specific row of the memory array circuitry 320. The column decoder 318 can selectively sense/drive various ones of the column terminals so as to "read" and/or "write" to the corresponding memory cell that is uniquely identified by the selected row and column (as emphasized in FIG. 3 by the heavier line width and blackened cell element). As noted above, the application of current results in the formation (or destruction) of a conductive filament within the dielectric solid-state material. In one such case, a low resistance state (ON-state) is used to represent the logical "1" and a high resistance state (OFF-state) is used to represent a logical "0". In order to switch a ReRAM cell, a first current with specific polarity, magnitude, and duration is applied to the dielectric solid-state material. Subsequently thereafter, a memory "read" may be effectuated by application of a second current to the resistive element and sensing whether the resistive element is in the ON-state or the OFF-state based on the corresponding impedance. Memory reads may or may not be destructive (e.g., the second current may or may not be sufficient to form or destroy the conductive filament.)

Artisans of ordinary skill in the related arts will readily appreciate that the foregoing discussion of memory array 320 in the first configuration 300 is consistent with existing memory operation in accordance with e.g., ReRAM memory technologies. In contrast, the second configuration 350 uses the memory cells as an analog crossbar fabric (matrix fabric) 321 to perform matrix multiplication operations. While the exemplary implementation of FIG. 3 corresponds to a 2×4 matrix multiplication unit (MMU), other variants may be substituted with equivalent success. For example, a matrix of arbitrarily large size (e.g., 3×3, 4×4, 8×8, etc.) may be implemented (subject to the precision enabled by digitalanalog-conversion (DAC) 308 and analog-to-digital conversion (ADC) 310 components).

In analog crossbar fabric (matrix fabric) 321 operation, each of the row terminals is concurrently driven by an analog input signal, and each of the column terminals is concurrently sensed for the analog output (which is an analog summation of the voltage potentials across the corresponding resistive elements for each row/column combination). Notably, in the second configuration 350, all of the row and column terminals associated with a matrix multiplication are active (as emphasized in FIG. 3 by the heavier line widths and blackened cell elements). In other words, the ReRAM crossbar fabric (matrix fabric) 321 uses the matrix fabric structure to perform an "analog computation" that calculates a vector-matrix product (or scalar-matrix product, matrix-matrix product, etc.)

Notably, the concurrent vector-matrix product calculation within the crossbar fabric is atomic. Specifically, the analog computation of vector-matrix products can complete in a single access cycle. As previously mentioned, an atomic operation is immune to data race conditions. Moreover, the vector-matrix product calculation performs calculations on all rows and all columns of the matrix operation concurrently; in other words, the vector-matrix product calculation does not scale in complexity as a function of matrix dimension. While fabrication constraints (e.g., ADC/DAC granularity, manufacturing tolerance, etc.) may limit the amount of precision and complexity that a single matrix fabric can produce, multiple matrix operations may be mathematically combined together to provide much higher precisions and complexities.

For example, in one exemplary embodiment of the present disclosure, inputs are converted to the analog domain by the DAC 308 for analog computation, but may also be converted back to the digital domain by the ADC 310 for subsequent digital and/or logical manipulation. In other words, the arithmetic logic unit 312 can enable sophisticated numeric manipulation of matrix fabric 321 output. Such capabilities may be used where the analog domain cannot implement the required computation due to practical implementation limitations (e.g., manufacturing cost, etc.)

Figure 4A:
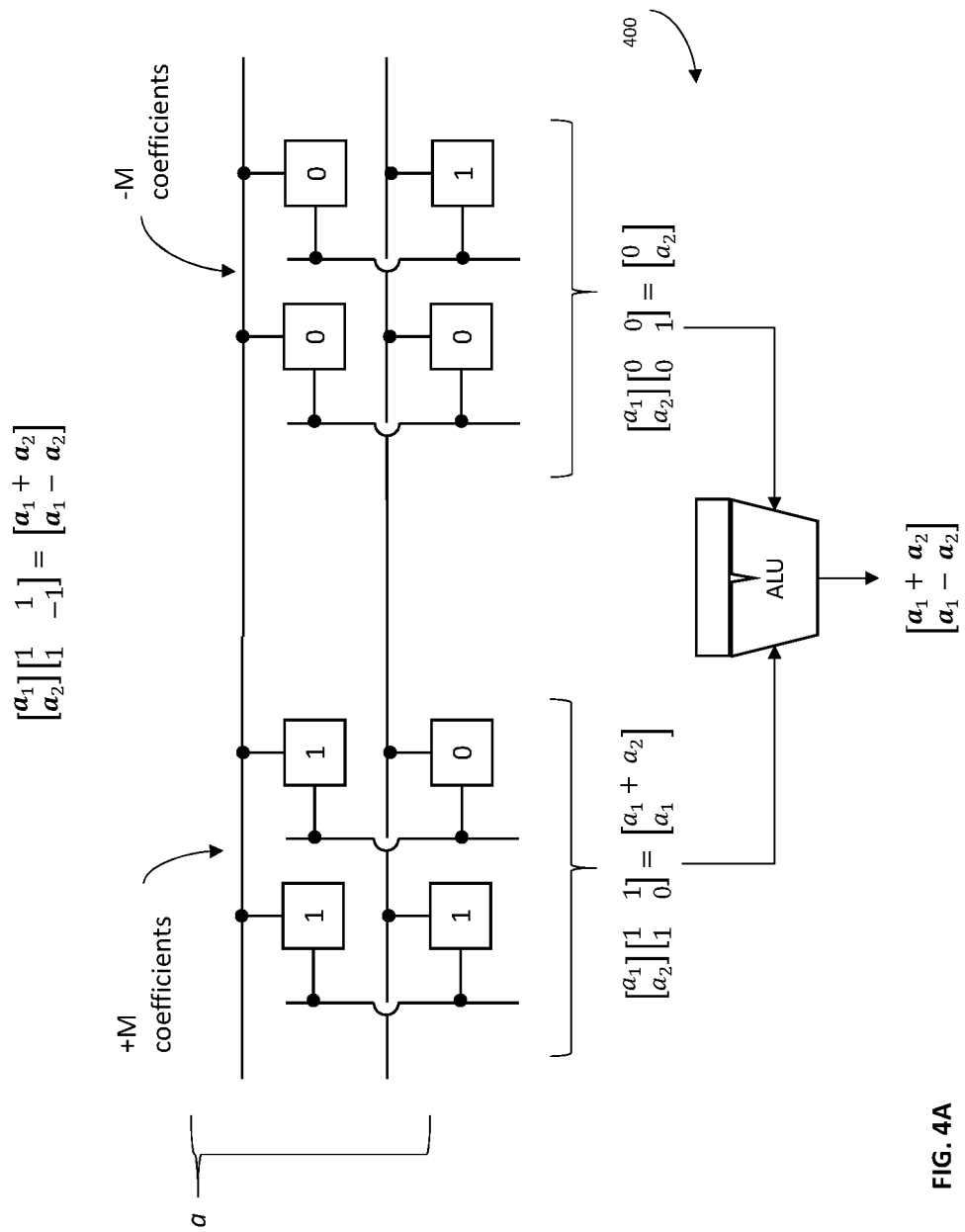
FIG. 4A is a graphical depiction of a matrix operation, involving positive and negative values, performed in accordance with the principles of the present disclosure.

Consider the illustrative example of FIG. 4A, where a simple "butterfly" calculation 400 can be performed via a 2×4 matrix fabric. While conductance can be increased or decreased, conductance cannot be made "negative." As a result, subtraction may need to be performed within the digital domain. The butterfly operation is described in the following multiplication of matrix (M) and vector (a) (EQN. 1):

$$Ma=c \qquad \text{EQN. 1:}$$

where a is a column vector of $[a_1; a_2]$; M is a matrix of $[[1, 1]; [1, -1]]$; and c is a column vector of $[a_1+a_2; a_1-a_2]$.

This simple FFT butterfly 400 of EQN. 1 can be decomposed into two distinct matrices representing the positive and negative coefficients (EQN. 2 and EQN. 3):

$$M_1 a = c_1 \qquad \text{EQN. 2:}$$

$$M_2 a = c_2 \qquad \text{EQN. 3:}$$

where $M_1$ is a matrix of $[[1, 1]; [1, 0]]$; $M_2$ is a matrix of $[[0, 0]; [0, 1]]$; $c_1$ is a column vector of $[a_1+a_2; a_1]$; and $c_2$ is a column vector of $[0; a_2]$.

EQN. 2 and EQN. 3 can be implemented as analog computations with the matrix fabric circuitry. Once calculated, the resulting analog values may be converted back to the digital domain via the aforementioned ADC. Existing ALU operations may be used to perform subtraction in the digital domain (EQN. 4):

$$c_1 - c_2 = c \qquad \text{EQN. 4:}$$

In other words, as illustrated in FIG. 4A, a 2×2 matrix can be further subdivided into a 2×2 positive matrix and a 2×2 negative matrix. The ALU can add/subtract the results of the 2×2 positive matrix and a 2×2 negative matrix to generate a single 2×2 matrix.

Figure 4B:
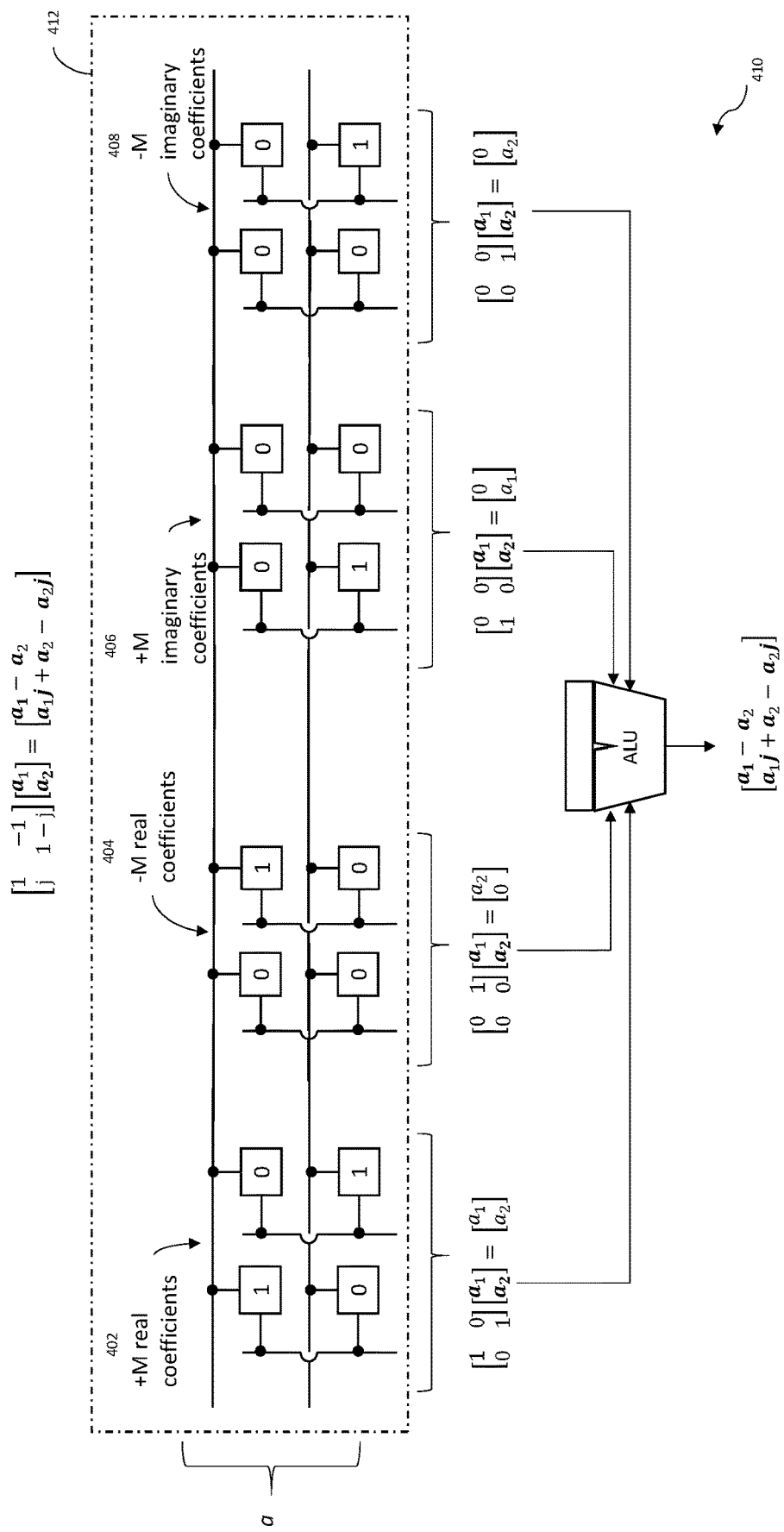
FIG. 4B is a graphical depiction of one embodiment of a matrix operation involving complex (real and imaginary) values, performed in accordance with the principles of the present disclosure.

Techniques similar to those described in FIG. 4A may be applied to matrices that include imaginary or complex numbers. For example, FIG. 4B illustrates one embodiment of a calculation 410 (described in EQN. 5 below), wherein a 2×2 matrix M is multiplied by a 2×1 vector a, and where matrix M can include numbers that are real, imaginary, complex, positive, and negative. In this example, vector a is assumed to only include real numbers.

$$Ma=c \qquad \text{EQN. 5:}$$

where a is a column vector of $[a_1; a_2]$; M is a matrix of $[[1, -1]; [j, 1-j]]$; and c is a column vector of $[a_1-a_2; a_2+(a_1-a_2)j]$.

The matrix multiplication operation 410 may be implemented for instance using a 2×8 memory fabric array, as shown in FIG. 4B, by decomposing matrix M into four separate matrices, represented in the memory array 412 as four 2×2 memory sub-arrays: (i) a first sub-array 402 is programmed with real positive values of M, (ii) a second sub-array 404 is programmed with real negative values of M, (iii) a third sub-array 406 is programmed with imaginary positive values of M, and (iv) a fourth sub-array 408 programmed with imaginary negative values of M. The analog values representing vector a can be used to drive the entire 2×8 memory fabric, and analog results of the four separate matrix-vector multiplication operations are obtained from the four separate respective sub-arrays 402, 404, 406, 408. Exemplary four matrix-vector multiplication operations are described below (EQNS. 6-9).

$$M_1 a = c_1 \qquad \text{EQN. 6:}$$

$$M_2 a = c_2 \qquad \text{EQN. 7:}$$

$$M_3 a = c_3 \qquad \text{EQN. 8:}$$

$$M_4 a = c_4 \qquad \text{EQN. 9:}$$

where $M_1$ is a matrix of $[[1, 0]; [0, 1]]$; $M_2$ is a matrix of $[[0, 1]; [0, 0]]$; $M_3$ is a matrix of $[[0, 0]; [1, 0]]$; $M_4$ is a matrix of $[[0, 0]; [0, 1]]$; $c_1$ is a column vector of $[a_1; a_2]$; $c_2$ is a column vector of $[a_2; 0]$; $c_3$ is a column vector of $[0; a_1]$; and $c_4$ is a column vector of $[0; a_2]$ Once analog results of EQNS. 6-9 are obtained from the four sub-arrays and converted from the analog to digital domain using an ADC (not shown in FIG. 4B), an arithmetic logic unit (ALU) can be used to appropriately combine the results (i.e. multiply the results of the two imaginary coefficient sub-arrays 406/408 by j and −j, respectively; and multiply the results of the real negative coefficient sub-arrays 404 by −1; and add everything together) in the digital domain to obtain the correct final result (see EQN. 10).

$$c_1 - c_2 + jc_3 - jc_4 = c \qquad \text{EQN. 10:}$$

Thus, similar to how two 2×2 memory sub-arrays can be used to represent a 2×2 matrix having real (positive and negative) values (as described with respect to FIG. 4A), four 2×2 memory sub-arrays can be used to represent a 2×2 matrix with real, imaginary, and complex (positive and negative) values. Note that the above matrix-vector multiplication operation, in the exemplary configuration of the apparatus, advantageously takes place in a single processing cycle.

Figure 4C:
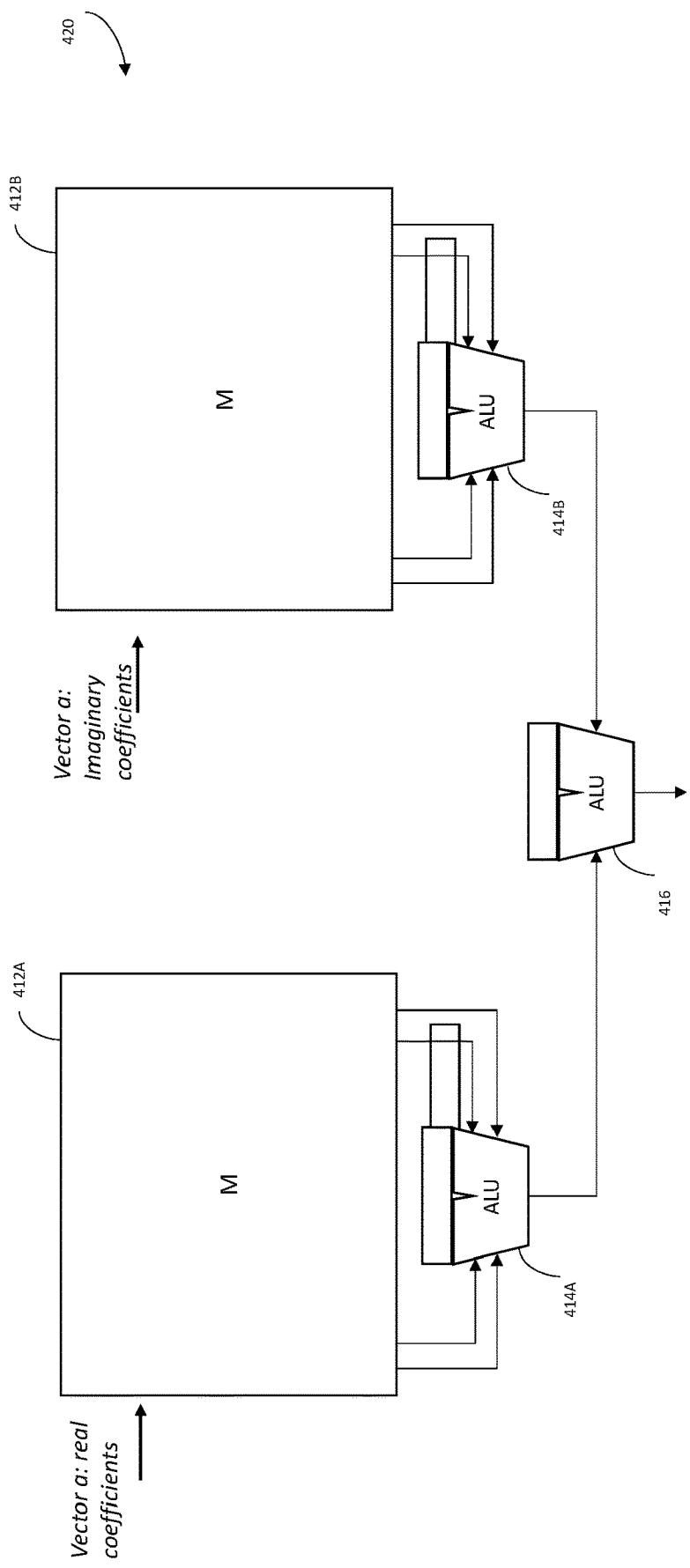
FIG. 4C is a graphical depiction of another embodiment of a matrix operation involving complex values, performed in accordance with the principles of the present disclosure.

In another embodiment, as shown in FIG. 4C, both the matrix M and the vector a in a matrix-vector multiplication operation 420 can have complex values. The operation 410 described with respect to FIG. 4B above can be applied separately to the real coefficients of vector a and the imaginary coefficients of vector a. The real coefficients of vector a are used to drive the memory array 412A, and the four results of the memory array 412A are digitally combined by an ALU 414A (in an operation such as that described with respect to FIG. 4B).

In a separate operation, imaginary coefficients of vector a are used to drive the memory matrix fabric array 412B, and the results are digitally combined by another ALU 414B. In the second operation involving memory array 412B, the ALU 414B first multiplies the results of the four sub-arrays (402,404,406,408 in FIG. 4B) by j, -j, 1, and -1, respectively. The results of the first and second ALUs can then be added together in another ALU 416 to obtain the final matrix↑ vector product.

It should be noted that, although the internal details of arrays 412A and 412B are not shown in FIG. 4C, the arrays 412A, 412B in one embodiment each include the four sub-arrays described with respect to memory array 412 of FIG. 4B. The first and second operations can advantageously be performed in parallel using first and second memory fabric units 412A, 412B. Alternately, in another exemplary embodiment, the first and second operations can be performed one after the other using a same memory fabric unit 412 (FIG. 4B). However, the ALU combining the results in one configuration applies different types of calculations to the results of the two operations (e.g., multiplying the four results by 1, -1, j, and -j for the first operation, and multiplying the four results by j, -j, 1, and -1 for the second operation).

As discussed above, memory fabric arrays combined with arithmetic logical units (ALUs) can be utilized to calculate matrix operations of various complexities or sizes, including support of massive-MIMO operations (which can be one or more orders of magnitude larger than corresponding traditional or non-massive spatial diversity calculations).

Moreover, artisans of ordinary skill in the related arts will readily appreciate the wide variety and/or capabilities enabled by ALUs. For example, ALUs may provide arithmetic operations (e.g., add, subtract, add with carry, subtract with borrow, negate, increment, decrement, pass through, etc.), bit-wise operations (e.g., AND, OR, XOR, complement), bit-shift operations (e.g., arithmetic shift, logical shift, rotate, rotate through carry, etc.) to enable e.g., multiple-precision arithmetic, complex number operations, and/or any extend MMU capabilities to any degree of precision, size, and/or complexity. As used herein, the terms "digital" and/or "logical" within the context of computation refers to processing logic that uses quantized values (e.g., "0" and "1") to represent symbolic values (e.g., "ON-state", "OFF-state"). In contrast, the term "analog" within the context of computation refers to processing logic that uses the continuously changeable aspects of physical signaling phenomena such as electrical, chemical, and/or mechanical quantities to perform a computation. Various embodiments of the present disclosure represent may represent analog input and/or output signals as a continuous electrical signal. For example, a voltage potential may have different possible values (e.g., any value between a minimum voltage (0V) and a maximum voltage (1.8V) etc.). Combining analog computing with digital components may be performed with digital-to-analog converters (DACs), analog-digital-converters (ADCs), arithmetic logic units (ALUs), and/or variable gam amplification/attenuation.

Referring back to FIG. 3, in order to configure the memory cells into the crossbar fabric (matrix fabric) 321 of the second configuration 350, each of the resistive elements may be written with a corresponding matrix coefficient value. Unlike the first configuration 300, the second configuration 350 may write varying degrees of impedance (representing a coefficient value) into each ReRAM cell using an amount of current having a polarity, magnitude, and duration selected to set a specific conductance. In other words, by forming/destroying conductive filaments of varying conductivity, a plurality of different conductivity states can be established. For example, applying a first magnitude may result in a first conductance, applying a second magnitude may result in a second conductance, applying the first magnitude for a longer duration may result in a third conductance, etc. Any permutation of the foregoing writing parameters may be substituted with equivalent success. More directly, rather than using two (2) resistance states (ON-state, OFF-state) to represent two (2) digital states (logic "1", logic "0"), the varying conductance can use a multiplicity of states (e.g., three (3), four (4), eight (8), etc.) to represent a continuous range of values and/or ranges of values (e.g., [0, 0.33, 0.66, I], [0, 0.25, 0.50, 0.75, 1], [0, 0.125, 0.250, . . . , 1], etc.).

In one embodiment of the present disclosure, the matrix coefficient values are stored ahead of time within a look-up-table (LUT) and configured by associated control logic 315. During an initial configuration phase, the matrix fabric 321 is written with matrix coefficient values from the LUT via control logic 315. Artisans of ordinary skill in the related arts will readily appreciate that certain memory technologies may also enable write-once-use-many operation. For example, even though forming (or destroying) a conductive filament for a ReRAM cell may require a specific duration, magnitude, polarity, and/or direction of current; subsequent usage of the memory cell can be repeated many times (so long as the conductive filament is not substantially formed nor destroyed over the usage lifetime). In other words, subsequent usages of the same matrix fabric 321 configuration can be used to defray initial configuration times.

Furthermore, certain memory technologies (such as ReRAM) are non-volatile. Thus, once matrix fabric circuitry is programmed, it may enter a low power state (or even powered off) to save power when not in use. In some cases, the non-volatility of the matrix fabric may be leveraged to further improve power consumption. Specifically, unlike existing techniques which may re-load matrix coefficient values from non-volatile memory for subsequent processing, the exemplary matrix fabric can store the matrix coefficient values even when the memory device is powered off On subsequent wake-up, the matrix fabric can be directly used.

In one exemplary embodiment, the matrix coefficient values may be derived according to the nature of the matrix operation. For example, the coefficients for certain matrix operations can be derived ahead of time based on the "size" (or other structurally defined parameter) and stored within the LUT. As but two such examples, the fast Fourier transform (EQN. 11) and the discrete cosine transform (DCT) (EQN. 12) are reproduced infra:

$$X[k] = x(0)e^{-j\ 2\pi k\ 0/N} + x(1)e^{-j\ 2\pi k\ 1/N} + \ldots + x(N-1)e^{-j\ 2\pi k(N-1)/N}$$

EQN. 11:

$$X[k]=x(0)\cos[\pi(0+½)k/N]+x(1)\cos[\pi(1+½)k/N]+\ldots+x(N-1)\cos[\pi((N-1)+½)k/N] \quad \text{EQN. 12:}$$

As can be mathematically determined from the foregoing equations, the matrix coefficient values (also referred to as the "twiddle factors") are determined according to the size of the transform. For example, the coefficients for an 8-point FFT are: $e^{-j\pi/4}$, $e^{-j\pi/2}$, $e^{-j\,3\pi/4}$, ..., etc. In other words, once the size of the FFT is known, the values for $2\pi k/N$ (where k is 0, 1, 2, 3 ..., 7) can be set a priori. In fact, the coefficients for larger FFTs include the coefficients for smaller FFTs. For example, a 64-point FFT has 64 coefficient values, which include all 32 coefficients used in a 32-point FFT, and all 16 coefficients for a 16-point FFT, etc. More directly, a single LUT may contain all the coefficients to support any number of different transforms.

In another exemplary embodiment, the matrix coefficient values may be stored ahead of time. For example, the coefficients for certain matrix multiplication operations may be known or otherwise defined by e.g., an application or user. For example, image processing computations, such as are described in co-owned and co-pending U.S. patent application Ser. No. 16/002,644 filed Jun. 7, 2018 and entitled "AN IMAGE PROCESSOR FORMED IN AN ARRAY OF MEMORY CELLS", previously incorporated supra, may define a variety of different matrix coefficient values so as to effect e.g., defect correction, color interpolation, white balance, color adjustment, gamma lightness, contrast adjustment, color conversion, down-sampling, and/or other image signal processing operations.

In another example, the coefficients for certain matrix multiplication operations may be determined or otherwise defined by e.g., user considerations, environmental considerations, other devices, and/or other network entities. For example, wireless devices often experience different multipath effects that can interfere with operation. Various embodiments of the present disclosure determine multipath effects and correct for them with matrix multiplication. In some cases, the wireless device may calculate each of the independent different channel effects based on degradation of known signaling. The differences between an expected and an actual reference channel signal can be used to determine the noise effects that it experienced (e.g., attenuation over specific frequency ranges, reflections, scattering, and/or other noise effects).

In other embodiments, a wireless device may be instructed to use a predetermined "codebook" of beamforming/precoding configurations. The codebook of beamforming/precoding coefficients may be less accurate but may be preferable for other reasons (e.g., speed, simplicity, etc.).

As previously discussed, diversity technology (commonly implemented as Multiple input/multiple output (MIMO) or MU-MIMO systems) uses e.g., multiple transmitting and multiple receiving antennas to communicate data associated with the same radio channel (and in the case of MU-MIMO, for multiple users). Multiple antenna systems can improve the reliability and gain of a signal by sending the same signal/symbol over several diverse channel streams (signal diversity) at the same time, thus making sure that the signal is properly communicated. In addition, MIMO systems can send different portions of a signal (e.g., consecutive symbols of one data stream), or different signals, through several different channel streams at the same time (via spatial multiplexing), thus increasing the rate of data communication. Demand for high data rates and good channel quality has made MIMO essential to current broadband wireless communication.

Massive or very large MIMO systems make use of very large numbers of antennas (e.g., hundreds or even thousands) that all need to be coordinated in order to obtain the best possible channel qualities and throughputs.

Traditional (MIMO and MU-MIMO) and massive MIMO systems require various matrix multiplication operations using matrices with dimensions on the order of the numbers of receiving and transmitting antennas. Because massive MIMO systems use such large numbers of antennas (and are thus represented by large matrixes) they are particularly susceptible to the "processor-memory wall" performance limitations previously described herein.

Discussed below are examples of some of the matrix operations that may be performed within a working MIMO system, and memory fabric arrays that may be implemented to perform these operations, according to the present disclosure. It will be recognized by those of ordinary skill given this disclosure, however, that the following examples are in no way to be considered limiting, as the principles, apparatus and methods of the disclosure may be extended to yet other types of operations (matrix or otherwise) and applications.

As a brief aside, a channel in an exemplary MIMO system with N transmitting antennas and M receiving antennas can be expressed as an M×N channel matrix H, with M rows representing receiving antennas, N columns representing transmitting antennas, and individual H coefficients $h_{ij}$ representing individual wireless channel paths. The channel characteristics can be estimated at the receiver by, for example, transmitting known training/pilot signals from each of the transmitters, noting the signal received by each of the receivers, and then calculating all channel paths according to the known and received signals.

The transmitter can be a user device (e.g., a cell phone), a wireless network base station (e.g., eNB or gNB or femtocell/HNB, or Wi-Fi AP), a wireless node, or any other device making use of multiple transmitting antennas to transmit a signal. The receiver can similarly be a user device, a network base station, or any device using of multiple receiving antennas to receive signals. It will be appreciated that while described in terms of an M×N channel matrix of multiple transmit and receive antenna elements, the exemplary embodiments described herein may be readily extended to other applications, such as where multiple transmit antenna elements (N) are utilized with a single receive antenna on e.g., a user device or UE (including cases where multiple user devices are served—see discussion in FIG. 5E infra), and multiple individual transmitters are used in conjunction with a single receiver having multiple (M) receive antenna elements.

At a single point in time, a MIMO system may be characterized as: b=Ha (disregarding noise), where the transmitted signals are represented by vector a, the received signals are represented by vector b, and the channel is represented by matrix H. In order to successfully communicate data within the MIMO system, the receiver needs to be able to use the received signal b to derive the transmitted signals a (or data being communicated by the signal under consideration). In certain limited cases, this can be accomplished by simply inverting channel matrix H to obtain $H^{-1}$, and simply multiplying the received vector by $H^{-1}$. In other embodiments, a precoding matrix, based on the channel matrix, is applied to data at the transmitter in order to obtain appropriate transmission signals. The receiver can then perform a decoding or data estimation/recovery matrix operation to obtain/estimate the original transmitted data.

Figure 5A:
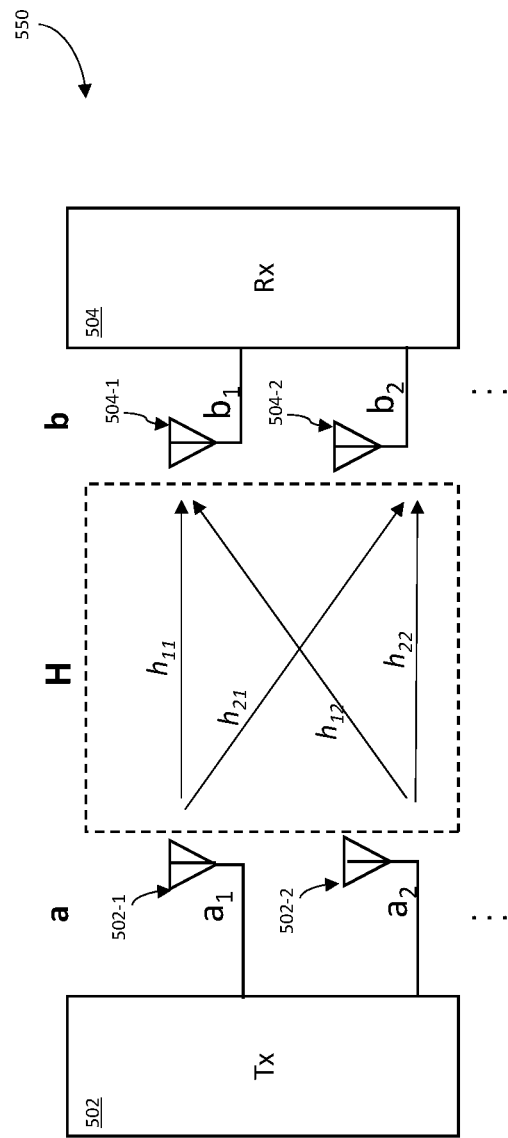
FIG. 5A is a graphical depiction of an exemplary 2×2 MIMO system which may utilize the methods and apparatus of the present disclosure.

FIG. 5A illustrates one embodiment of a system 550 having a transmitter 502 with two antennas 502-1, 502-2 in communication with a receiver 504 with two receiving antennas 504-1, 504-2. The transmitter sends data in the form of transmit vector a=(a1, a2) using its two antennas, as shown in FIG. 5A. Signals from the two antennas travel though a channel represented by matrix H, and are received by two receiver antennas 504-1, 504-2 as symbols b1 and b2, representing values of a size-2 receive vector b. The four different paths that the signals take are represented by the four coefficients of matrix H. The received vector equation (b=H a) for system 550 is shown below (EQN. 13).

$$b=Ha \qquad \text{EQN. 13:}$$

where H is a matrix of $[[h_{11}, h_{12}]; [h_{21}, h_{22}]]$; a is a column vector of $[a_1; a_2]$; and b is a column vector of $[b_1; b_2]$.

In order for the receiver to obtain the data being communicated, the received vector equation may be inverted, and the transmit vector a may be calculated using a matrix-vector multiplication operation (EQN. 14). This matrix operation can be performed at the receiver using, for example, the memory matrix fabric apparatus and techniques described above.

$$a=H^{-1}b \qquad \text{EQN. 14:}$$

Figure 5B:
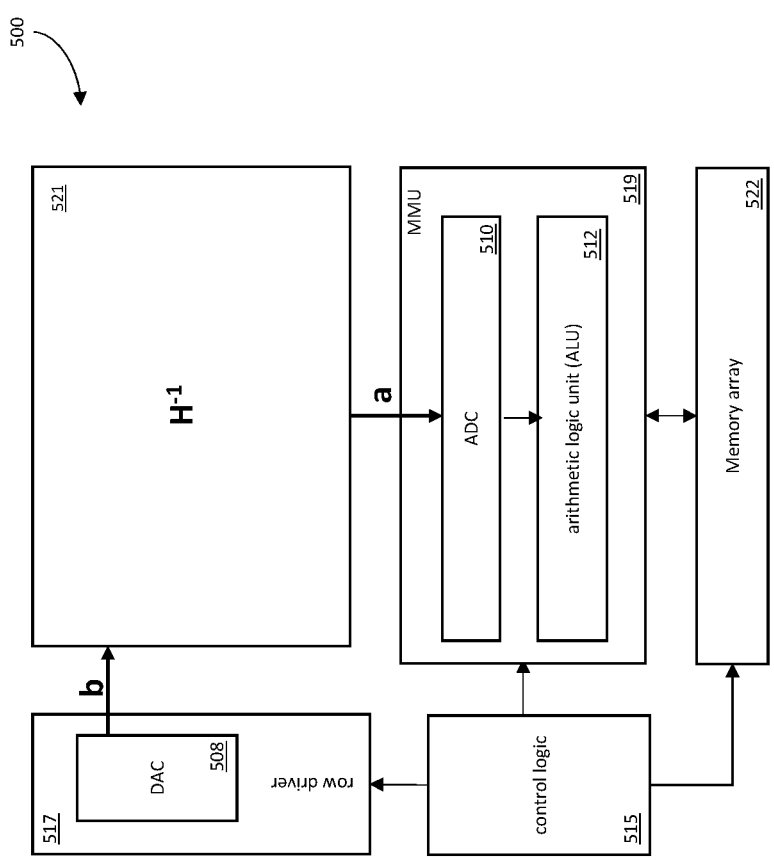
FIG. 5B is a block diagram of a memory device configured to perform a matrix operation for the system of FIG. 5A, according to aspects of the present disclosure.
Figure 5C:
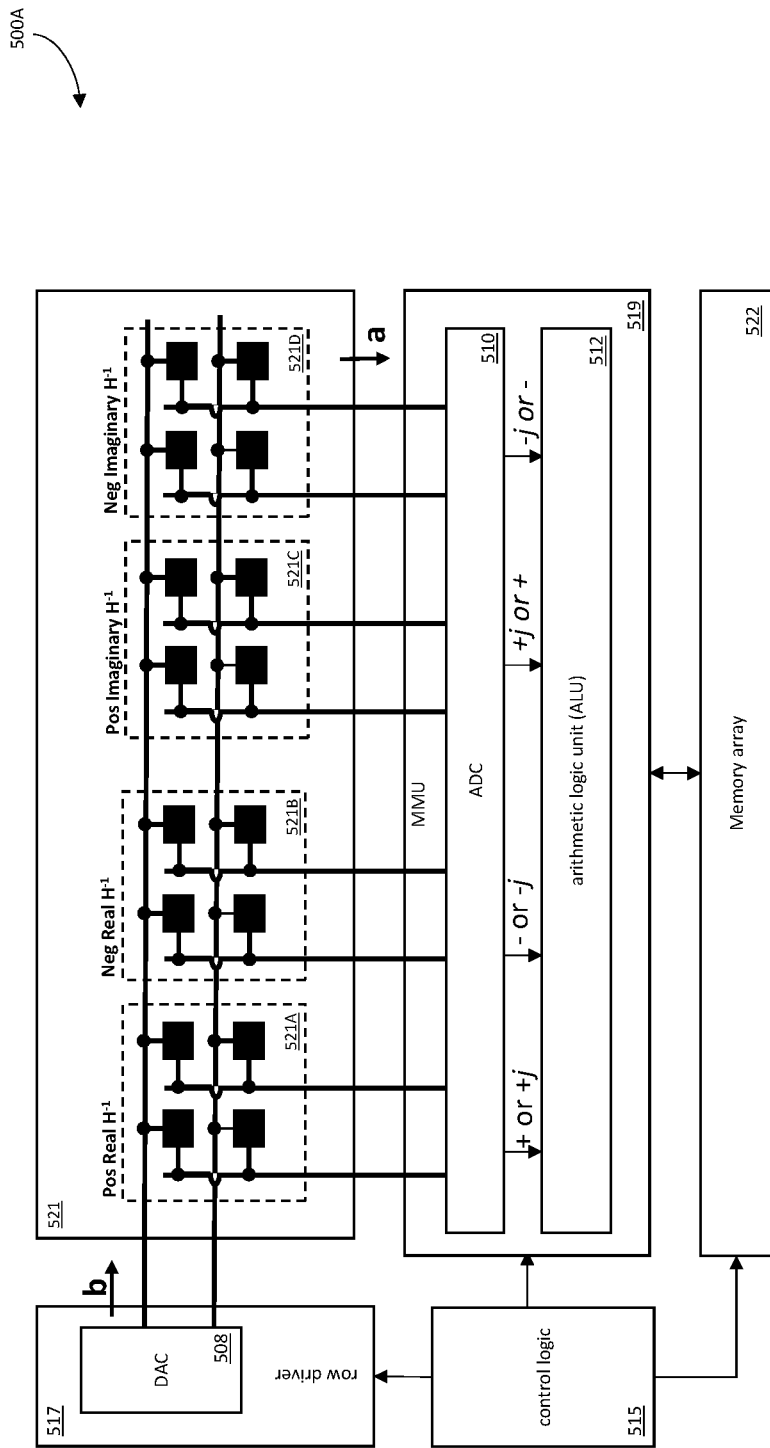
FIG. 5C is a block diagram of a first implementation of the memory device of FIG. 5B, according to aspects of the present disclosure.
Figure 5D:
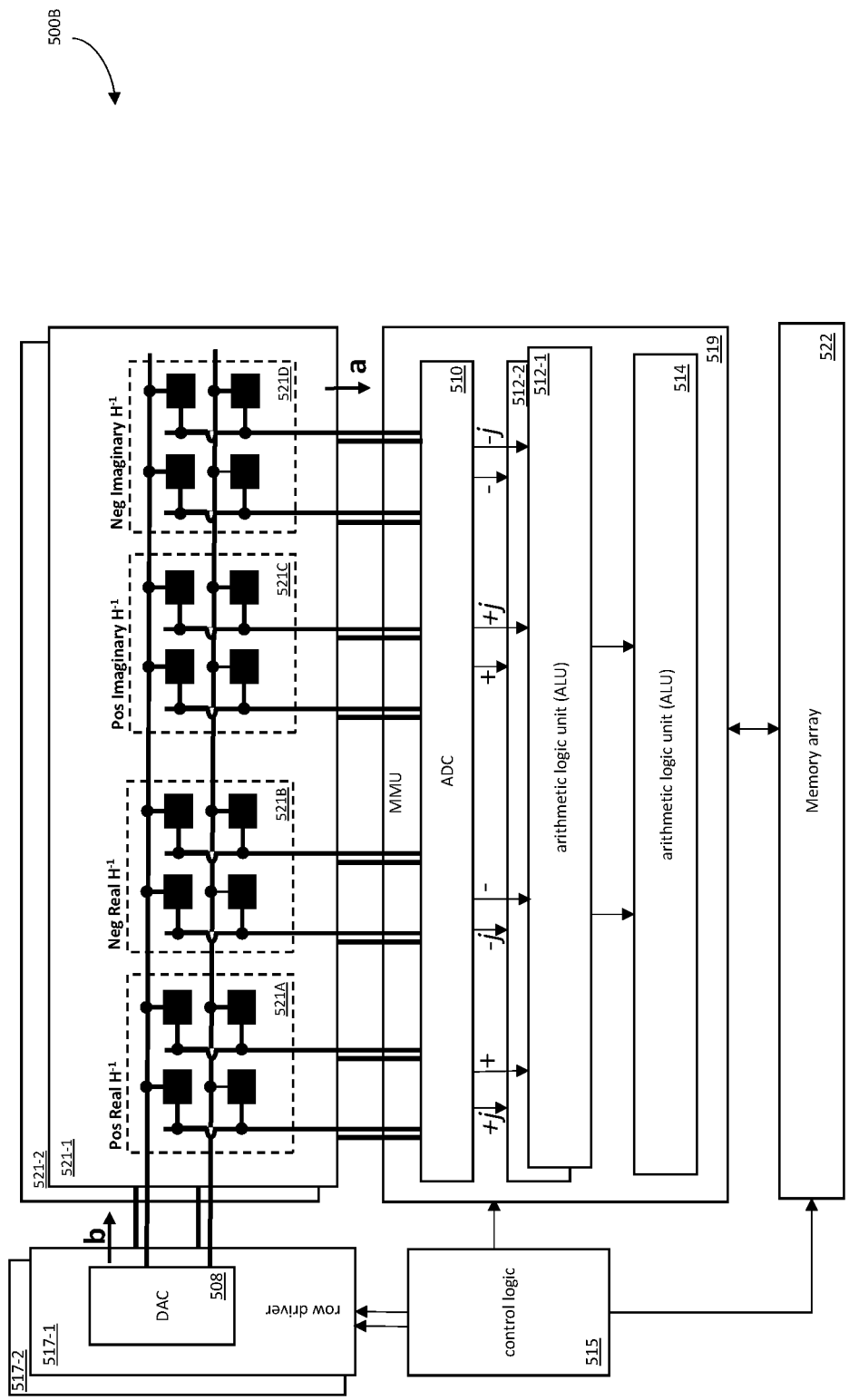
FIG. 5D is a block diagram of a second exemplary implementation of the memory device of FIG. 5B, according to aspects of the present disclosure.

FIGS. 5B-5D illustrate exemplary embodiments of a matrix fabric and MMU circuitry 500 which may be used to perform a matrix operation of EQN. 14 on a received vector b in order to obtain transmitted vector a. The matrix fabric 521 of FIG. 5B is described in more detail in the descriptions of FIGS. 5C and 5D below.

In the memory system 500, the matrix fabric 521 is programmed using control logic 515 with the values of the $H^{-1}$ matrix. Note that the receiver may in some cases be configured to determine the values of the channel matrix H using training signals, as described above, and then calculate the inverse of matrix H using known mathematical techniques. Once the inverse matrix $H^{-1}$ is calculated, it may be stored in a look-up-table (LUT) within a memory array 522, which can be accessed by the control logic 515.

As shown in FIG. 5B, the matrix operation of EQN. 14 is performed by using vector b to drive the memory fabric 521 of the system 500. That is, individual values of vector b are converted into analog voltages/currents by the DAC 508, which are then input to individual rows (lines) of the $H^{-1}$ programmed memory matrix fabric 521.

The results of the memory fabric 521 are then output as analog voltages or currents into the MMU 519, which converts the results into digital values via the ADC 510 thereof. The digital values are then used by the arithmetic logic unit (ALU) 512 of the MMU to obtain the entire value of the vector a.

FIGS. 5C and 5D illustrate details of two particular implementations 500A, 500B of the memory device 500 shown in FIG. 5B. In some configurations, a 2×2 $H^{-1}$ matrix having complex values may be represented within the memory matrix fabric 521 as a 2×8 memory array having four 2×2 memory sub arrays 521A, 521B, 521C, 521D, each representing a different aspect of the matrix (as described earlier with respect to FIG. 4B).

FIG. 5C illustrates a system 500A wherein a single 2×8 memory array within the matrix fabric 521 is driven by two inputs (representing the two values of vector b). In order to accommodate potentially complex values of vector b, the matrix fabric 521 in FIG. 5C is in one approach driven consecutively (i) first by the real values of vector b and (ii) then by the imaginary values of vector b. The first results are temporarily stored in the memory array 522 and then properly combined with the second results using the ALU 519. The ALU 519 treats results of the memory fabric 521 differently, depending on whether it was driven by the real or imaginary values of vector b (i.e., multiplies the results from sub-matrix 521A by either 1 or j). This is accomplished by e.g., the control logic 515 reconfiguring the MMU between passes or runs in order for the ALU 519 to have the appropriate logic.

FIG. 5D illustrates another embodiment of the system 500B, wherein the memory fabric 521 includes two identical 2×8 memory fabric arrays 521-1 and 521-2. The first 2×8 memory array 521-1 is driven by the real values of vector b while, in parallel, the second 2×8 memory array 521-2 is driven by the imaginary values of vector b. In the embodiment of FIG. 5D, the two parallel memory fabric portions 521-1, 521-2 each have their own row drivers. The control logic 515 (i) inputs the real values of vector b into the first row driver, and (ii) inputs the imaginary values of vector b into the second row driver. After the two portions of the memory fabric 521 have been driven by the values of vector b, the results of both memory arrays can be appropriately combined within a single MMU 519.

The embodiment of FIG. 5D includes an MMU 519 with one ADC 510 and three ALUs 512-1, 512-2, 514, although this configuration is merely illustrative and not limiting.

After the analog signals received from memory arrays 521-1 and 521-2 are converted into digital values by the ADC 510, the four digital values corresponding to results of the first memory array 521-1 are input to the first ALU 512-1, and the four digital values corresponding to the results of the second memory array 521-2 are input to the second ALU 512-2. The two ALUs separately combine their inputted values, and transfer their results into the third ALU 514, which performs a simple addition operation. Note that, as explained with respect to FIG. 4C, the first and second ALUs 512-1, 512-2 may be programmed with slightly different logic (e.g., the results of the two left sub-arrays of the first memory array 521-1 are designated as real by the first ALU 512-1, but the results of the two left sub-arrays of the second memory array 521-2 are designated as imaginary by the second ALU 512-2).

In another exemplary embodiment, the MMU 519 can have a single ALU that takes all eight results of the two memory fabric arrays 521-1, 521-2 and appropriately combines them. In other words, the logic of the three ALUs described above can be combined within a single unit.

In yet another embodiment, the MMU 519 can be replaced with two separate MMUs. That is, the two memory arrays 521-1 output results into respective MMUs, each with an ADC and an ALU. The results of two different MMUs can be combined in a third ALU that is external to any MMU.

Figure 6A:
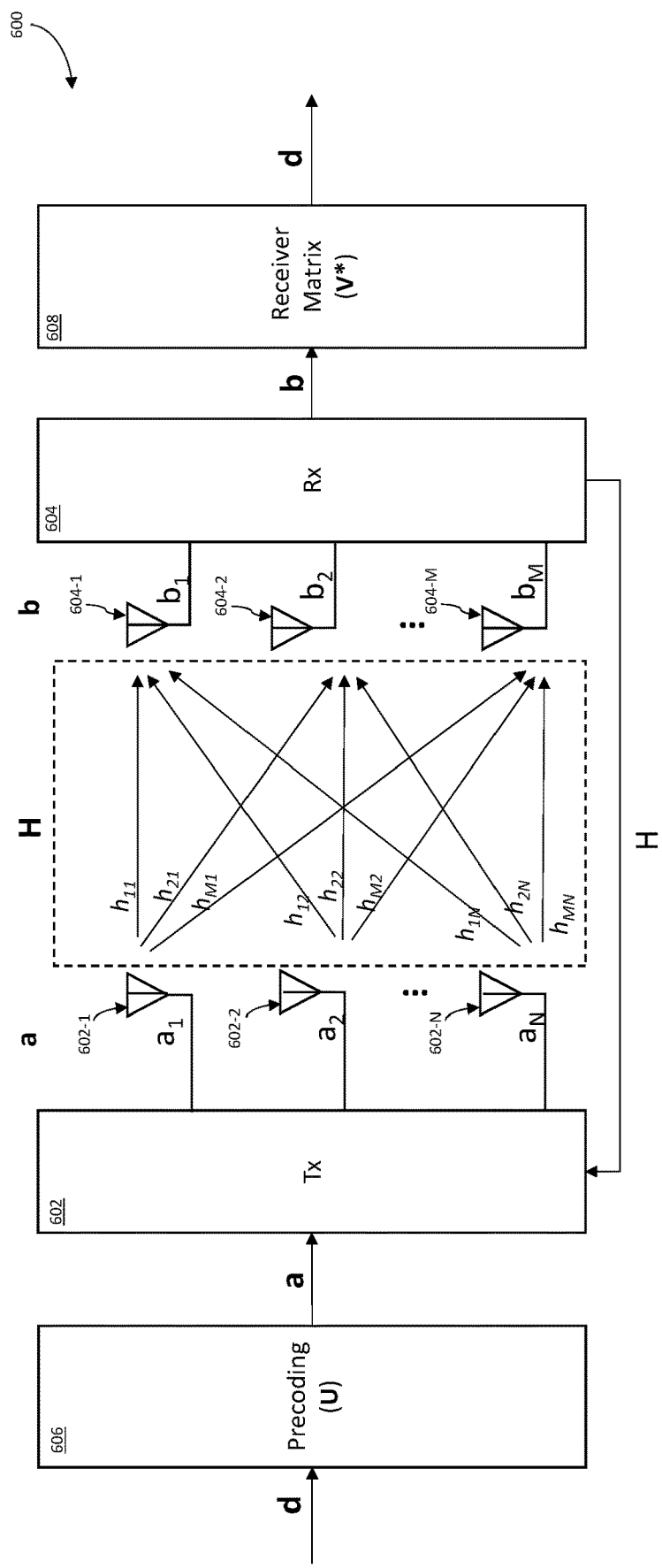
FIG. 6A is a graphical depiction of a MIMO system in which channel (precoding) information is communicated to the transmitter, and the receiver utilizes channel decoding.

FIG. 6A illustrates one exemplary system 600 having such greater degree of complexity. As shown, the system 600 includes a transmitter 602 with N antennas (602-1 to 602-N), and a receiver with M antennas (604-1 to 604-M), where N is not necessarily equal to M. The receiver 604 uses training signals to estimate a channel matrix H. In massive MIMO (see e.g., FIG. 6D), the numbers of transmitter and receiver antennas (N and M) may be in the hundreds or thousands (including distribution across multiple discrete devices 606-1 ... 606-n), and accordingly the channel matrix H may have similarly large dimensions.

In the case wherein matrix H is non-invertible and large, it can be decomposed using singular value decomposition (SYD), using methods well known in the art, and re-written as: $H=U\Sigma V^*$, where U and $V^*$ are left-hand and right-hand unitary matrices of H, respectively, and Σ is a diagonal matrix of singular values of H.

The received signals vector b (disregarding noise) can be written as: b=H a=UΣV* a. The data to be transmitted d (matrix of data symbols) can be transformed into transmitted signals a using EQN. 15 (this can be considered a type of precoding).

$$a = Ud \qquad \text{EQN. 15:}$$

At the receiver, the data can be decoded/recovered (estimated) from the received signals b using EQN. 16. In the embodiment of FIG. 6A, after calculating the channel matrix, the receiver transmits channel information to the transmitter. The transmitter 602 may use the received channel information to perform a precoding operation 606 (EQN. 15) to transform data d into transmit vectors a. The individual values of each vector a are transmitted simultaneously using individual transmit antennas (602-1 to 602-N). The receiver 604 obtains received vectors b, and uses a receiver operation 608 to estimate the original data (EQN. 16).

$$d = V^* b \qquad \text{EQN. 16:}$$

Figure 6C:
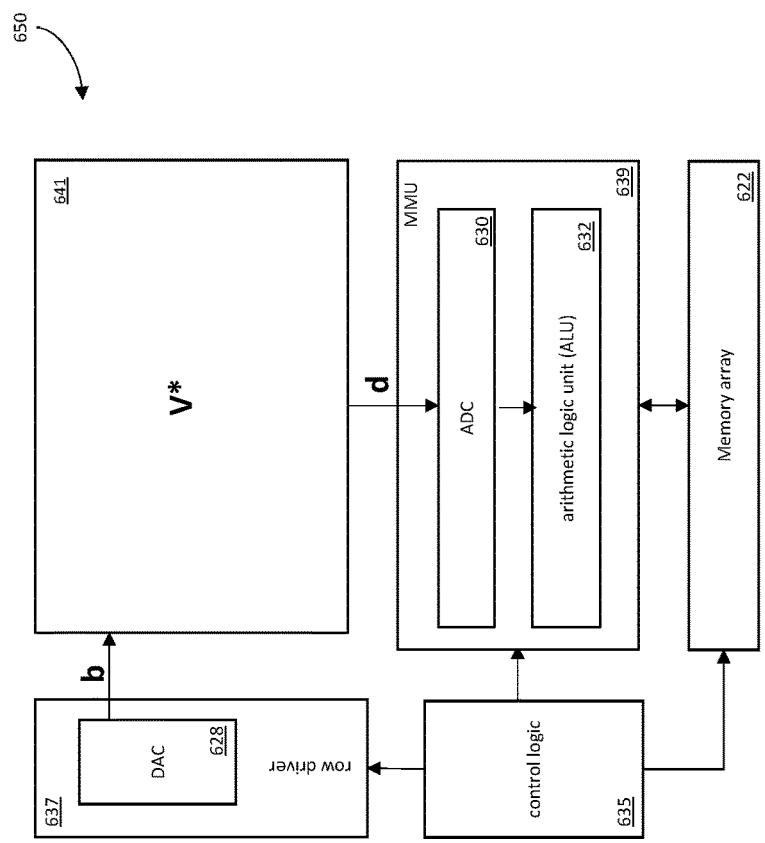
FIG. 6C is a block diagram of a memory device configured to perform a receiver matrix operation for the system of FIG. 6A, according to aspects of the present disclosure.
Figure 6B:
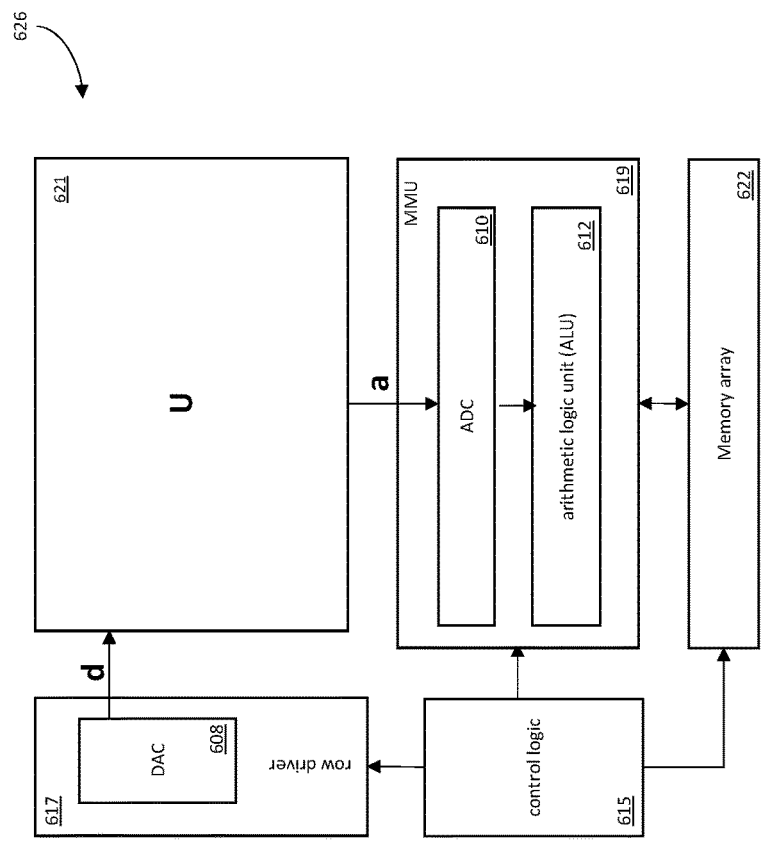
FIG. 6B is a block diagram of a memory device configured to perform a transmitter matrix precoding operation for the system of FIG. 6A, according to aspects of the present disclosure.

FIG. 6B illustrates an embodiment of memory matrix fabric system and MMU circuitry 626 which may be used at the transmitter to perform the precoding matrix operation of EQN. 15 as described with respect to FIG. 6A. In one configuration thereof, control logic 615 obtains a precoding matrix U, and programs the matrix memory fabric 621 using the values of matrix U. A memory array (not shown), composed of individual sub-arrays, within the matrix fabric 621 may be programmed with the positive real, negative real, positive imaginary, and negative imaginary coefficients of matrix U (using a technique similar to that of FIG. 5C). In one implementation, the matrix fabric 621 may include two memory arrays identically programmed with values of matrix U, each being able to be driven in parallel with each other (similar to the configuration of FIG. 5D). The values of the precoding matrix U are obtained, as needed, such as from a data source outside the transmitter memory system 626.

As shown in FIG. 6B, individual vectors d representing data to be communicated (e.g., in-phase and quadrature samples) are obtained from and fed into the row driver by the control logic 615. Although vectors d are not permanently stored inside the memory system 626 (since the data always changes), a buffer of the data may be stored inside the memory array 622 in order to avoid frequent use of the memory-processor interface (which can have significant penalties in terms of e.g., access latency).

In one embodiment, the control logic 615 feeds the real values of each vector d into the row driver 617, followed by the imaginary values of the vector (similar to the structure of FIG. 5C). In another embodiment, the row driver 617 includes two row drivers connected to respective memory arrays of the memory fabric 621, and the control logic feeds the real values of each vector d in the first row driver and the imaginary values of the vector into the second row driver (similar to the structure of FIG. 5D).

The row driver 617 (or drivers) uses a DAC 608 to convert individual digital values of vector d into analog input signals. These converted analog input signals are then used to concurrently drive all row terminals of the matrix fabric 621 that correspond to memory cells programmed with values of matrix U. The matrix fabric results are output to the MMU 619, which converts the results into digital values via the ADC 610 thereof. The digital values are then used by the arithmetic logic unit (ALU) 612 of the MMU to obtain individual values of output vector a.

FIG. 6C illustrates an embodiment of memory matrix fabric system and MMU circuitry 650 which may be used at the receiver to perform the receive matrix operation (data decode/estimation) of EQN. 16 as described with respect to FIG. 6A. The control logic 635 in this system 650 obtains the receive matrix V*, and uses its values to program memory fabric 641. The control logic 635 then uses the row driver 637 (or two row drivers) to convert the real and imaginary values of the receive data vector b to analog signals, and propagate those signals through the programmed matrix fabric 641. The matrix fabric outputs analog results corresponding to portions of the data vector d into the MMU 639, which uses its ADC 630 and ALU 632 to convert and appropriately combine the signals in order to finally obtain values of vector d. Note that this vector d calculated at the receiver is an estimate of the original data, and not an exact copy. Nevertheless, the memory system 650 uses values of individual received signals (vectors b) to determine the data being communicated by the transmitter in a limited number (of processing cycles). Thus, once the memory fabric 641 has been programmed, communicated data can be very quickly decoded or recovered from a rapid stream of received signals.

The implementation details of the memory device structures described in FIGS. 6B and 6C may be similar to structures described above with respect to FIG. 5C or 5D.

FIGS. 6A-6C illustrate a MIMO system in which outgoing signals may be precoded using precoding matrixes U derived from a known channel matrix H. However, since the channel matrix H is calculated at the receiver, this requires the full matrix H to be communicated from the receiver to the transmitter. The transmission of the matrix H may lead to very large overhead. To avoid this overhead, modem wireless communication systems use codebooks of pre-defined precoding matrixes W, which may be calculated in advance for many different antenna configurations and easily accessible to (e.g., stored at) all transmitting and receiving units within a telecommunication network.

Figure 6D:
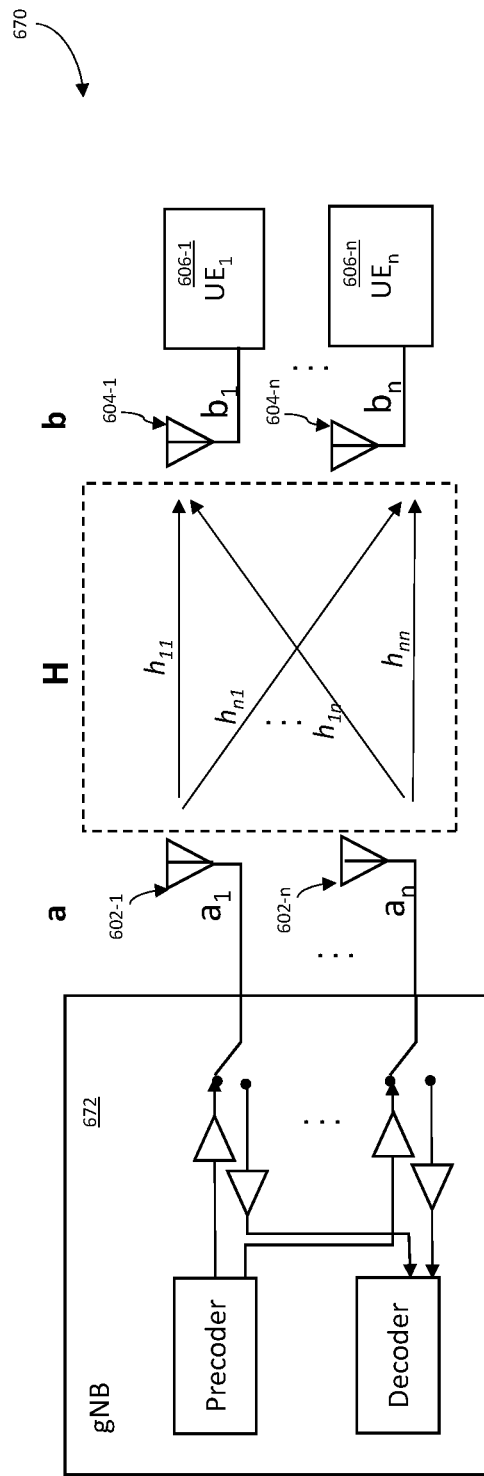
FIG. 6D is a graphical depiction of an exemplary 5G NR MIMO system which may utilize the methods and apparatus of the present disclosure.

FIG. 6D illustrates another system 670 with which the methods and apparatus of the disclosure (including those of FIGS. 6A-6C) may be utilized, wherein a 5G NR gNB (e.g., DU portion) 672 utilizes multiple transmit antenna elements 602-1 through 602-n, and transmits signals to multiple receivers 606-1-606-n (UE1 through UEn). In such cases, the channel matrices may become very large (including on a scale of massive-MIMO (mMIMO) as previously described). For instance, in many mmWave and sub-6 GHz applications (64 antenna elements supported in 3GPP Release 15 for example), mMIMO is playing an increasingly important role in supporting high-throughput, low latency communications, and as the number of antenna elements supported expands, the channel matrices will become larger accordingly. As such, the value of "n" in FIG. 6D may be into the hundreds, and moreover such n antenna elements may even feasibly be distributed across multiple different devices such as e.g., multiple gNB DUs working collectively.

Figure 7A:
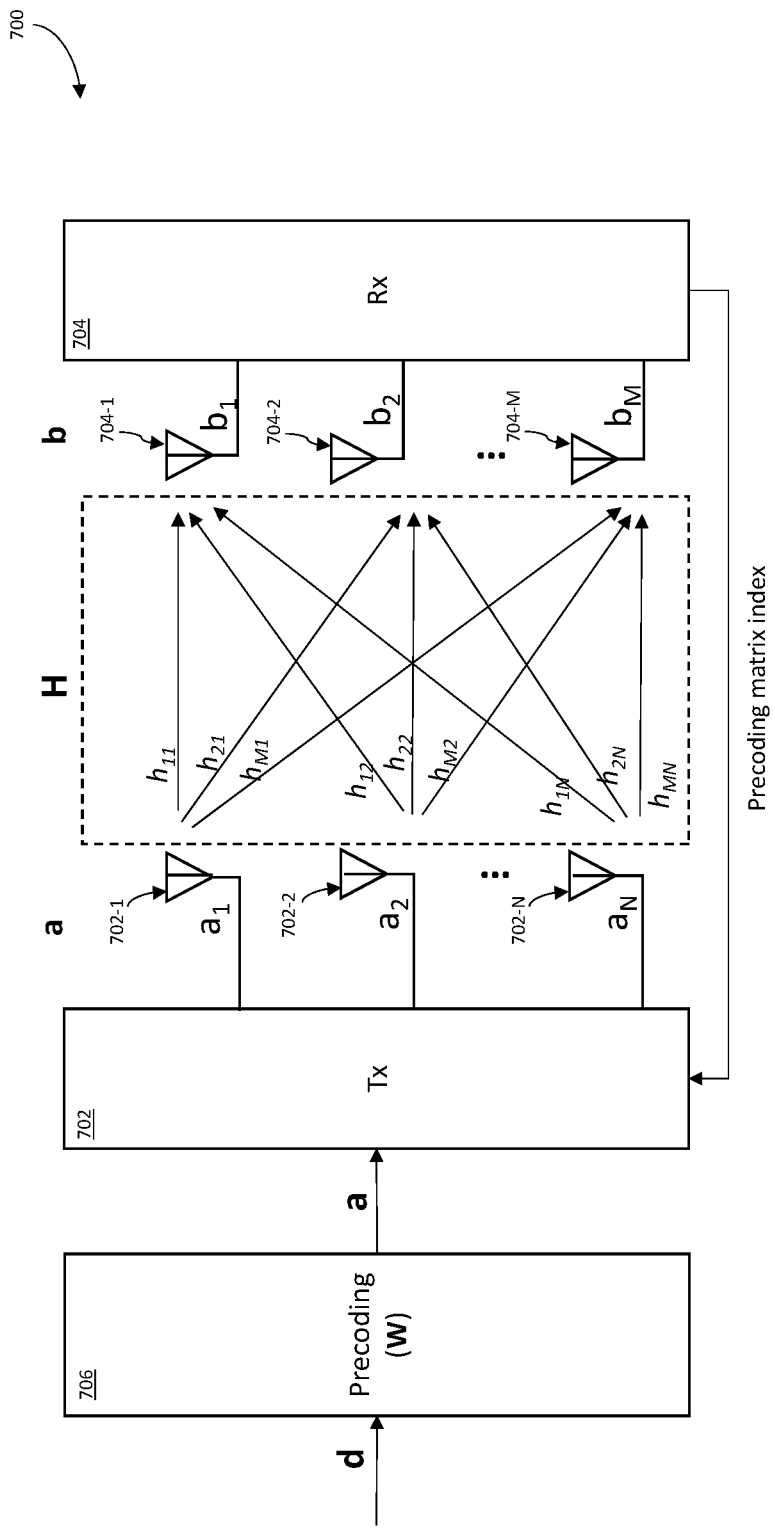
FIG. 7A is a graphical depiction of a MIMO system using a codebook of predefined matrixes.

FIG. 7A illustrates another embodiment of a MIMO system 700 (generally similar to the system 600 of FIG. 6A), having a transmitter 702 with N antennas (702-1 to 702-N) and a receiver with M antennas (704-1 to 704-M), where N is not necessarily equal to M. However, the receiver in the system 700 does not send the calculated channel matrix H to the transmitter 702. Instead, based on the calculated channel matrix H, the receiver selects a precoding matrix W from a codebook, and sends the index corresponding to that precoding matrix within a codebook to the transmitter. Instead of using precoding matrix U, the transmitter uses the precoding matrix W to transform data symbols d into transmit signals corresponding to vectors a (EQN. 17 below). The remainder of the operation of the system is generally analogous to that of the system 600 described in FIG. 6A.

$$a = Wd \qquad \text{EQN. 17:}$$

Figure 7B:
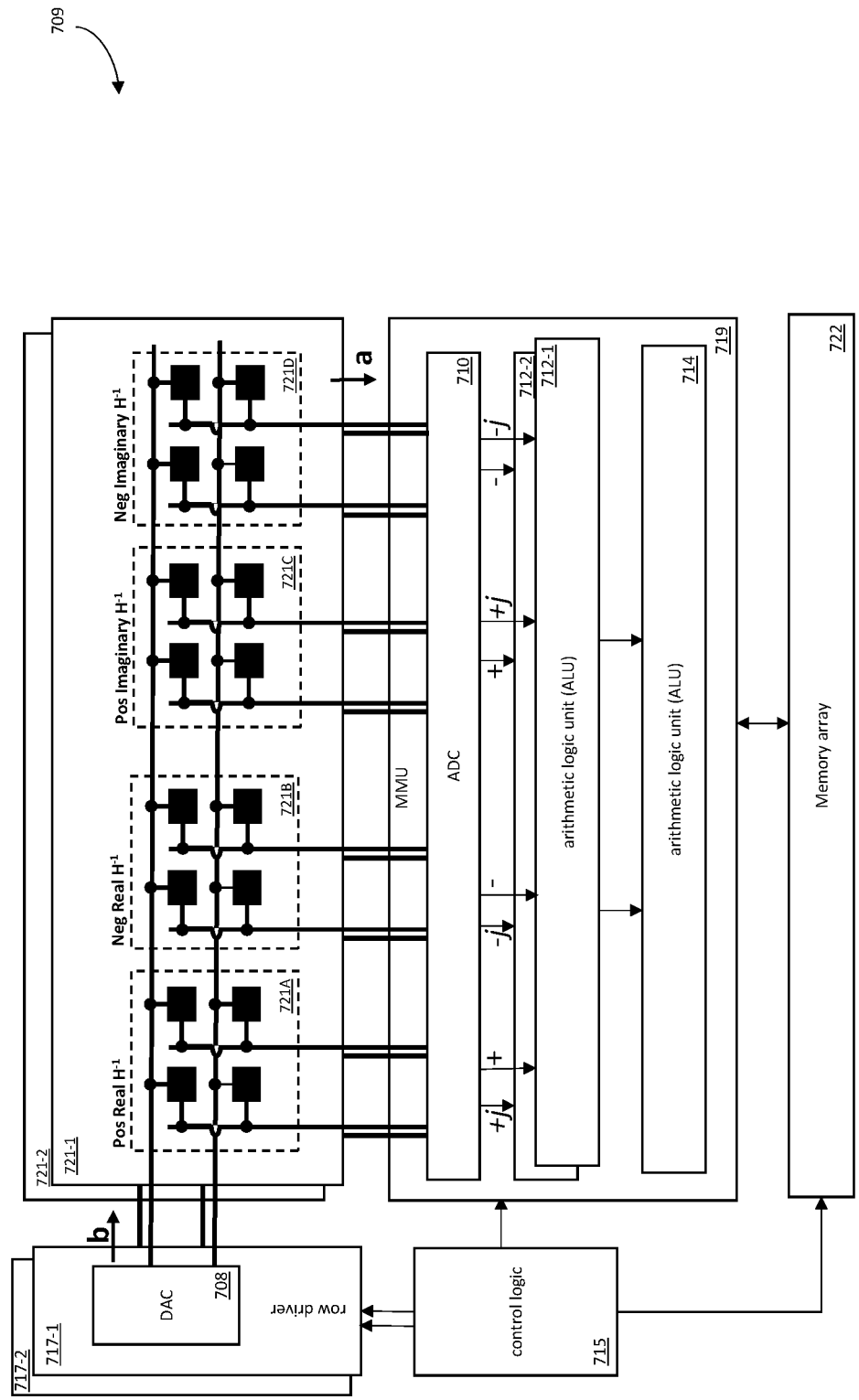
FIG. 7B is a block diagram of a memory device configured to perform a transmitter matrix precoding operation for the system of FIG. 6A, according to aspects of the present disclosure.

FIG. 7B illustrates an embodiment of memory fabric system and MMU circuitry 709 which may be used at the transmitter to perform the precoding matrix operation of EQN. 17.

In the embodiment of FIG. 7B, the control logic 715 obtains the precoding matrix W and uses the values of matrix W to program the matrix memory fabric 721 (including two identical memory arrays 721-1,721-2, each having four memory sub-arrays 721A, 721B, 721C, 721D). In one embodiment, the values of the precoding matrix W may be input to the memory system 709 from an external source, as needed. In another embodiment, a codebook of different precoding matrixes is located inside a look-up-table (LUT) of the memory system 709 (e.g., in the memory array 722). In the latter case, the control logic 715 can receive the index or address of the particular precoding matrix W from a processor, and extract the values of the precoding matrix W from the memory array 722.

After the memory fabric 721 has been programmed with the values of precoding matrix W, the control logic 715 inputs the real and imaginary coefficients of the vector(s) d into first and second row drivers 717-1,717-2, respectively. The row drivers utilize their DACs 708 to convert their given values into analog signals, and use the analog signals to drive input terminals of their corresponding memory fabric arrays 721-1,721-2. The memory fabrics 721-1,721-2 output results in the form of analog signals to the MMU 719. In another variant, the memory fabric arrays 721-1,721-2 output results into their own respective MMUs.

The MMU 719 transforms the analog signals into the digital domain via the ADC 710, and combines the digital values using ALUs 712-1,712-2,714 to obtain the values of the vectors a.

In another variant, the MMU 719 has a single ALU that performs the combination. Note that memory system 709 has a structure similar to that described with respect to FIG. 5D. However, a memory structure described in FIG. 5D or variations thereof can similarly be applied to the precoding of data signals using a precoding matrix W.

FIGS. 5A through 7B illustrate only some of the matrix-related operations that may be performed within communication systems that employ diversity (e.g., MIMO, MU-MIMO, mMIMO) technology. Additional matrix multiplication operations may be needed to perform additional/more complicated precoding, beamforming, or beam steering, such as to account for noise, to select the precoding matrix, to perform SYD, to optimize targeted energy delivery (such as in mmWave antennae which may be spatially small in size as compared to their sub-6 GHz counterparts), etc. All such matrix operations can potentially be performed using the memory fabric technology of the present disclosure.

However, it will also be recognized that the ability to perform matrix operations using only one or a few atomic operations, regardless of the size of the matrix or matrices involved (e.g., even with operations that do not scale exponentially with matrix size), can be particularly useful for technologies that implement massive MIMO, which can potentially include very large numbers of receive and/or transmit antennas (and thus produce matrixes with very large dimensions, with the benefits of the atomic operations being advantageously multiplied accordingly). As previously alluded to, in some embodiments the matrix coefficient values can be stored ahead of time within a look-up-table (LUT) and configured by associated control logic. In one exemplary embodiment, the matrix fabric may be configured via dedicated hardware logic. While the present disclosure is presented in the context of internal control logic, external implementations may be substituted with equivalent success. For example, in other embodiments, the logic includes internal processor-in-memory (PIM) that can set the matrix coefficient values based on LUT values in a series of reads and writes. In still other examples, for example, an external processor can perform the LUT and/or logic functionality.

Figure 8A:
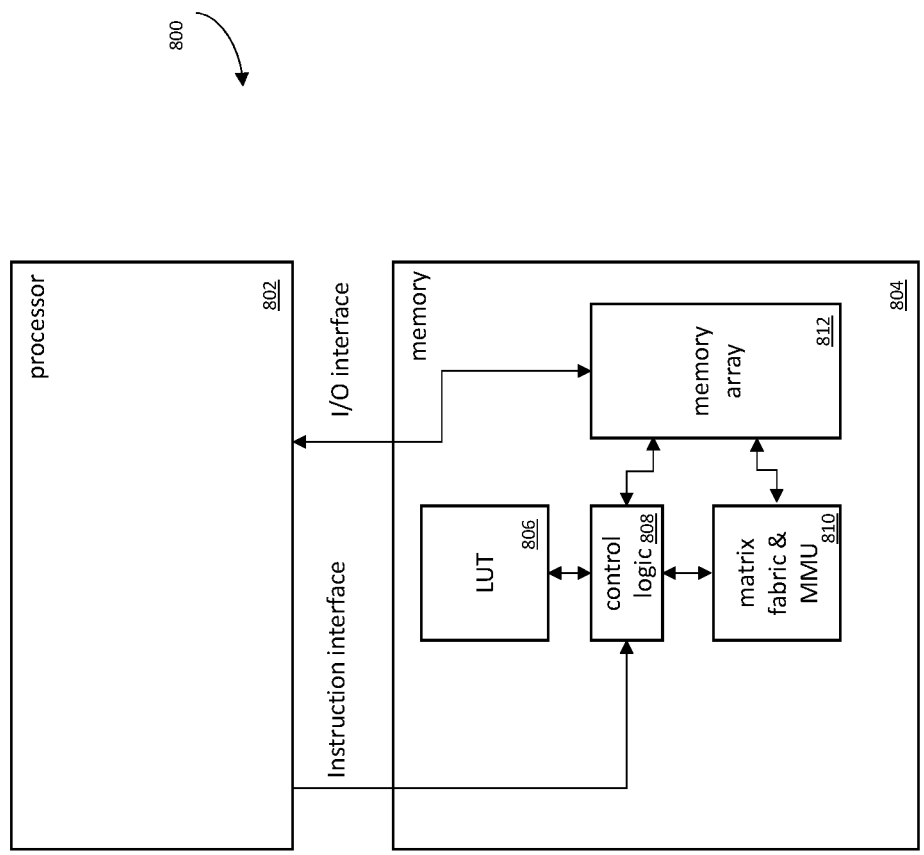
FIG. 8A is a logical block diagram of one exemplary implementation of processor memory architecture.

FIG. 8A is a logical block diagram of one exemplary implementation of a processor↑ memory architecture 800 in accordance with the various principles described herein. As shown in FIG. 8A, a processor 802 is coupled to a memory 804; the memory includes a look-up-table (LUT) 806, a control logic 808, a matrix fabric and corresponding matrix multiplication unit (MMU) 810, and a memory array 812.

In one embodiment, the LUT 806 stores a plurality of matrix value coefficients, dimensions, and/or other parameters, associated with different matrix operations. In one exemplary embodiment, precoding matrix coefficients. The LUT 806 may include various channel matrix (or precoding matrix) codebooks that may be predefined and/or empirically determined based on radio channel measurements.

In one embodiment, the control logic 808 controls operation of the matrix fabric and MMU 810 based on instructions received from the processor 802. In one exemplary embodiment, the control logic 808 can form/destroy conductive filaments of varying conductivity within each of the memory cells of a matrix fabric in accordance with the aforementioned matrix dimensions and/or matrix value coefficients provided by the LUT 806. Additionally, the control logic 808 can configure a corresponding MMU to perform any additional arithmetic and/or logical manipulations of the matrix fabric. Furthermore, the control logic 808 may select one or more digital vectors to drive the matrix fabric, and one or more digital vectors to store the logical outputs of the MMU.

In the processing arts, an "instruction" generally includes different types of "instruction syllables": e.g., opcodes, operands, and/or other associated data structures (e.g., registers, scalars, vectors).

As used herein, the term "opcode" (operation code) refers to an instruction that can be interpreted by a processor logic, memory logic, or other logical circuitry to effectuate an operation. More directly, the opcode identifies an operation to be performed on one or more operands (inputs) to generate one or more results (outputs). Both operands and results may be embodied as data structures. Common examples of data structures include without limitation: scalars, vectors, arrays, lists, records, unions, objects, graphs, trees, and/or any number of other form of data. Some data structures may include, in whole or in part, referential data (data that "points" to other data). Common examples of referential data structures include e.g., pointers, indexes, and/or descriptors.

In one exemplary embodiment, the opcode may identify one or more of: a matrix operation, the dimensions of the matrix operation, and/or the row and/or column of the memory cells. In one such variant, an operand is a coded identifier that specifies the one or more digital vectors that are to be operated upon. For example, an instruction to perform a precoding operation on an incoming data vector using a particular precoding matrix W, and store the results in an output digital vector might include the opcode and operands: PRECODE ($input, $output, $pmi), where: PRECODE identifies the nature operation, $input identifies an input digital vector base address, $output identifies an output digital vector base address, and $PMI identifies a precoding matrix index corresponding to the base address of the precoding matrix being used in the operation. In another such example, the 64-point FFT may be split into two distinct atomic operations e.g., PRECODE($address, $row, $col) that converts the memory array at the $address into a row by column matrix fabric, and MULT($address, $input, $output) that stores the vector-matrix product of the $input and the matrix fabric at $address to $output.

Similar logic applies to e.g., a DECODE operation used in support of wireless channel diversity processing or other such application.

While FIG. 8A illustrates an instruction interface that is functionally separate and distinct from the input/output (I/O) memory interface, this is by no means a requirement, and various configurations may be used consistent with the present disclosure. For example, in one such embodiment, the instruction interface may be physically distinct (e.g., having different pins and/or connectivity). In other embodiments, the instruction interface may be multiplexed with the I/O memory interface (e.g., sharing the same control signaling, and address and/or data bus but in a distinct communication mode). In still other embodiments, the instruction interface may be virtually accessible via the I/O memory interface (e.g., as registers located within address space that is addressable via the I/O interface). Additionally, all or portions of the memory device 804 or its logic may be integrated with the processor 802, such as via an SoC configuration. Still other variants may be substituted by artisans of ordinary skill, given the contents of the present disclosure.

In one embodiment, the matrix fabric and MMU 810 are tightly coupled to a memory array 812 to read and write digital vectors (operands). In one exemplary embodiment, the operands are identified for dedicated data transfer hardware (e.g., a direct memory access (DMA)) into and out of the matrix fabric and MMU 810. In one exemplary variant, the digital vectors of data may be of any dimension, and are not limited by processor word size. For example, an operand may specify an operand of N-bits (e.g., 2, 4, 8, 16, ... etc.). In other embodiments, the DMA logic 808 can read/write to the matrix fabric 810 using the existing memory row/column bus interfaces. In still other embodiments, the DMA logic 808 can read/write to the matrix fabric 810 using the existing address/data and read/write control signaling within an internal memory interface.

Figure 8B:
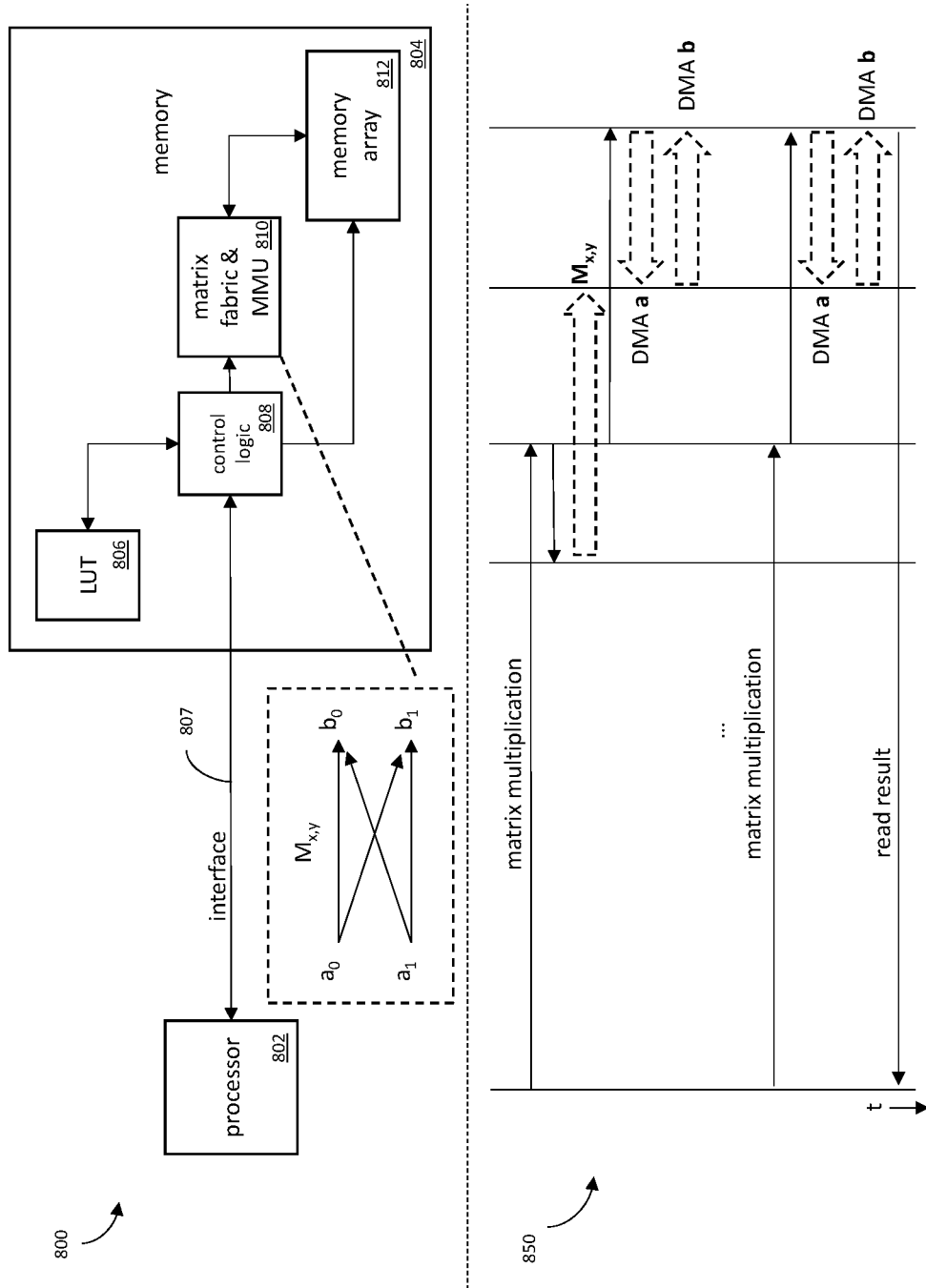
FIG. 8B is a ladder diagram illustrating one exemplary embodiment of performance of a set of matrix operations, in accordance with the principles of the present disclosure.

FIG. 8B illustrates an exemplary set of matrix operations 850 within the context of the exemplary embodiment 800 described in FIG. 8A. As shown therein, the processor 802 writes an instruction to the memory 804 through interface 807 that specifies an opcode (e.g., characterized by a matrix $M_{x,y}$) and the operands (e.g., digital vectors a, b).

The control logic 808 determines whether or not the matrix fabric and/or matrix multiplication unit (MMU) should be configured/reconfigured. For example, a section of the memory array is converted into one or more matrix fabrics and weighted with the associated matrix coefficient values defined by the matrix Mx,y-Digital-to-analog (DAC) row drivers and analog-to-digital (ADC) sense amps associated with the matrix fabric may need to be adjusted for dynamic range and/or amplification. Additionally, one or more MMU ALU components may be coupled to the one or more matrix fabrics.

When the matrix fabric and/or matrix multiplication unit (MMU) are appropriately configured, the input operand a is read by the digital-to-analog (DAC) and applied to the matrix fabric Mx,y for analog computation. The analog result may additionally be converted with analog-to-digital (ADC) conversion for subsequent logical manipulation by the MMU ALUs. The output is written into the output operand b.

Figure 8C:
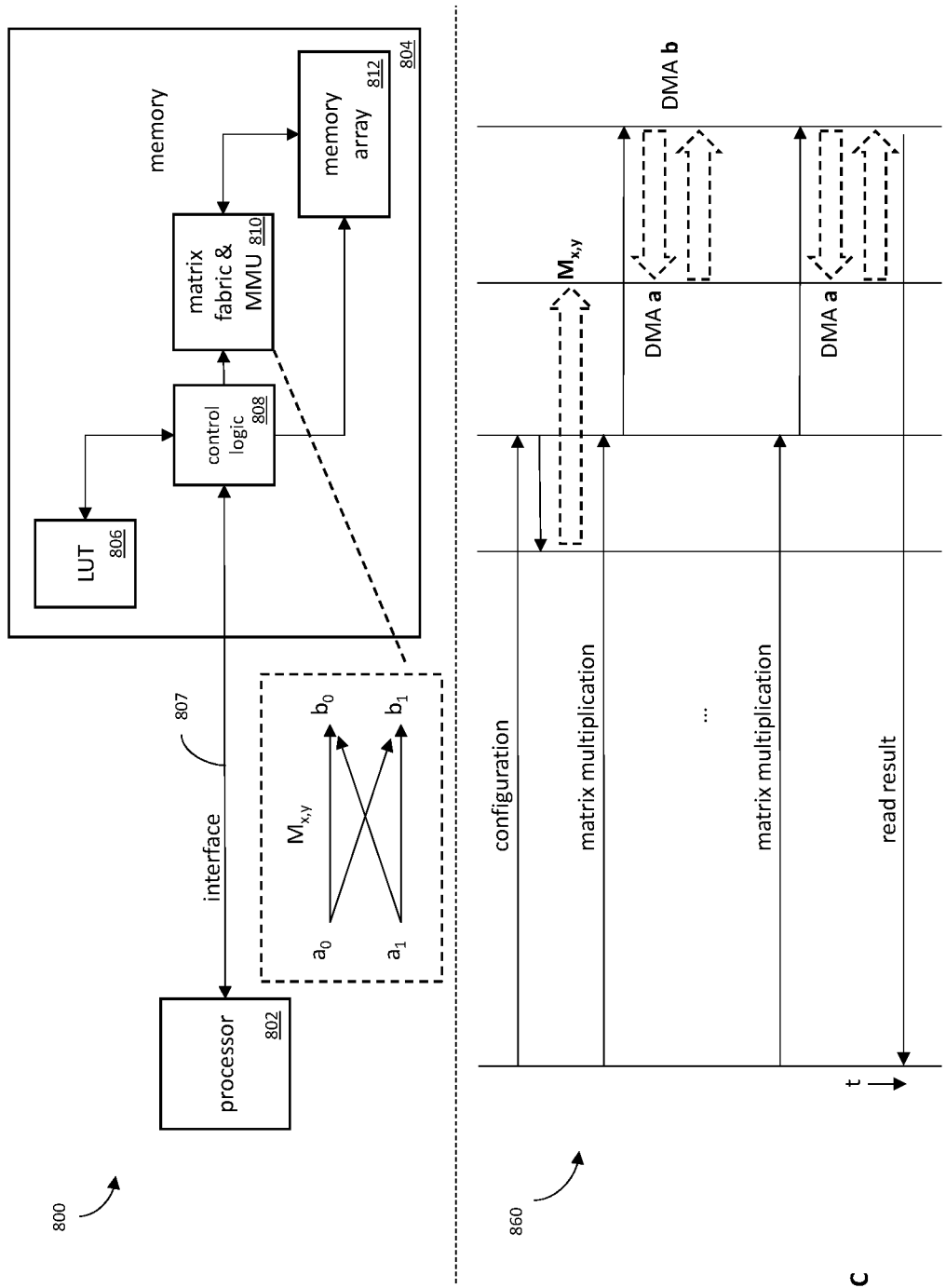
FIG. 8C is a ladder diagram of another exemplary embodiment of performance of a set of matrix operations, in accordance with the principles of the present disclosure.

FIG. 8C illustrates an alternative exemplary set of matrix operations 860 within the context of the exemplary embodiment 800 described in FIG. 8A. In contrast to the diagram of FIG. 8B, the system of FIG. 8C uses an explicit instruction to convert the memory array into a matrix fabric. Providing further degrees of atomicity in instruction behaviors can enable a variety of related benefits including for example, pipeline design and/or reduced instruction set complexity.

More directly, when the matrix fabric contains the appropriate matrix value coefficients Mx,y, matrix operations may be efficiently repeated. For example, once a matrix fabric is weighted with the coefficients of a precoding matrix W, the matrix-vector multiplication precoding operation (illustrated in FIG. 7B and EQN. 17) may be quickly performed on many data vectors in a row.

In another example, image processing computations, such as are described in co-owned and co-pending U.S. patent application Ser. No. 16/002,644 filed Jun. 7, 2018 and entitled "AN IMAGE PROCESSOR FORMED IN AN ARRAY OF MEMORY CELLS", previously incorporated supra, may configure a number of matrix fabric and MMU processing elements so as to pipeline e.g., defect correction, color interpolation, white balance, color adjustment, gamma lightness, contrast adjustment, color conversion, down-sampling, and/or other image signal processing operations. Each one of the pipeline stages may be configured once, and repeatedly used for each pixel (or group of pixels) of the image. For example, the white balance pipeline stage may operate on each pixel of data using the same matrix fabric with the matrix coefficient values set for white balance; the color adjustment pipeline stage may operate on each pixel of data using the same matrix fabric with the matrix coefficient values set for color adjustment, etc. In another such example, the first stage of a 64-point FFT can be handled in thirty two (32) atomic MMU computations (thirty two (32) 2-point FFTs) using the same FFT "twiddle factors" (described supra).

Moreover, artisans of ordinary skill in the related arts will further appreciate that some matrix fabrics may have additional versatilities and/or uses beyond their initial configuration. For example, as previously noted, a 64-point FFT has 64 coefficient values, which include all 32 coefficients used in a 32-point FFT. Thus, a matrix fabric that is configured for 64-point operation could be reused for 32-point operation with the appropriate application of the 32-point input operand a on the appropriate rows of the 64-point FFT matrix fabric. Similarly, FFT twiddle factors are a superset of discrete cosine transform (DCT) twiddle factors; thus, an FFT matrix fabric could also be used (with appropriate application of input operand a) to calculate DCT results.

Still other permutations and/or variants of the foregoing example will be clear to those of ordinary skill in the related arts, given the content of the present disclosure.

Methods—

Figure 9:
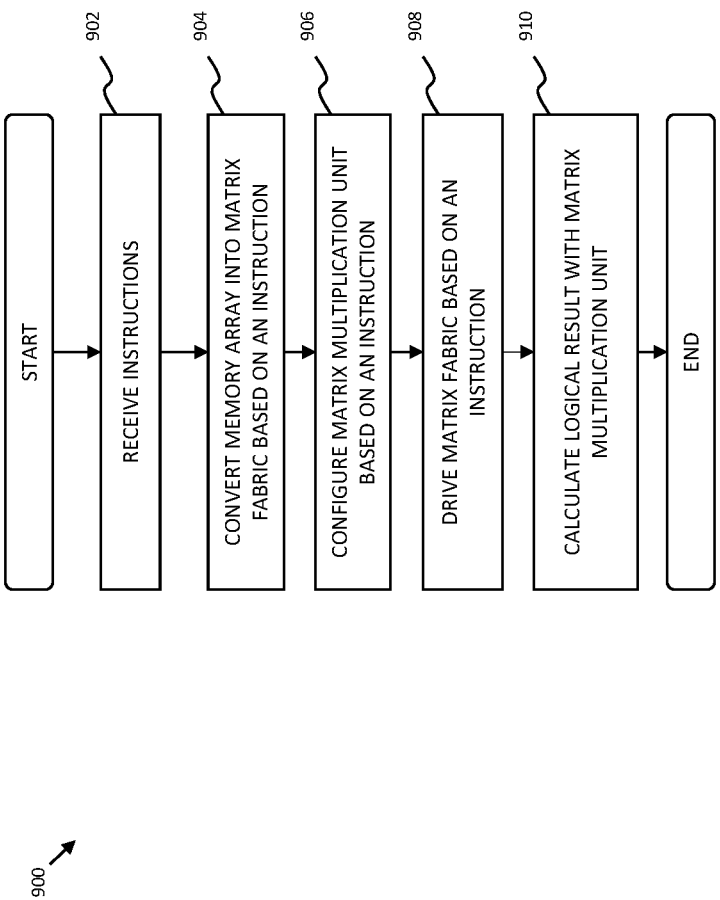
FIG. 9 is a logical flow diagram of one exemplary method of converting a memory array into a matrix fabric and performing matrix operations therein.

Referring now to FIG. 9, a logical flow diagram of one exemplary method 900 converting a memory array into a matrix fabric for matrix transformations and performing matrix operations therein is presented.

At step 902 of the method 900, a memory device receives one or more instructions. In one embodiment, the memory device receives the instruction from a processor. In one such variant, the processor is an application processor (AP) commonly used in consumer electronics. In other such variants, the processor is a baseband processor (BB) commonly used in wireless devices.

As a brief aside, so-called "application processors" are processors that are configured to execute an operating system (OS) and one or more applications, firmware, and/or software. The term "operating system" refers to software that controls and manages access to hardware. An OS commonly supports processing functions such as e.g., task scheduling, application execution, input and output management, memory management, security, and peripheral access.

A so-called "baseband processor" is a processor that is configured to communicate with a wireless network via a communication protocol stack. The term "communication protocol stack" refers to the software and hardware components that control and manage access to the wireless network resources. A communication protocol stack commonly includes without limitation: physical layer protocols, data link layer protocols, medium access control protocols, network and/or transport protocols, etc.

Other peripheral and/or co-processor configurations may similarly be substituted with equivalent success. For example, server devices often include multiple processors sharing a common memory resource. Similarly, many common device architectures pair a general purpose processor with a special purpose co-processor and a shared memory resource (such as a graphics engine, or digital signal processor (DSP)). Common examples of such processors include without limitation: graphics processing units (GPUs), video processing units (VPUs), tensor processing units (TPUs), neural network processing units (NPUs), digital signal processors (DSPs), image signal processors (ISPs). In other embodiments, the memory device receives the instruction from an application specific integrated circuit (ASIC) or other forms of processing logic e.g., field programmable gate arrays (FPGAs), programmable logic devices (PLDs), camera sensors, wireless baseband processors, mmWave processors or modems, and/or media codecs (e.g., image, video, audio, and/or any combination thereof).

In one exemplary embodiment, the memory device is a resistive random access memory (ReRAM) arranged in a "crossbar" row-column configuration. While the various embodiments described herein assume a specific memory technology and specific memory structure, artisans of ordinary skill in the related arts given the contents of the present disclosure will readily appreciate that the principles described herein may be broadly extended to other technologies and/or structures. For example, certain programmable logic structures (e.g., commonly used in field programmable gate arrays (FPGAs) and programmable logic devices (PLDs)) may have similar characteristics to memory with regard to capabilities and topology. Similarly, certain processor and/or other memory technologies may vary resistance, capacitance, and/or inductance; in such cases, varying impedance properties may be used to perform analog computations. Additionally, while the "crossbar" based construction provides a physical structure that is well adapted to two-dimensional (2D) matrix structures, other topologies may be well adapted to higher order mathematical operations (e.g., matrix-matrix products via three↑ dimensional (3D) memory stacking, etc.)

In one exemplary embodiment, the memory device further includes a controller. The controller receives the one or more instructions and parses each instruction into one or more instruction components (also commonly referred to as "instruction syllables"). In one exemplary embodiment, the instruction syllables include at least one opcode and one or more operands. For example, an instruction may be parsed into an opcode, a first source operand, and a destination operand. Other common examples of instruction components may include without limitation, a second source operand (for binary operations), a shift amount, an absolute/relative address, a register (or other reference to a data structure), an immediate data structure (i.e., a data structure provided within the instruction itself), a subordinate function, and/or branch/link values (e.g., to be executed depending on whether an instruction completes or fails).

In one embodiment, each received instruction corresponds to an atomic memory controller operation. As used herein, an "atomic" instruction is an instruction that completes within a single access cycle. In contrast, a "non-atomic" instruction is an instruction that may or may not complete within a single access cycle. Even though non-atomic instructions might complete in a single cycle, they must be treated as non-atomic to prevent data race conditions. A race condition occurs where data that is being accessed by a processor instruction (either a read or write) may be accessed by another processor instruction before the first processor instruction has a chance to complete; the race condition may unpredictably result in data read/write errors. In other words, an atomic instruction guarantees that the data cannot be observed in an incomplete state.

In one exemplary embodiment, an atomic instruction may identify a portion of the memory array to be converted to a matrix fabric. In some cases, the atomic instruction may identify characteristic properties of the matrix fabric. For example, the atomic instruction may identify the portion of the memory array on the basis of e.g., location within the memory array (e.g., via offset, row, column), size (number of rows, number of columns, and/or other dimensional parameters), granularity (e.g., the precision and/or sensitivity). Notably, atomic instructions may offer very fine grained control over memory device operation; this may be desirable where the memory device operation can be optimized in view of various application specific considerations.

In other embodiments, a non-atomic instruction may specify portions of the memory array that are to be converted into a matrix fabric. For example, the non-atomic instruction may specify various requirements and/or constraints for the matrix fabric. The memory controller may internally allocate resources so as to accommodate the requirements and/or constraints. In some cases, the memory controller may additionally prioritize and/or de-prioritize instructions based on the current memory usage, memory resources, controller bandwidth, and/or other considerations. Such implementations may be particularly useful where memory device management is unnecessary and would otherwise burden the processor.

In one embodiment, the instruction specifies a matrix operation. In one such variant, the matrix operation may be a vector-matrix product. In another variant, the matrix operation may be a matrix-matrix product. Still other variants may be substituted by artisans of ordinary skill in the related arts, given the contents of the present disclosure. Such variants may include e.g., scalar↑ matrix products, higher order matrix products, and/or other transformations including e.g., linear shifts, rotations, reflections, and translations.

As used herein, the terms "transformation", "transform", etc. refer to a mathematical operation that converts an input from a first domain into a second domain. Transformations can be "injective" (every element of the first domain has a unique element in the second domain), "surjective" (every element of the second domain has a unique element in the first domain), or "bijective" (a unique one-to-one mapping of elements from the first domain to the second domain).

More complex mathematically defined transformations that are regularly used in the computing arts include Fourier transforms (and its derivatives, such as the discrete cosine transform (DCT)), Hilbert transforms, Laplace transforms, and Legendre transforms. In one exemplary embodiment of the present disclosure, matrix coefficient values for mathematically defined transformations can be calculated ahead of time and stored within a look-up-table (LUT) or other data structure. For example, twiddle factors for the fast Fourier transform (FFT) and/or DCT can be calculated and stored within a LUT. In other embodiments, matrix coefficient values for mathematically defined transformations can be calculated by the memory controller during (or in preparation for) the matrix fabric conversion process.

Other transformations may not be based on a mathematical definition per se, but may instead by defined based on e.g., an application, another device, and/or a network entity. Such transformations may be commonly used in diversity calculations, encryption, decryption, geometric modeling, mathematical modeling, neural networks, network management, and/or other graph theory based applications. For example, wireless networks may use a codebook of predetermined antenna weighting matrixes so as to signal the most commonly used beamforming/precoding configurations. In other examples, certain types of encryption may agree upon and/or negotiate between different encryption matrices. In such embodiments, the codebook or matrix coefficient values may be agreed ahead of time, exchanged in an out-of-band manner, exchanged in-band, or even arbitrarily determined or negotiated.

Empirically determined transformations may also be substituted with equivalent success given the contents of the present disclosure. For example, empirically derived transformations that are regularly used in the computing arts include radio channel coding, image signal processing, and/or other mathematically modeled environmental effects. For example, a multi↑ path radio environment can be characterized by measuring channel effects on e.g., reference signals. The resulting channel matrix can be used to constructively interfere with signal reception (e.g., improving signal strength) while simultaneously destructively interfering with interference (e.g., reducing noise). Similarly, an image that has a skewed hue can be assessed for overall color balance, and mathematically corrected. In some cases, an image may be intentionally skewed based on e.g., user input, so as to impart an aesthetic "warmth" to an image.

Various embodiments of the present disclosure may implement "unary" operations within a memory device. Other embodiments may implement "binary", or even higher order "N-ary" matrix operations. As used herein, the terms "unary", "binary", and "N-ary" refer to operations that take one, two, or N input data structures, respectively. In some embodiments, binary and/or N-ary operations may be subdivided into one or more unary matrix in-place operators. As used herein, an "in-place" operator refers to a matrix operation that stores or translates its result its own state (e.g., its own matrix coefficient values). For example, a binary operation may be decomposed into two (2) unary operations; a first in-place unary operation is executed (the result is stored "in-place"). Thereafter, a second unary operation can be performed on the matrix fabric to yield the binary result (for example, a multiply-accumulate operation).

Still other embodiments may serialize and/or parallelize matrix operations based on a variety of considerations. For example, sequentially related operations may be performed in a "serial" pipeline. For example, image processing computations, such as are described in co-owned and co-pending U.S. patent application Ser. No. 16/002,644 filed Jun. 7, 2018 and entitled "AN IMAGE PROCESSOR FORMED IN AN ARRAY OF MEMORY CELLS", previously incorporated supra, configures a number of matrix fabric and MMU processing elements to pipeline e.g., defect correction, color interpolation, white balance, color adjustment, gamma lightness, contrast adjustment, color conversion, down-sampling, etc. Pipelined processing can often produce very high throughput data with minimal matrix fabric resources. In contrast, unrelated operations may be performed in "parallel" with separate resources. For example, the first stage of a 64-point FFT can be handled with thirty two (32) separate matrix fabrics operating configured as 2-point FFTs. In addition, some operations may be deconstructed such that two or more portions of an operation are performed in parallel, in separate matrix fabric memory arrays, with the results being subsequently combined. Highly parallelized operation can greatly reduce latency; however the overall memory fabric resource utilization may be very high. In one exemplary embodiment, the instruction is received from a processor via a dedicated interface. Dedicated interfaces may be particularly useful where the matrix computation fabric is treated akin to a co-processor or a hardware accelerator. Notably, dedicated interfaces do not require arbitration, and can be operated at very high speeds (in some cases, at the native processor speed). In other embodiments, the instruction is received via a shared interface.

The shared interface may be multiplexed in time, resource (e.g., lanes, channels, etc.), or other manner with other concurrently active memory interface functionality. Common examples of other memory interface functionality include without limitation: data input/output, memory configuration, processor-in-memory (PIM) communication, direct memory access, and/or any other form of blocking memory access. In some variants, the shared interface may include one or more queuing and/or pipelining mechanisms. For example, some memory technologies may implement a pipelined interface so as to maximize memory throughput.

In some embodiments, the instructions may be received from any entity having access to the memory interface. For example, a camera co-processor (image signal processor (ISP)) may be able to directly communicate with the memory device to e.g., write captured data. In certain implementations, the camera co-processor may be able offload its processing tasks to a matrix fabric of the memory device. For example, the ISP may accelerate/offload/parallelize e.g., color interpolation, white balance, color correction, color conversion, etc. In other examples, a baseband co-processor (BB) may be able to may be able to directly communicate with the memory device to e.g., read/write data for transaction over a network interface. The BB processor may be able to offload e.g., FFT/IFFT, channel estimation, beamforming/precoding calculations, and/or any number of other networking tasks to a matrix fabric of a memory device. Similarly, video and/or audio codecs often utilize DCT/IDCT transformations, and would benefit from matrix fabric operations. Still other variants of the foregoing will be readily appreciated by artisans of ordinary skill in the related arts, given the contents of the present disclosure.

Various implementations of the present disclosure may support a queue of multiple instructions. In one exemplary embodiment, matrix operations may be queued together. For example, multiple vector-matrix multiplications may be queued together in order to effectuate a matrix multiplication. Similarly, as previously noted, a higher order transform (e.g., FFT1024) may be achieved by queuing multiple iterations of a lower order constituent transform (e.g., FFT512, etc.) In yet another example, ISP processing for an image may include multiple iterations over the iteration space (each iteration may be queued in advance). Still other queuing schemes may be readily substituted by artisans of ordinary skill in the related arts with equal success, given the contents of the present disclosure.

In some cases, matrix operations may be cascaded together to achieve matrix operations of a higher rank. For example, a higher order FFT (e.g., 1024×1024) can be decomposed into multiple iterations of lower rank FFTs (e.g., four (4) iterations of 512×512 FFTs, sixteen (16) iterations of 256×256 FFTs, etc.). In other examples, arbitrarily sized N-point DFTs (e.g., that is not a power of 2) can be implemented by cascading DFTs of other sizes. Still other examples of cascaded and/or chained matrix transformations may be substituted with equivalent success, the foregoing being purely illustrative.

As previously alluded to, the ReRAM's non-volatile nature retains memory contents even when the ReRAM is unpowered. Thus, certain variants of the processor-memory architecture may enable one or more processors to independently power the memory. In some cases, the processor may power the memory when the processor is inactive (e.g., keeping the memory active while the processor is in low power). Independent power management of the memory may be particularly useful for e.g., performing matrix operations in memory, even while the processor is asleep. For example, the memory may receive a plurality of instructions to execute; the processor can transition into a sleep mode until the plurality of instructions have been completed. Still other implementations may use the non-volatile nature of ReRAM to hold memory contents while the memory is powered off; for example, certain video and/or image processing computations may be held within ReRAM during inactivity.

At step 904 of the method 900, a memory array (or portion thereof) may be converted into a matrix fabric based on the instruction. As used herein, the term "matrix fabric" refers to a plurality of memory cells having a configurable impedance that, when driven with an input vector, yield an output vector and/or matrix. In one embodiment, the matrix fabric may be associated with a portion of the memory map. In some such variants, the portion is configurable in terms of its size and/or location. For example, a configurable memory register may determine whether a bank is configured as a memory or as a matrix fabric. In other variants, the matrix fabric may reuse and/or even block memory interface operation. For example, the memory device may allow the memory interface may be GPIO based (e.g., in one configuration, the pins of the memory interface may selectively operate as ADDR/DATA during normal operation, or e.g., FFT16, etc. during matrix operation.)

In one embodiment, the instruction identifies a matrix fabric characterized by structurally defined coefficients. In one exemplary embodiment, a matrix fabric contains the coefficients for a structurally defined matrix operation. For example, a matrix fabric for an 8×8 FFT is an 8×8 matrix fabric that has been pre-populated with structurally defined coefficients for an FFT. In some variants, the matrix fabric may be pre-populated with coefficients of a particular sign (positive, negative) or of a particular radix (the most significant bits, least significant bits, or intermediary bits).

As used herein, the term "structurally defined coefficients" refer to the fact that the coefficients of the matrix multiplication are defined by the matrix structure (e.g., the size of the matrix), not the nature of the operation (e.g., multiplying operands). For example, a structurally defined matrix operation may be identified by e.g., a row and column designation (e.g., 8×8, 16×16, 32×32, 64×64, 128×128, 256×256, etc.) While the foregoing discussions are presented in the context of full rank matrix operations, deficient matrix operators may be substituted with equivalent success. For example, a matrix operation may have asymmetric columns and/or rows (e.g., 8×16, 16×8, etc.) In fact, many vector-based operations may be treated as a row with a single column, or a column with a single row (e.g., 8×1, 1×8).

In some hybrid hardware/software embodiments, controlling logic (e.g., a memory controller, processor, PIM, etc.) may determine whether resources exist to provide the matrix fabric. In one such embodiment, a matrix operation may be evaluated by a pre-processor to determine whether or not it should be handled within software or within dedicated matrix fabric. For example, if the existing memory and/or matrix fabric usage consumes all of the memory device resources, then the matrix operation may need to be handled within software rather than via the matrix fabric. Under such circumstances, the instruction may be returned incomplete (resulting in traditional matrix operations via processor instructions). In another such example, configuring a temporary matrix fabric to handle a simple matrix operation may yield such little return, that the matrix operation should be handled within software.

Various considerations may be used in determining whether a matrix fabric should be used. For example, memory management may allocate portions of the memory array for memory and/or matrix fabric. In some implementations, portions of the memory array may be statically allocated. Static allocations may be preferable to reduce memory management overhead and/or simplify operational overhead (wear leveling, etc.). In other implementations, portions of the memory array may be dynamically allocated. For example, wear-leveling may be needed to ensure that a memory uniformly degrades in performance (rather than wearing out high usage areas). Still other variants may statically and/or dynamically allocate different portions; for example, a subset of the memory and/or matrix fabric portions may be dynamically and/or statically allocated.

As a brief aside, wear leveling memory cells can be performed in any discrete amount of memory (e.g., a bank of memory, a chunk of memory, etc.) Wear leveling matrix fabric may use similar techniques; e.g., in one variant, wear leveling matrix fabric portions may require that the entire matrix fabric is moved in aggregate (the crossbar structure cannot be moved in pieces). Alternatively, wear leveling matrix fabric portions may be performed by first decomposing the matrix fabric into constituent matrix computations and dispersing the constituent matrix computations to other locations. More directly, matrix fabric wear leveling may indirectly benefit from the "logical" matrix manipulations that are used in other matrix operations (e.g., decomposition, cascading, parallelization, etc.). In particular, decomposing a matrix fabric into its constituent matrix fabrics may enable better wear leveling management with only marginally more complex operation (e.g., the additional step of logical combination via MMU).

In one exemplary embodiment, conversion includes reconfiguring the row decoder to operate as a matrix fabric driver that variably drives multiple rows of the memory array. In one variant, the row driver converts a digital value to an analog signal. In one variant, digital-to analog conversion includes varying a conductance associated with a memory cell in accordance with a matrix coefficient value. Additionally, conversion may include reconfiguring the column decoder to perform analog decoding. In one variant, the column decoder is reconfigured to sense analog signals corresponding to a column of varying conductance cells that are driven by corresponding rows of varying signaling. The column decoder converts an analog signal to a digital value.

While the foregoing construction is presented in one particular row-column configuration, other implementations may be substituted with equal success. For example, a column driver may convert a digital value to an analog signal, and a row decoder may convert an analog signal to a digital value. In another such example, a three-dimension (3D) row-column depth memory may implement 2D matrices in any permutation (e.g., row-driver/column decoder, row-driver/depth-decoder, column-driver/depth-decoder, etc.) and/or 3D matrix permutations (e.g., row-driver/column-decoder-driver/depth-decoder).

In one exemplary embodiment, the matrix coefficient values correspond to a structurally determined value. Structurally determined values may be based on the nature of the operation. For example, a fast Fourier transform (FFT) transform on a vector of length N (where N is a power of 2) can be performed with FFT butterfly operations (of 2×2) or some higher order of butterfly (e.g., 4×4, 8×8, 16×16, etc.) Notably, the intermediate constituent FFT butterfly operation weighting is defined as a function of the unit circle (e.g., $e^{-2\pi k n/N}$) where both n and k are determined from the FFT vector length N; in other words, the FFT butterfly weighting operations are structurally defined according to the length of vector of length N. As a practical matter, a variety of different transformations are similar in this regard. For example, the discrete Fourier transform (DFT) and discrete cosine transform (DCT), both use structurally defined coefficients.

In one exemplary embodiment, the matrix fabric itself has structurally determined dimensions. Structurally determined dimensions may be based on the nature of the operation; for example, an ISP white balance processing may use a 3×3 matrix (corresponding to different values of Red (R), Green (G), Blue (B), Luminance (Y), Chrominance Red (Cr), Chrominance Blue (Cb), etc.) In another such example, channel matrix estimations and/or beamforming codebooks are often defined in terms of the number of multiple-input-multiple-output (MIMO) paths. For example, a 2×2 MIMO channel has a corresponding 2×2 channel matrix and a corresponding 2×2 beamforming/precoding weighting (a 100×200 MIMO channel has a corresponding 100×200 channel matrix, etc.). Various other structurally defined values and/or dimensions useful for matrix operations may be substituted by artisans of ordinary skill in the related arts, given the contents of the present disclosure.

Certain variants may additionally subdivide matrix coefficient values so as to handle manipulations that may be impractical to handle otherwise. Under such circumstances, a matrix fabric may include only a portion of the matrix coefficient values (to perform only a portion of the matrix operation). For example, performing signed operation and/or higher level radix computations may require levels of manufacturing tolerance that are prohibitively expensive. Signed matrix operation may be split into positive and negative matrix operations (which are later summed by a matrix multiplication unit (MMU) described elsewhere herein). Signed complex matrix operation may be split into positive real, negative real, positive imaginary, and negative imaginary operations (which are appropriately combined by one or more MMUs). Similarly, high radix matrix operation may be split into e.g., a most significant bit (MSB) portion, a least significant bit (LSB) portion, and/or any intermediary bits (which may be bit shifted and summed by the aforementioned MMU). Still other variants would be readily appreciated by artisans of ordinary skill, given the contents of the present disclosure.

In one exemplary embodiment, the matrix coefficient values are determined ahead of time and stored in a look-up-table for later reference. For example, a matrix operation that has both structurally determined dimensions and structurally determined values may be stored ahead of time. As but one such example, an FFT of eight (8) elements has structurally determined dimensions (8×8) and structurally determined values (e.g., $e^{-1\pi/4}$, $e^{-1\pi/2}$, $e^{-3\pi/4}$, etc.). A FFT8 instruction may result in the configuration of an 8×8 matrix fabric that is pre-populated with the corresponding FFT8 structurally determined values.

As another such example, antenna beamforming/precoding coefficients are often defined ahead of time within a codebook; a wireless network may identify a corresponding index within the codebook to configure antenna beamforming/precoding. For example, a MIMO codebook may identify the possible configurations for a 4×4 MIMO system; during operation, the selected configuration can be retrieved from a codebook based an index thereto.

While the foregoing examples are presented in the context of structurally defined dimensions and/or values, other embodiments may use dimensions and/or values that are defined based on one or more other system parameters. For example, less granularity may be required for low power operation. Similarly, as previously alluded to, various processing considerations may weigh in favor of (or against) performing matrix operations within a matrix fabric. Additionally, matrix operation may affect other memory considerations including without limitation: wear leveling, memory bandwidth, process-in-memory bandwidth, power consumption, row column and/or depth decoding complexity, etc. Artisans of ordinary skill in the related arts given the contents of the present disclosure may substitute a variety of other considerations, the foregoing being purely illustrative.

At step 906 of the method 900, one or more matrix multiplication units may be configured on the basis of the instruction. As previously alluded to, certain matrix fabrics may implement logical (mathematical identities) to handle a single stage of a matrix operation; however, multiple stages of matrix fabrics may be cascaded together to achieve more complex matrix operations. In one exemplary embodiment, a first matrix is used to calculate positive products of a matrix operation and a second matrix is used to calculate the negative products of a matrix operation. The resulting positive and negative products can be compiled within an MMU to provide a signed matrix multiplication.

In another exemplary embodiment, assuming that a matrix has complex values and an input vector has only real values, a first matrix is used to calculate positive real products of a matrix operation, a second matrix is used to calculate negative real products, a third matrix is used to calculate positive imaginary products, and a fourth matrix is used to calculate negative imaginary products of a matrix operation. The four results may be compiled within an MMU to obtain the matrix-vector product.

In yet another exemplary embodiment, assuming that both a matrix and a vector can have complex values, a matrix-vector product can be calculated by inputting the real coefficients of the vector into the four memory matrixes of the previous example, inputting the imaginary coefficients of the vector into four identical (or same) memory matrixes, and combining the eight results within one or more MMUs to obtain the matrix-vector product.

In one further exemplary embodiment, a first matrix is used to calculate a first radix portion of a matrix operation and a second matrix is used to calculate a second radix portion of a matrix operation. The resulting radix portions can be bit shifted and/or summed within an MMU to provide a larger radix product.

As a brief aside, logical matrix operations are distinguished from analog matrix operations. The exemplary matrix fabric converts analog voltages or current into digital values that are read by the matrix multiplication unit (MMU). Logical operations can manipulate digital values via mathematical properties (e.g., via matrix decomposition, etc.); analog voltages or current cannot be manipulated in this manner.

More generally, different logical manipulations can be performed with groups of matrices. For example, a matrix can be decomposed or factorized into one or more constituent matrices. Similarly, multiple constituent matrices can be aggregated or combined into a single matrix. Additionally, matrices may be expanded in row and/or column to create a deficient matrix of larger dimension (but identical rank). Such logic may be used to implement many higher order matrix operations. For example, multiplying two matrices together may be decomposed as a number of vector-matrix multiplications. These vector-matrix multiplications may be further implemented as multiply-accumulate logic within a matrix multiplication unit (MMU). In other words, even non-unary operations may be handled as a series of piecewise unary matrix operations. More generally, artisans of ordinary skill in the related arts will readily appreciate that any matrix operation which can be expressed in whole, or in part, as a unary operation may greatly benefit from the various principles described herein.

Various embodiments of the present disclosure use matrix multiplication units (MMUs) as glue logic between multiple constituent matrix fabrics. Additionally, MMU operation may be selectively switched for connectivity to various rows and/or columns. Not all matrix fabrics may be used concurrently; thus, depending on the current processing and/or memory usage, matrix fabrics may be selectively connected to MMUs. For example, a single MMU may be dynamically connected to different matrix fabrics.

In some embodiments, controlling logic (e.g., a memory controller, processor, PIM, etc.) may determine whether resources exist to provide the MMU manipulations within e.g., column decoder or elsewhere. For example, the current MMU load may be evaluated by a pre-processor to determine whether or not an MMU may be heavily loaded. Notably, the MMU is primarily used for logical manipulations, thus any processing entity with equivalent logical functionality may assist with the MMU's tasks. For example, a processor-in-memory (PIM) may offload MMU manipulations. Similarly, matrix fabric results may be directly provided to the host processor (which can perform logical manipulations in software).

More generally, various embodiments of the present disclosure contemplate sharing MMU logic among multiple different matrix fabrics. The sharing may be based on e.g., a time sharing scheme. For example, the MMU may be assigned to a first matrix fabric during one time slot, and a second matrix fabric during another time slot. In other words, unlike the physical structure of the matrix fabric (which is statically allocated for the duration of the matrix operation), the MMU performs logical operations that can be scheduled, subdivided, allocated, reserved, and/or partitioned in any number of ways. More generally, various embodiments of the matrix fabric are based on memory and non-volatile. As a result, the matrix fabric may be configured in advance, and read from when needed; the non-volatile nature ensures that the matrix fabric retains contents without requiring processing overhead even if e.g., the memory device is powered off.

If both matrix fabrics and corresponding matrix multiplication units (MMUs) are successfully converted and configured, then at step 908 of the method 900, the matrix fabric is driven based on the instruction and a logical result is calculated with the one or more matrix multiplication units at step 910. In one embodiment, one or more operands are converted into an electrical signal for analog computation via the matrix fabric. The analog computation results from driving an electrical signal through the matrix fabric elements; for example, the voltage drop is a function of a coefficient of the matrix fabric. The analog computation result is sensed and converted back to a digital domain signal. Thereafter, the one or more digital domain values are manipulated with the one or more matrix multiplication units (MMUs) to create a logical result.

Figure 10:
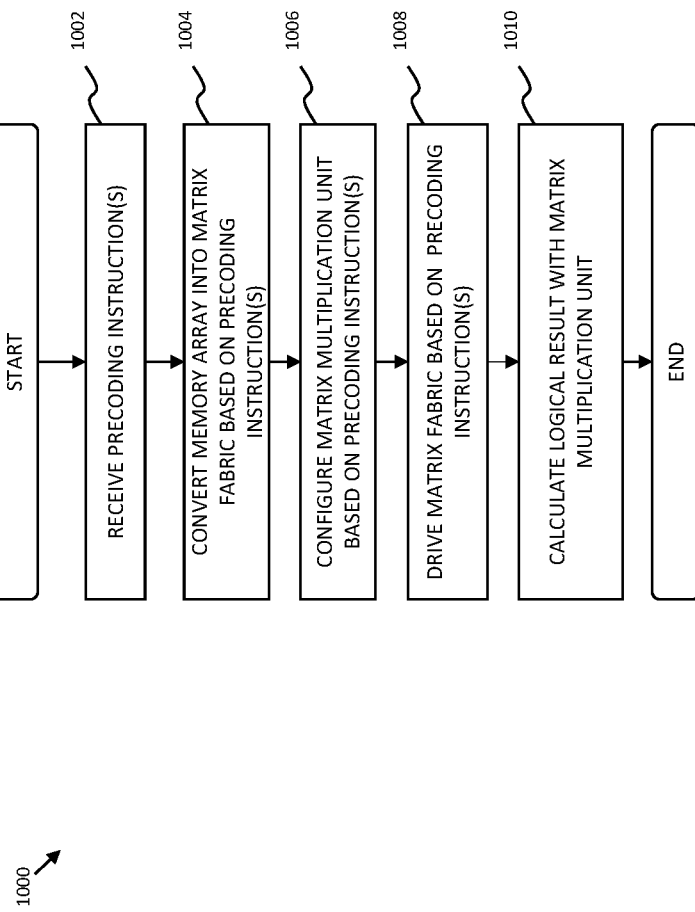
FIG. 10 is a logical flow diagram of one exemplary embodiment of a generalized method of converting a memory array into a matrix fabric and performing precoding matrix operations therein.

Referring now to FIG. 10, one exemplary embodiment of the method of FIG. 9 adapted for channel precoding is shown and described. At step 1002, the memory device receives one or more precoding-related instructions from e.g., a wireless baseband or antenna processor, as well as an array of communication data to be transformed by the memory device. In some variants, the control logic of the memory device is configured to divide the data into several smaller arrays (vectors), and temporarily store them in an internal memory array (such as the array 812 of FIGS. 8A-8C).

At step 1004 of method 1000, a portion of the memory array is converted into a matrix fabric configured to perform a precoding matrix operation. As discussed in greater detail with respect to FIGS. 10A and 10B below, in some embodiments, two separate portions of the memory fabric (first array and second array), each with dimensions four times the size of the precoding matrix, are identically configured with the precoding matrix W (separated into sub-arrays holding respective positive real, negative real, positive imaginary, and negative imaginary values of W).

At step 1006, one or more matrix multiplication units may be configured to e.g., compile the matrix-vector products from (i) the positive real, negative real, positive imaginary, negative imaginary programmed portions of the first array and (ii) the positive real, negative real, positive imaginary, negative imaginary programmed portions of the second array (described with respect to FIG. 7B).

At step 1008 of the method 1000, the matrix fabric is driven based on the precoding instruction(s), and a logical result is calculated with the one or more matrix multiplication units at step 1010. In one embodiment, one or more operands are converted into an electrical signal for analog computation via the matrix fabric. As discussed supra, the analog computation results from driving an electrical signal through the matrix fabric elements, and thereafter, the one or more digital domain values are manipulated with the one or more matrix multiplication units (MMUs) to create a logical result.

Figure 10A:
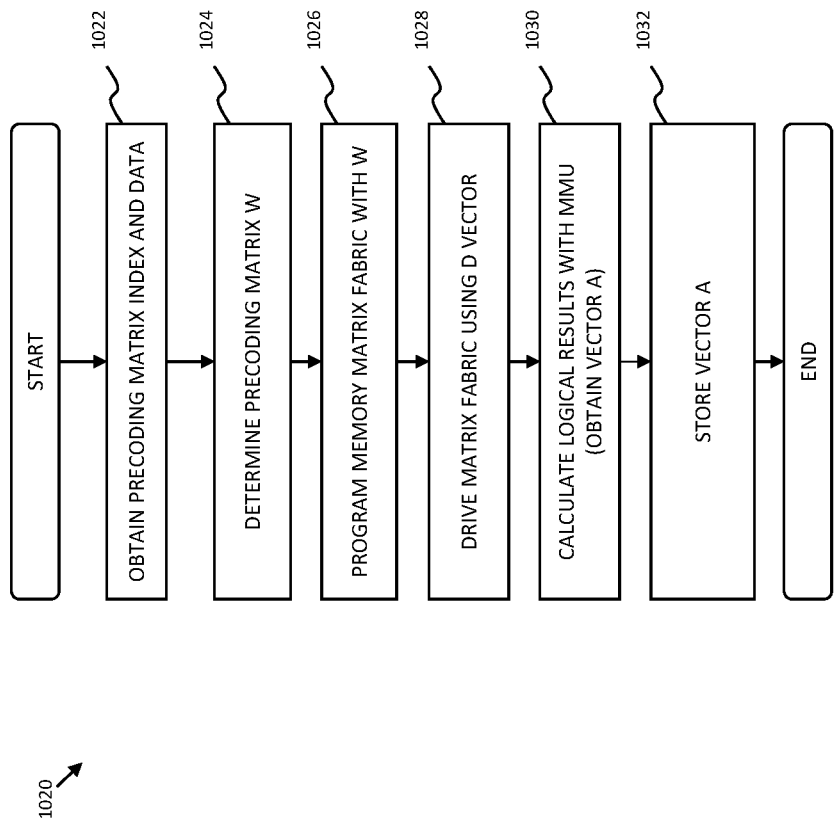
FIG. 10A is a logical flow diagram of one exemplary method of performing precoding matrix operations using matrix memory fabric according to the methodology of FIG. 10.
Figure 10B:
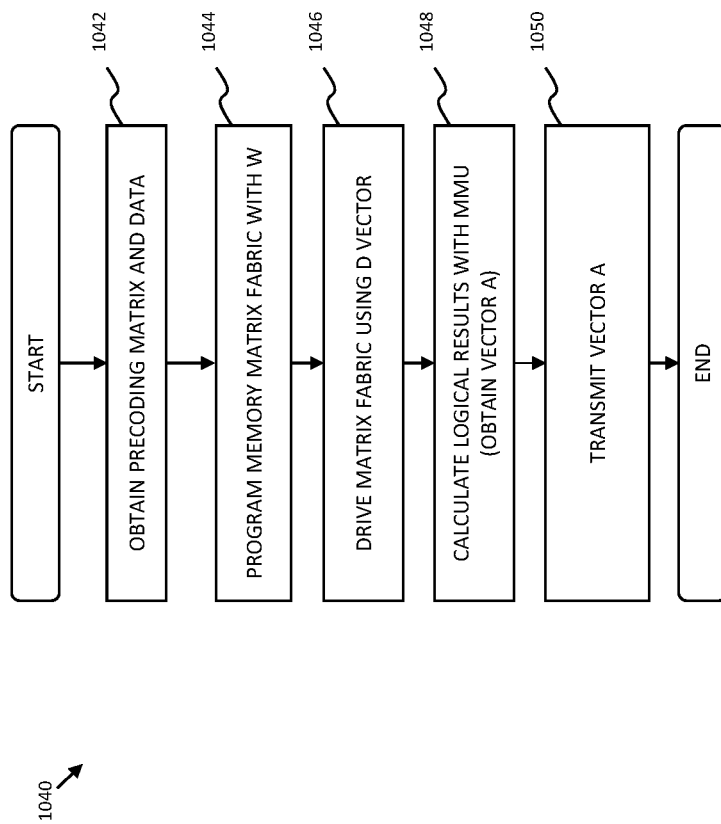
FIG. 10B is a logical flow diagram of another exemplary method of performing precoding matrix operations using matrix memory fabric according to the methodology of FIG. 10.

Referring now to FIGS. 10A and 10B, methods 1020 and 1040 are used to perform the precoding operation on data vectors d.

At step 1022 of FIG. 10A, the memory device receives instructions that specify a precoding matrix index (or a specific base address). Control logic (see e.g., the control logic 808 of the apparatus of FIG. 8A) of the memory device uses the matrix index to look up the values of the appropriate precoding matrix in a look-up-table (LUT), such as one located inside the memory array 812.

At step 1024, the precoding matrix W is determined, and per step 1026, the memory fabric matrix is configured or programmed with the determined precoding matrix from step 1024.

In step 1028 of method 1020, data vectors d are obtained from the memory array, one after another, and individually used to drive the matrix fabric that has been configured with values of precoding matrix W.

In step 1030, the previously configured MMU obtains the results of the matrix fabric, and calculates transmit vectors a (using methods described above with respect to FIG. 7B).

Lastly, in step 1032 of method 1020, the calculated vectors a are stored in e.g., temporary memory location for later export out of the memory device.

FIG. 10B shows an alternative methodology. At step 1042 of FIG. 10B, the memory device receives instructions that include values of a precoding matrix W, as well as associated data vector(s) d.

At step 1044, the memory fabric matrix is configured or programmed with the received precoding matrix from step 1042.

In step 1046 of method 1040, data vectors d obtained in step 1042 are individually used to drive the matrix fabric that has been configured with values of the received precoding matrix W.

In step 1048, the previously configured MMU obtains the results of the matrix fabric, and calculates transmit vectors a (using methods described above with respect to FIG. 7B).

Lastly, in step 1050 of method 1040, the calculated vectors a are transmitted out of the memory device (e.g., as soon as they are calculated).

It will be recognized that the foregoing methodologies may be readily adapted by one of ordinary skill, when given this disclosure, for use with the fabric architectures of FIGS. 5B-5D, 6B-6C, and 7B.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. Furthermore, features from two or more of the methods may be combined. All such variations are considered to be encompassed within the disclosure disclosed and claimed herein.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims.

It will be further appreciated that while certain steps and aspects of the various methods and apparatus described herein may be performed by a human being, the disclosed aspects and individual methods and apparatus are generally computerized/computer-implemented. Computerized apparatus and methods are necessary to fully implement these aspects for any number of reasons including, without limitation, commercial viability, practicality, and even feasibility (i.e., certain steps/processes simply cannot be performed by a human being in any viable fashion).

The functions described herein may be implemented in hardware, software executed by a processor, firmware, or any combination thereof. If implemented in software executed by a processor, the functions may be stored on or transmitted over as one or more instructions or code on a computer-readable apparatus (e.g., storage medium). Computer-readable media include both non-transitory computer storage media and communication media including any medium that facilitates transfer of a computer program from one place to another. A non-transitory storage medium may be any available medium that can be accessed by a general purpose or special purpose computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

What is claimed is:

1. A device, comprising:
   a processor apparatus coupled to a non-transitory computer readable medium storing one or more instructions which, when executed by the processor apparatus, cause the device to:

write a processing matrix operation opcode to the non-transitory computer readable medium, wherein:
the processing matrix operation opcode causes the non-transitory computer readable medium to operate at least one array of memory cells as a matrix structure; and
modifies one or more analog values of the matrix structure; and
read a matrix transformation result from the matrix structure.

2. The device of claim 1, wherein the non-transitory computer readable medium further stores one or more instructions which, when executed by the processor apparatus, cause the device to:
obtain information relating to a precoding matrix; and
obtain one or more vectors derived from a communication data stream;
wherein the matrix transformation operand comprises the one or more vectors and the matrix transformation result comprises one or more precoded transmit vectors.

3. The device of claim 1, wherein the processing matrix operation opcode is a multiple input multiple output opcode.

4. The device of claim 3, wherein the non-transitory computer readable medium further stores one or more instructions which, when executed by the processor apparatus, cause the device to obtain information relating to a multiple input multiple output data recovery matrix; and obtain one or more vectors corresponding to received signal data; and
wherein the matrix transformation operand comprises the one or more vectors and the matrix transformation result comprises one or more recovered data values.

5. The device of claim 1, wherein the non-transitory computer readable medium further stores one or more instructions which, when executed by the processor apparatus, cause the device to receive data comprising one or more vectors derived from a matrix of data symbols; and
wherein the matrix transformation operand comprises the one or more vectors, and the matrix transformation result comprises one or more transmit vectors corresponding signals transmitted over two or more antennas of the device.

6. The device of claim 1, wherein the processing matrix operation opcode causes the non-transitory computer readable medium to operate a second array of memory cells as a second matrix structure; and
wherein the matrix transformation result associated with the matrix structure and another matrix transformation result associated with the second matrix structure are logically combined.

7. The device of claim 1, wherein the one or more analog values of the matrix structure are stored within a look-up-table data structure; and
wherein the look-up-table data structure comprises a codebook of precoding matrices.

8. A method, comprising:
writing, by a processor apparatus coupled to a non-transitory computer readable medium storing one or more instructions and via execution of the one or more instructions, a processing matrix operation opcode to the non-transitory computer readable medium;
operating, by the non-transitory computer readable medium in response to the processing matrix operation opcode, at least one array of memory cells as a matrix structure;
modifying one or more analog values of the matrix structure; and
reading a matrix transformation result from the matrix structure.

9. The method of claim 8, further comprising:
obtaining, by the processor apparatus, information relating to a precoding matrix; and
obtaining, by the processor apparatus, one or more vectors derived from a communication data stream;
wherein the matrix transformation operand comprises the one or more vectors and the matrix transformation result comprises one or more precoded transmit vectors.

10. The method of claim 8, wherein the processing matrix operation opcode is a multiple input multiple output opcode.

11. The method of claim 10, further comprising:
obtaining information relating to a multiple input multiple output data recovery matrix; and
obtaining one or more vectors corresponding to received signal data;
wherein the matrix transformation operand comprises the one or more vectors and the matrix transformation result comprises one or more recovered data values.

12. The method of claim 8, further comprising:
receiving data comprising one or more vectors derived from a matrix of data symbols;
wherein the matrix transformation operand comprises the one or more vectors, and the matrix transformation result comprises one or more transmit vectors corresponding signals transmitted over two or more antennas of the device.

13. The method of claim 8, further comprising:
operating, by the non-transitory computer readable medium in response to the matrix transformation operand, a second array of memory cells as a second matrix structure; and
combining, via a logic circuit, the matrix transformation result from the matrix structure and a second matrix transformation result from the second matrix structure.

14. The method of claim 8, wherein the one or more analog values of the matrix structure are stored within a look-up-table data structure; and
wherein the look-up-table data structure comprises a codebook of precoding matrices.

15. A device, comprising:
a memory array; and
a logic circuit coupled to the memory array;
wherein in response to an opcode received in the device, the logic circuit is configured to operate the memory array as a matrix multiplication unit.

16. The device of claim 15, further comprising:
at least one digital to analog converter connected to the memory array to apply in a vector input.

17. The device of claim 16, further comprising:
at least one analog to digital converter connected to the memory array to convert a result of a matrix stored in the memory array multiplied by the vector input from an analog form to a digital form.

18. The device of claim 17, further comprising:
an arithmetic logic unit connected to the at least one analog to digital converter and configured to operate according to the opcode.

19. The device of claim 18, further comprising:
a control logic configured to control operations of the at least one analog to digital converter and the at least one analog to digital converter in response to the opcode.

20. The device of claim 16, wherein the memory array is configured to store a first matrix and a second matrix; and the device further includes an arithmetic logic unit connected to combine, according to the opcode, a first result of the first matrix multiplied by a vector and a second result of the second matrix multiplied by the vector.

* * * * *